US008946683B2

(12) United States Patent
Rogers et al.

(10) Patent No.: US 8,946,683 B2
(45) Date of Patent: Feb. 3, 2015

(54) MEDIUM SCALE CARBON NANOTUBE THIN FILM INTEGRATED CIRCUITS ON FLEXIBLE PLASTIC SUBSTRATES

(75) Inventors: John A. Rogers, Champaign, IL (US); Qing Cao, Yorktown Heights, NY (US); Muhammad Alam, West Lafayette, IN (US); Ninad Pimparkar, Sunnyvale, CA (US)

(73) Assignees: The Board of Trustees of the University of Illinois, Urbana, IL (US); Purdue Research Foundation, West Lafayette, IN (US)

( * ) Notice: Subject to any disclaimer, the term of this patent is extended or adjusted under 35 U.S.C. 154(b) by 450 days.

(21) Appl. No.: 12/996,924

(22) PCT Filed: Jun. 16, 2009

(86) PCT No.: PCT/US2009/047442

§ 371 (c)(1), (2), (4) Date: Mar. 1, 2011

(87) PCT Pub. No.: WO2010/005707

PCT Pub. Date: Jan. 14, 2010

(65) Prior Publication Data

US 2011/0147715 A1 Jun. 23, 2011

Related U.S. Application Data

(60) Provisional application No. 61/061,710, filed on Jun. 16, 2008, provisional application No. 61/074,254, filed on Jun. 20, 2008.

(51) Int. Cl.
*H01L 51/05* (2006.01)
*H01L 51/00* (2006.01)
*B82Y 10/00* (2011.01)

(52) U.S. Cl.
CPC ............ *H01L 51/0005* (2013.01); *B82Y 10/00* (2013.01); *H01L 51/0014* (2013.01);

(Continued)

(58) Field of Classification Search
CPC . B82Y 10/00; H01L 51/0048; H01L 51/0541
USPC ............ 257/9, 40, E51.04; 438/99; 977/742, 977/938
See application file for complete search history.

(56) References Cited

U.S. PATENT DOCUMENTS 4,761,335 A 8/1988 Aurichio et al.
4,766,670 A 8/1988 Gazdik et al.

(Continued)

FOREIGN PATENT DOCUMENTS

EP 1 679 752 7/2006
JP 06-118441 4/1994

(Continued)

OTHER PUBLICATIONS

Adachi et al (1982) "Chemical Etching of InGaAsP/InP DH Wafer," *J. Electrochem. Soc.* 129:1053-1062.

(Continued)

*Primary Examiner* — Yu Chen
(74) *Attorney, Agent, or Firm* — Lathrop & Gage LLP

(57) ABSTRACT

The present invention provides device components geometries and fabrication strategies for enhancing the electronic performance of electronic devices based on thin films of randomly oriented or partially aligned semiconducting nanotubes. In certain aspects, devices and methods of the present invention incorporate a patterned layer of randomly oriented or partially aligned carbon nanotubes, such as one or more interconnected SWNT networks, providing a semiconductor channel exhibiting improved electronic properties relative to conventional nanotubes-based electronic systems.

55 Claims, 35 Drawing Sheets

110 109 101 102 103 108 104 111 107 106 105 100

115 116 101 102 111b 111a 111 110

(52) U.S. Cl.
CPC ......... *H01L51/0048* (2013.01); *H01L 51/0541* (2013.01); *H01L 51/0545* (2013.01); *Y10S 977/742* (2013.01); *Y10S 977/938* (2013.01)
USPC .............. 257/40; 257/9; 257/E51.04; 439/99; 977/742; 977/938

(56) References Cited

U.S. PATENT DOCUMENTS 5,545,291 A 8/1996 Smith et al.
5,772,905 A 6/1998 Chou
5,783,856 A 7/1998 Smith et al.
5,817,242 A 10/1998 Biebuyck et al.
5,824,186 A 10/1998 Smith et al.
5,904,545 A 5/1999 Smith et al.
6,006,589 A 12/1999 Rodahl et al.
6,225,149 B1 5/2001 Gan et al.
6,274,508 B1 8/2001 Jacobsen et al.
6,277,318 B1 8/2001 Bower et al.
6,281,038 B1 8/2001 Jacobsen et al.
6,291,896 B1 9/2001 Smith
6,316,278 B1 11/2001 Jacobsen et al.
6,334,960 B1 1/2002 Willson et al.
6,380,729 B1 4/2002 Smith
6,403,397 B1 6/2002 Katz
6,417,025 B1 7/2002 Gengel
6,420,266 B1 7/2002 Smith et al.
6,423,583 B1 7/2002 Avouris et al.
6,468,638 B2 10/2002 Jacobsen et al.
6,479,395 B1 11/2002 Smith et al.
6,515,339 B2 2/2003 Shin et al.
6,527,964 B1 3/2003 Smith et al.
6,555,408 B1 4/2003 Jacobsen et al.
6,566,744 B2 5/2003 Gengel
6,580,151 B2 6/2003 Vandeputte et al.
6,586,338 B2 7/2003 Smith et al.
6,590,346 B1 7/2003 Hadley et al.
6,606,079 B1 8/2003 Smith
6,606,247 B2 8/2003 Credelle et al.
6,608,370 B1 8/2003 Chen et al.
6,623,579 B1 9/2003 Smith et al.
6,655,286 B2 12/2003 Rogers
6,657,289 B1 12/2003 Craig et al.
6,665,044 B1 12/2003 Jacobsen et al.
6,683,663 B1 1/2004 Hadley et al.
6,693,384 B1 2/2004 Vicentini et al.
6,706,402 B2 3/2004 Rueckes et al.
6,723,576 B2 4/2004 Nozawa et al.
6,730,990 B2 5/2004 Kondo et al.
6,731,353 B1 5/2004 Credelle et al.
6,780,696 B1 8/2004 Schatz
6,814,898 B1 11/2004 Deeman et al.
6,816,380 B2 11/2004 Credelle et al.
6,821,911 B1 11/2004 Lo et al.
6,844,673 B1 1/2005 Bernkopf
6,848,162 B2 2/2005 Arneson et al.
6,850,312 B2 2/2005 Jacobsen et al.
6,863,219 B1 3/2005 Jacobsen et al.
6,864,435 B2 3/2005 Hermanns et al.
6,864,570 B2 3/2005 Smith
6,872,645 B2 3/2005 Duan et al.
6,878,871 B2 4/2005 Scher et al.
6,887,450 B2 5/2005 Chen et al.
6,918,284 B2 7/2005 Snow et al.
6,942,921 B2 9/2005 Rueckes et al.
6,949,199 B1 9/2005 Gauzner et al.
6,949,206 B2 9/2005 Whitford
6,969,690 B2 11/2005 Zhou et al.
7,098,151 B2 8/2006 Moriya et al.
7,160,169 B2 1/2007 Park
7,169,669 B2 1/2007 Blakers et al.
7,195,733 B2 3/2007 Rogers et al.
7,211,853 B2 5/2007 Bachtold et al.
7,226,818 B2 6/2007 Malenfant et al.
7,255,919 B2 8/2007 Sakata et al.
7,264,990 B2 9/2007 Rueckes et al.
7,304,357 B2 12/2007 Jaiprakash et al.
7,329,897 B2 2/2008 Nishikawa et al.
7,335,603 B2 2/2008 Mancevski et al.
7,347,981 B2 3/2008 Crespi et al.
7,368,791 B2 5/2008 Zhang et al.
7,374,968 B2 5/2008 Kornilovich et al.
7,521,292 B2 4/2009 Rogers et al.
7,557,367 B2 7/2009 Rogers et al.
7,622,367 B1 11/2009 Nuzzo et al.
7,704,684 B2 4/2010 Rogers et al.
2001/0023986 A1 9/2001 Mancevski
2003/0006527 A1 1/2003 Rabolt et al.
2003/0132461 A1 7/2003 Roesner et al.
2003/0178316 A1 9/2003 Jacobs et al.
2003/0227116 A1 12/2003 Halik et al.
2004/0005723 A1 1/2004 Empedocles et al.
2004/0026684 A1 2/2004 Empedocles et al.
2004/0079464 A1 4/2004 Kumakura
2004/0095658 A1 5/2004 Buretea et al.
2004/0136866 A1 7/2004 Pontis et al.
2004/0146560 A1 7/2004 Whiteford et al.
2004/0178390 A1 9/2004 Whiteford
2004/0192072 A1* 9/2004 Snow et al. ................... 438/800
2004/0192082 A1 9/2004 Wagner et al.
2004/0206448 A1 10/2004 Dubrow
2004/0238887 A1 12/2004 Nihey
2004/0250950 A1 12/2004 Dubrow
2005/0038498 A1 2/2005 Dubrow et al.
2005/0067349 A1 3/2005 Crespi et al.
2005/0081625 A1 4/2005 Chen et al.
2005/0184641 A1 8/2005 Armitage et al.
2005/0224778 A1 10/2005 Dubin et al.
2005/0238967 A1 10/2005 Rogers et al.
2006/0038182 A1 2/2006 Rogers et al.
2006/0118777 A1 6/2006 Hirakata et al.
2006/0127817 A1 6/2006 Ramanujan et al.
2006/0134893 A1 6/2006 Savage et al.
2006/0189822 A1 8/2006 Yoon et al.
2006/0244105 A1 11/2006 Forbes et al.
2006/0279191 A1 12/2006 Geohegan et al.
2007/0029612 A1 2/2007 Sandhu
2007/0032089 A1 2/2007 Nuzzo et al.
2008/0020487 A1 1/2008 McLean et al.
2008/0055581 A1 3/2008 Rogers et al.
2009/0199960 A1 8/2009 Nuzzo et al.
2009/0294803 A1 12/2009 Nuzzo et al.
2010/0108987 A1* 5/2010 Ishida ............................ 257/20
2011/0136304 A1* 6/2011 Wong et al. ................... 438/167

FOREIGN PATENT DOCUMENTS

JP 11-142878 5/1999
JP 2001-007340 1/2001
JP 2002092984 3/2002
TW 0367570 8/1999
TW 0494257 7/2002
WO WO 00/46854 8/2000
WO WO 00/49421 8/2000
WO WO 00/49658 8/2000
WO WO 00/55915 9/2000
WO WO 00/55916 9/2000
WO WO 01/33621 5/2001
WO WO 02/27701 4/2002
WO WO 02/43032 5/2002
WO WO 02/097708 12/2002
WO WO 02/097724 12/2002
WO WO 03/032240 4/2003
WO WO 03/049201 6/2003
WO WO 03/063211 7/2003
WO WO 03/085700 10/2003
WO WO 03/085701 10/2003
WO WO 03/092073 11/2003
WO WO 2004/003535 1/2004
WO WO 2004/022637 3/2004
WO WO 2004/022714 3/2004
WO WO 2004/023527 3/2004
WO WO 2004/024407 3/2004
WO WO 2004/027822 4/2004
WO WO 2004/032190 4/2004

(56) References Cited

FOREIGN PATENT DOCUMENTS

| | | | |
|---|---|---|---|
| WO | WO 2004/032191 | | 4/2004 |
| WO | WO 2004/032193 | | 4/2004 |
| WO | WO 2004/034025 | | 4/2004 |
| WO | WO 2004/086289 | | 10/2004 |
| WO | WO 2004/094303 | | 11/2004 |
| WO | WO 2004/100252 | | 11/2004 |
| WO | WO 2004/099068 | | 12/2004 |
| WO | WO 2004/105456 | | 12/2004 |
| WO | WO 2005/005679 | | 1/2005 |
| WO | WO 2005/015480 | | 2/2005 |
| WO | WO 2005/017962 | | 2/2005 |
| WO | WO 2005/022120 | | 3/2005 |
| WO | WO 2007/126412 | | 11/2007 |
| WO | WO 2008/007226 | | 1/2008 |
| WO | WO 2008/033327 | | 3/2008 |
| WO | WO 2008129992 | A1 * | 10/2008 |
| WO | WO 2010/005707 | | 1/2010 |

OTHER PUBLICATIONS

Adachi et al. (1983) "Chemical Etching Characteristics of (001)GaAs," *J. Electrochem. Soc.* 130:2427-2435.
Ago et al. (2005) "Aligned Growth of Isolated Single-Walled Carbon Nanotubes Programmed by Atomic Arrangement of Substrate Surface," *Chem. Phys. Lett.* 408:433-438.
Ago et al. (2006) "Synthesis of Horizontally-Aligned Single Walled Carbon Nanotubes with Controllable Density on Sapphire Surface and Polarized Raman Spectroscopy," *Chem. Phys. Lett.* 421:399-403.
Alivisatos et al. (1996) "Semiconductor Clusters, Nanocrystals, and Quantum Dots," *Science* 271:933-937.
Alivisatos et al. (1998) "From Molecules to Materials: Current Trends and Future Directions," *Adv. Mater.* 10:1297-1336.
Allen et al. (Feb. 20, 2006) "Nanomaterial Transfer Using Hot Embossing for Flexible Electronic Devices," *Appl. Phys. Lett.* 88:083112.
Ambrosy et al. (1996) "Silicon Motherboards for Multichannel Optical Modules," *IEEE Trans. Compon. Pack. A* 19:34-40.
Anagnostopoulos et al. (2003) "Micro-Jet Nozzle Array for Precise Droplet Metering and Steering Having Increased Droplet Deflection," *12$^{th}$ International Conference on Solid State Sensors, Actuators and Microsystems*, Boston, pp. 368-371.
Ando et al. (2004) "Self-Aligned Self-Assembly Process for Fabricating Organic Thin-Film Transistors," *Appl. Phys. Lett.* 85:1849-1851.
Aoki et al. (2003) "Microassembly of Semiconductor Three Dimensional Photonic Crystals," *Nat. Mater.* 2:117-121.
Arnold et al. (Web Release Oct. 4, 2006) "Sorting Carbon Nanotubes by Electronic Structure Using Density Differentiation," *Nat. Nanotechnol.* 1:60-65.
Arnold et al. (Web Release Mar. 12, 2005) "Enrichment of Single-Walled Carbon Nanotubes by Diameter in Density Gradients," *Nano Lett.* 5:713-718.
Avouris et al. (Oct. 2007) "Carbon-Based Electronics," *Nat. Nanotechnol.* 2:605-615.
Bachtold et al. (Nov. 9, 2001) "Logic Circuits with Carbon Nanotube Transistors," *Science* 294:1317-1320.
Balmer et al. (2005) "Diffusion of Alkanethiols in PDMS and Its Implications on Microcontact Printing (μCP)," *Langmuir* 21(2):622-632.
Bao et al. (1997) "High-Performance Plastic Transistors Fabricated by Printing Techniques," *Chem. Mater.* 9:1299-1301.
Bao et al. (1999) "Printable Organic and Polymeric Semiconducting Materials and Devices," *J. Mater. Chem.* 9:1895-1904.
Barquins, M. (1992) "Adherence, Friction and Wear of Rubber-Like Materials," *Wear* 158:87-117.
Bates, F.S. (1991) "Polymer-Polymer Phase Behavior," *Science* 251:898-905.
Battaglia et al. (2003) "Colloidal Two-Dimensional Systems: CdSe Quantum Shells and Wells," Angew. Chem. Int. Ed. 442:5035-5039.
Bauer et al. (2004) "Biological Applications of High Aspect Ratio Nanoparticles," *J. Mater. Chem.* 14:517-526.
Beecher et al. (2007) "Ink-Jet Printing of Carbon Nanotube Thin Film Transistors," *J. Appl. Phys.* 102:043710.
Berg et al. (2003) "Tailored Micropatterns Through Weak Polyelectrolyte Stamping," Langmuir 19:2231-2237.
Bernard et al. (1998) "Printing Patterns of Proteins," *Langmuir* 14(9):2225-2229.
Bhunia et al. (2004) "Free-Standing and Vertically Aligned InP Nanowires Grown by Metalorganic Vapor Phase Epitaxy," *Physica E* 21:583-587.
Bietsch et al. (2000) "Conformational Contact and Pattern Stability of Stamps Used for Soft Lithography," *J. Appl. Phys.* 88:4310-4318.
Blanchet et al. (2003) "Large Area, High Resolution, Dry Printing of Conducting Polymers for Organic Electronics," *Appl. Phys. Lett.* 82:463-465.
Blanchet et al. (2003) "Printing Techniques for Plastic Electronics," *J. Imag. Sci. Tech.* 47(4):296-303.
Blazdell et al. (1995) "The Computer Aided Manufacture of Ceramics Using Multilayer Jet Printing," *Sci. Lett.* 14:1562-1565.
Blazdell et al. (Nov. 1999) "Preparation of Ceramic Inks for Solid Freeforming Using a Continuous Jet Printer," *J. Mat. Syn. Process.* 7(6):349-356.
Boltau et al. (1998) "Surface-Induced Structure Formation of Polymer Blends on Patterned Substrates," *Nature* 391:877-879.
Bowden et al. (1997) "Self Assembly of Mesoscale Objects into Ordered Two-Dimensional Arrays," *Science* 276:233-235.
Bowden et al. (1998) "Spontaneous Formation of Ordered Structures in Thin Films of Metals Supported on an Elastomeric Polymer," *Nature* 393:146-149.
Bowden et al. (2001) "Molecule-Mimetic Chemistry and Mesoscale Self-Assembly," *Acc. Chem. Res.* 34:231-238.
Bradley et al. (2003) "Flexible Nanotube Electronics," *Nano Lett.* 3(10):1353-1355.
Braun et al. (1999) "Electrochemically Grown Photonic Crystals," *Nature* 402:603-604.
Brekner et al. (1987) "Curing Studies of a Polyimide Precursor. 2. Polyamic Acid," *J. Polym. Sci. Pol. Chem.* 25:2479-2491.
Briseno et al. (Dec. 14, 2006) "Patterning Organic Single-Crystal Transistor Arrays," *Nature* 444:913-917.
Brown, H.R. (1991) "The Adhesion Between Polymers," *Ann. Rev. Mater. Sci.* 21:463-489.
Bruschi et al. (2001) "Micromachined Silicon Suspended Wires With Submicrometric Dimensions," *Microelectron. Eng.* 57-58:959-965.
Bulashevich et al. (2002) "Nanotube Devices: A Microscopic Model," *Jets Lett.* 75(4):205-209.
Buma et al. (2001) "High-Frequency Ultrasound Array Element Using Thermoelastic Expansion in an Elastomeric Film," *Appl. Phys. Lett.* 79:548-550.
Burdinski et al. (2005) "Single Etch Patterning of Stacked Silver and Molybdenum Alloy Layers on Glass Using Microcontat Wave Printing," *J. Am. Chem. Soc.* 127(31):10786-10787.
Burgin et al. (2000) "Large Area Submicrometer Contact Printing Using a Contact Aligner," *Langmuir* 16:5371-5375.
Burns et al. (2003) "Printing of Polymer Thin-Film Transistors for Active-Matrix-Display Applications," *J. Soc. Inf. Display* 11:599-604.
Campbell et al. (2000) "Fabrication of Photonic Crystals for the Visible Spectrum by Holographic Lithography," *Nature* 404:53-56.
Cao et al. (2006) "Bilayer Organic-Onorganic Gate Dielectrics for High Performmance, Low-Voltage, Single-Walled Carbon Nanotube Thin-Film Transistors, Complementary Logic Gates and p-n Diodes on Plastic Substrates," *Adv. Funct. Mater.* 16:2355-2362.
Cao et al. (2006) "Highly Bendable, Transparent Thin-Film Transistors That Use Carbon-Nanotube-Based Conductors and Semiconductors with Elastomeric Dielectrics," *Adv. Mater.* 18(3):304-309.
Cao et al. (2006) "Transparent flexible organic thin-film transistors that use printed single-walled carbon nanotube electrodes," *Applied Physics Lett.* 88:113511.
Cao et al. (2007) "Gate Capacitance Coupling of Singled-Walled Carbon Nanotube Thin-Film Transistors," *Appl. Phys. Lett.* 90:023516.

(56) References Cited

OTHER PUBLICATIONS

Cao et al. (Jul. 24, 2008) "Medium-Scale Carbon Nanotube Thin-Film Integrated Circuits on Flexible Plastic Substrates," *Nature* 454:495-500.
Carr et al. (1998) "Measurement of Nanomechanical Resonant Structures in Single-Crystal Silicon," *J. Vac. Sci. Technol. B* 16:3821-3824.
Cassell et al. (Web Release Jul. 20, 1999) "Large Scale CVD Synthesis of Single-Walled Carbon Nanotubes," *J. Phys. Chem. B* 103(31):6484-6492.
Chadhury et al. (1991) "Direct Measurement of Interfacial Interactions Between Semispherical Lenses and Flat Sheets of Poly(dimethylsiloxane) and their Chemical Derivatives," *Langmuir* 7:1013-1025.
Chang et al. (1994) "Process Techniques, Lithography and Device-Related Physics and Principles," In; *GaAs High-Speed Devices: Physics, Technology and Circuit Application*, John Wiley and Sons, New York, pp. 115-278.
Chason et al. (Jul. 2005) "Printed Organic Semiconducting Devices," *Proc. IEEE* 93(7):1348-1356.
Chen et al. (2003) "Characterization of Pd-GaAs Schottly Diodes Prepared by the Electrodes Plating Technique," *Semiconductor. Sci. Technol.* 18:620-626.
Chen et al. (2003) "Electronic Paper: Flexible Active-Matrix Electronics Ink Display," *Nature* 423:136.
Chen et al. (2004) "Herringbone Buckling Patterns of Compresses Thin Films on Compliant Substrates," *J. Appl. Mech.* 71:597.
Chen et al. (2005) "The Role of Metal-Nanotube Contact in the Performance of Carbon Nanotube Field-Effect Transistors," *Nano Lett.* 5(7):1497-1502.
Chen et al. (Feb. 27, 2006) "Complementary Carbon Nanotube-Gated Carbon Nanotube Thin-Film Transistor," *Appl. Phys. Lett.* 88:093502.
Chen et al. (Mar. 24, 2006) "An Integrated Logic Circuit Assembled on a Single Carbon Nanotube," *Science* 311:1735-.
Chen et al. (2005) "Self-Aligned Carbon Nanotube Transistors with Charge Transfer Doping," *Appl. Phys. Lett.* 86:123108.
Cheng et al. (Jun. 22, 1998) "Large-Scale and Low-Cost Synthesis of Single-Walled Carbon Nanotubes by the Catalytic Pyrolysis of Hydrocarbons," *Appl. Phys. Lett.* 72(25):3282-3284.
Cheng et al. (2005) "Ink-Jet Printing, Self-Assembled Polyelectrolytes, and Electroless Plating: Low Cost Fabrication of Circuits on a Flexible Substrate at Room Temperature," *Macromol. Rapid Commun.* 26:247-264.
Chiang et al. (Aug. 10, 2001) "Purification and Characterization of Single-Wall Carbon Nanotubes (SWNTs) Obtained from the Gas-Phase Decomposition of CO (HiPco Process)," *J. Phys. Chem. B* 105:8297-8301.
Childs et al. (2002) "Decal Transfer Microlithography: A New Soft-Lithographic Patterning Method," *J. Am. Chem. Soc.* 124:13583-13596.
Chimot et al. (2007) "Gigahertz Frequency Flexible Carbon Nanotube Transistors," *Appl. Phys. Lett.* 91:153111.
Chou et al. (2004) "An Orientation-Controlled Pentacene Film Aligned by Photoaligned Polyimide for Organic Thin-Film Transistor Applications," *Adv. Func. Mater.* 14:811-815.
Chu et al. (2005) "High-Performance Organic Thin-Film Transistors with Metal Oxide/Metal Bilayer Electrode," *Appl. Phys. Lett.* 87:193508.
Chung et al. (2000) "Silicon Nanowire Devices," *Appl. Phys. Lett.* 76(15):2068-2070.
Collins et al. (Apr. 27, 2001) "Engineering Carbon Nanotubes and Nanotube Circuits Using Electrical Breakdown," *Science* 292:706-709.
Creagh et al. (2003) "Design and Performance of Inkjet Print Heads for Non-Graphic-Arts Applications," *MRS Bull.* 28:807-811.
Crone et al. (Feb. 3, 2000) "Large-Scale Complementary Integrated Circuits Based on Organic Transistors," *Nature* 403:521-523.
Crowder et al. (1998) "Low-Temperature Single-Crystal Si TFTs Fabricated on Si Films Processed via Sequential Lateral Solidification," *IEEE Electron. Dev. Lett.* 19:306-308.
Cui et al. (2001) "Nanowire Nanosensors for Highly Sensitive and Selective Detection of Biological and Chemical Species," *Science* 293:1289-1292.
Dai et al. (2003) "Novel Nanostructures of Functional Oxides Synthesized by Thermal Evaporation," *Adv. Funct. Mater.* 13:9-24.
Davidson et al. (2004) "Supercritical Fluid-Liquid-Solid Synthesis of Gallium Arsenide Nanowires Seeded by Alkanethiol-Stabilized Gold Nanocrystals," *Adv. Mater.* 16:646-649.
de Gans (2004) "Inkjet Printing of Polymers: State of the Art and Future Developments," *Adv. Mater.* 16(3):203-213.
DeBoer et al. (2004) "Organic Single-Crystal Field-Effect Transistors," *Phys. Stat. Sol.* 201:1302-1331.
Decre et al. (2003) Wave Printing(1): Towards Large-Area, Multilayer Microcontact Printing, *Materials Research Society Fall Meeting*, pp. M4.9:59-61.
Deen et al. (2004) "Electrical Characterization of Polymer-Based FETs Fabricated by Spin-Coating Poly(3-alkylthiophene)s," *IEEE Trans. Electron Devices* 51:1892-1901.
Delmerche et al. (1997) "Stability of Molded Polydimethylsiloxane Microstructures," *Adv. Mat.* 9:741-746.
Deruelle et al. (1995) "Adhesion at the Solid-Elastomer Interface: Influence of Interfacial Chains," *Macromol.* 28:7419-7428.
Derycke et al. (Sep. 2001) "Carbon Nanotube Inter- and Intramolecular Logic Gates," *Nano Lett.* 1(9):453-456.
Dinsmore et al. (2002) "Colloidosomes: Selectively Permeable Capsules Composed of Colloidal Particles," *Science* 298:1006-1009.
Divliansky et al. (2003) "Fabrication of Three-Dimensional Polymer Photonic Crystal Structures Using Single Diffraction Element Interference Lithography," *Appl. Phys. Lett.* 82(11):1667-1669.
Dodabalapur et al. (1995) "Organic Transistors: Two-Dimensional Transport and Improved Electrical Characteristics," *Science* 268:270-271.
Duan et al. (2000) "General Synthesis of Compound Semiconductor Nanowires," *Adv. Mater.* 12:298-302.
Duan et al. (2003) "High-performance Thin-Film Transistors Using Semiconductor Nanowires and Nanoribbons," *Nature* 425:274-278.
Duboz et al. (1998) "Transistors and Detectors Based on GaN-Related Materials," In; *Group III Nitride Semiconductor Compounds*, Gill, B. ed., Clarendon, Oxford, pp. 343-387.
Duesberg et al. (1998) "Chromatographic Size Separation of Single-Wall Carbon Nanotubes," *Appl. Phys. A* 67:117-119.
Duesberg et al. (Dec. 18, 2000) "Polarized Raman Spectroscopy on Isolated Single-Wall Carbon Nanotubes," *Phys. Rev. Lett.* 85(25):5436-5439.
Duffy et al. (Dec. 1, 1998) "Rapid Prototyping of Microfluidic Systems in Poly(dimethylsiloxane)," *Anal. Chem.* 70(23):4974-4984.
Durkop et al. (2004) "Extraordinary Mobility in Semiconducting Carbon Nanotube," *Nano Lett.* 4(1):35-39.
Edrington et al. (2001)"Polymer-Based Photonic Crystals," *Adv. Mater.* 13:421-425.
Eftekhari, G. (1993) "Variation in the Effective Richardson Constant of Metal—GaAs and Metal—InP Contacts Due to the Effect of Processing Parameters," *Phys. Status Solid A-Appl. Res.* 140:189-194.
Faez et al. (1999) "An Elastomeric Conductor Based on Polyaniline Prepared by Mechanical Mixing," *Polymer* 40:5497-5503.
Felgner et al. (1996) "Flexural Rigidity of Microtubules Measured with the Use of Optical Tweezers," *J. Cell Sci.* 109:509-516.
Feng et al. (2003) "Removal of Some Impurities from Carbon Nanotubes," *Chem. Phys. Lett.* 375:645-648.
Fink et al. (1999) "Block Copolymers as Photonic Bandgap Materials," *J. Lightwave Tech.* 17:1963-1969.
Flewitt et al. (2005) "Low-Temperature Deposition of Hydrogenated Amorphous Silicon in an Electron Cyclotron Resonance Reactor for Flexible Displays," *Proc. IEEE* 93:1364-1373.
Folch et al. (Mar. 1999) "Wafer-Level In-Registry Microstamping," *J. Microelectromech. Syst.* 8(1):85-89.
Forment et al. (2004) "Influence of Hydrogen Treatment and Annealing Processes Upon the Schottky Barrier Height of Au/n-GaAs and Ti/n-GaAs Diodes," *Semicond. Sci. Technol.* 19:1391-1396.
Forrest et al. (2004) "The Path to Ubiquitous and Low-Cost Organic Electronic Appliances on Plastic," *Nature* 428:911-918.

(56) References Cited

OTHER PUBLICATIONS

Fortunato et al. (2005) "Flexible a-Si: H Position-Sensitive Detectors," *Proc. IEEE* 93:1281-1286.
Freund, L.B. (2000) "The Mechanics of Electronic Materials," *Int. J. Solids Struct*. 37:185-196.
Friedman et al. (2005) "Nanotechnology: High-Speed Integrated Nanowire Circuits," *Nature* 434:1085.
Fujii et al. (2005) "Nanometer-Scale Crystallization of Thin HfO2 Films Studied by HF-Chemical Etching," *Appl. Phys. Lett*. 86:212907.
Furneaux et al. (1989) "The Formation of Controlled-Porosity Membranes from Anodically Oxidized Aluminum," *Nature* 337:147-149.
Gan et al. (2002) "Preparation of Thin-Film Transistors with Chemical Bath Deposited CdSe and CdS Thin Films," *IEEE Trans. Electron. Dev*. 49:15-18.
Garnier et al. (1994) "All-Polymer Field-Effect Transistor Realized by Printing Techniques," *Science* 265:1684-1686.
Geissler et al. (2003) "Fabrication of Metal Nanowires Using Microcontact Printing," *Langmuir* 19(15):6301-6311.
Geissler et al. (Jun. 2003) "Selective Wet-Etching of Microcontact-Printed Cu Substrates with Control Over the Etch Profile," *Microelec. Eng*. 67-68:326-332.
Gelinck et al. (2000) "High-Performance All-Polymer Integrated Circuits," *Appl. Phys. Lett*. 77:1487-1489.
Gelinck et al. (2004) "Flexible Active-Matrix Displays and Shift Registers Based on Solution-Processed Organic Transistors," *Nat. Mater*. 3:106-110.
Georgakilas et al. (2002) "Wafer-Scale Integration of GaAs Optoelectronic Devices with Standard Si Integrated Circuits Using a Low-Temperature Bonding Procedure," *Appl. Phys. Lett*. 81:5099-5101.
Givargizov, E.I. (1991) "Applications," In; *Oriented Crystallization on Amorphous Substrates*, Plenum Press, New York, pp. 341-363.
Gleskova et al. (2004) "Field-Effect Mobility of Amorphous Silicon Thin-Film Transistors Under Strain," *J. Noncryst. Sol*. 338:732-735.
Goetting et al. (1999) "Microcontact Printing of Alkanephosphonic Acids on Aluminum: Pattern Transfer by Wet Chemical Etching," *Langmuir* 15:1182-1191.
Goldman et al. (1996) "Correlation of Buffer Strain Relaxation Modes with Transport Properties of Two-Dimensional Electron Gases," *J. Apple. Phys*. 80:6849-6854.
Goldmann et al. (2004) "Hole Mobility in Organic Single Crystals Measured by a "Flip-Crystal" Field-Effect Technique," *J. Appl. Phys*. 96:2080-2086.
Gratz et al. (1991) "Atomic Force Microscopy of Atomic-Scale Ledges and Etch Pits Formed During Dissolution of Quartz," *Science*, 251:1343-1346.
Gray et al. (2004) "High-Conductivity Elastomeric Electronics," *Adv. Mater*. 16:393-397.
Gray et al. (Dec. 2001) "Screen Printed Organic Thin Film Transistors (OTFTs) on a Flexible Substrate," *Proc. SPIE* 4466:89-94.
Grove et al. (1999) "Color Flat Panel Manufacturing Using Ink Jet Technology," Display Works '99, 1-4.
Guo et al. (Aug. 19, 2002) "Metal-Insulator-Semiconductor Electrostatics of Carbon Nanotubes," *Appl. Phys. Lett*. 81(8):1486-1488.
Gur et al. (2005) "Air-Stable All-Inorganic Nanocrystal Solar Cells Processed from Solution," *Science* 310:462-465.
Haddon et al. (Apr. 2004) "Purification and Separation of Carbon Nanotubes," *MRS Bull*. 29:252-259.
Hafner et al. (Oct. 30, 1998) "Catalytic Growth of Single-Wall Carbon Nanotubes from Metal Particles," *Chem. Phys. Lett*. 296(1-2):195-202.
Haisma et al. (2002) "Contact Bonding, Including Direct-Binding in a Historical and Recent Context of Materials Science and Technology, Physics and Chemistry—Historical Review in a Broader Scope and Comparative Outlook," *Mater. Sci. Eng. R* 37:1-60.
Halik et al. (2004) "Low-Voltage Organic Transistors with an Amorphous Molecular Gate Dielectric," *Nature* 431:963-966.
Hamilton et al. (2004) "Field-Effect Mobility of Organic Polymer Thin-Film Transistors," *Chem. Mater*. 16:4699-4704.
Han et al. (2005) "Template-Free Directional Growth of Single-Walled Carbon Nanotubes on a- and r-Plane Sapphire," *J. Am. Chem. Soc*. 127:5294-5295.
Harada et al. (2001) "Catalytic Amplification of the Soft Lithographic Patterning of Si. Nonelectrochemical Orthogonal Fabrication of Photoluminescent Porous Si Pixel Arrays," *J. Am. Chem. Soc*. 123:8709-8717.
Hausmann et al. (Sep. 21, 2002) "Atomic Layer Deposition of Hafnium and Zirconium Oxides Using Metal Amide Precursors," *Chem. Mat*. 14:4350-4358.
Hayes et al. (Sep.-Dec. 1998) "Micro-Jet Printing of Polymers and Solder for Electronics Manufacturing," *J. Elec. Manufac*. 8(3-4):209-216.
Heffelfinger et al. (1997) "Steps and the structure of the (0001) α-alumina surface," *Surf. Sci.*, 370:L168-L172.
Hines et al. (2005) "Nanotransfer Printing of Organic and Carbon Nanotube Thin-Film Transistors on Plastic Substrates," *Appl. Phys. Lett*. 86:163101.
Holzinger et al. (Web Release Apr. 2000) "A New Purification Method for Single-Wall Carbon Nanotubes (SWNTs)," *Appl. Phys. A* 70:599-602.
Horn et al. (1992) "Contact Electrification and Adhesion Between Dissimilar Materials," *Science* 256:362-364.
Hoyer, P. (1996) "Semiconductor Nanotube Formation by a Two-Step Template Process," *Adv. Mater*. 8:857-859.
Hsia et al. (2005) "Collapse of Stamps for Soft Lithography Due to Interfacial Adhesion," *Appl. Phys. Lett*. 86:154106.
Hsu et al. (2002) "Amorphous Si TFTs on Plastically Deformed Spherical Domes," *J. Non-Crystalline Solids* 299-302:1355-1359.
Hsu et al. (2003) "Nature of Electrical Contacts in a Metal—Molecule—Semiconductor System," *J. Vac. Sci. Technol. B* 21(4):1928-1935.
Hsu et al. (2004) "Effects of Mechanical Strain on TFTs on Spherical Strains," *IEEE Trans. Electron Dev*. 51(3):371-377.
Hu et al. (1997) "Using Soft Lithography to Fabricate GaAs/AIGaAs Heterostructure Field Effect Transistors," *Appl. Phys. Lett*. 71:2020-2022.
Hu et al. (1999) Chemistry and Physics in One Dimension: Synthesis and Properties of Nanowires and Nanotubes, *Acc. Chem. Res*. 32:435-445.
Hu et al. (2004) "Percolation in Transparent and Conducting Carbon Nanotube Networks," *Nano Lett*. 4(12):2513-2517.
Huang et al. (2001) "Directed Assembly of One-Dimensional Nanostructures into Functional Networks," *Science* 291:630-633.
Huang et al. (2001) "Room-Temperature Ultraviolet Nanowire Nanolasers," *Science* 292:1897-1899.
Huang et al. (2003) "Growth of Millimeter-Long and Horizontally Aligned Single-Walled Carbon Nanotubes on Flat Substrates," *J. Am. Chem. Soc.*, 125:5636-5637.
Huang et al. (2004) "Long and Oriented Single-Walled Carbon Nanotubes Grown by Ethanol Chemical Vapor Deposition," *J. Phys. Chem. B* 108:16451-16456.
Huang et al. (2004) "Self-Organizing High-Density Single-Walled Carbon Nanotube Arrays from Surfactant Suspensions," *Nanotechnol*. 15:1450-1454.
Huang et al. (2005) "Nonlinear Analyses of Wrinkles in a Film Bonded to a Compliant Substrate," *J. Mech. Phys. Solids* 53:2101-2118.
Huang et al. (2005) "Stamp Collapse in Soft Lithography," *Langmuir* 21:8058-8068.
Huck et al. (2000) "Ordering of Spontaneously Formed Buckles on Planar Surfaces," *Langmuir* 16:3497-3501.
Huie, J.C. (2003) "Guided Molecular Self Assembly: A review of Recent Efforts," *Smart Mater. Struct*. 12:264-271.
Huitema et al. (2001) "Plastic Transistors in Active-Matrix Displays," *Nature* 414:599.
Hur et al. (2005) "Printed thin-film transistors and complementary logic gates that use polymer-coated single-walled carbon nanotube networks," *J. Appl. Phys.*, 98, 114302.
Hur et al. (205) "Organic Nanodelectrics for Low Voltage Carbon Nanotube Thin Film Transistors and Complementary Logic Gates," *J. Am. Chem. Soc*. 127:13808-13809.

(56) References Cited

OTHER PUBLICATIONS

Hur et al. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett*. 243502.
Hutchinson et al. (1992) "Mixed Mode Cracking in Layered Materials," *Adv. Appl. Mech*. 29:63-191.
Ilani et al. (Sep. 24, 2006) "Measurement of the Quantum Capacitance of Interacting Electrons in Carbon Nanotubes," *Nat. Phys*. 2:687-691.
Imparato et al. (2005) "Excimer Laser Induced Crystallization of Amorphous Silicon on Flexible Polymer Substrates," *Thin Solid Films* 487:58-62.
International Search Report and Written Opinion, Corresponding to International Application No. PCT/US09/47442, Mailed Sep. 21, 2009.
International Search Report and Written Opinion, Corresponding to International Application No. PCT/US06/32125, Mailed Mar. 21, 2008.
Islam et al. (Jan. 16, 2003) "High Weight Fraction Surfactant Solubilization of Single-Wall Carbon Nanotubes in Water," *Nano Lett*. 3(2):269-273.
Ismach et al. (2004) "Atomic-Step-Templated Formation or a Single Wall Carbon Nanotube Patterns," *Angew. Chem. Int. Ed*. 43:6140-6143.
Itoh et al. (1991) "Cathodoluminescence Properties of Undoped and Zn-Doped $Al_xGa_{1-x}N$ Grown by Metaloganic Vapor Phase Epitaxy," *Jap. J. Appl. Phys*. 30:1604-1608.
Jabbour et al. (2001) "Screen Printing for the Fabrication of Organic Light-Emitting Devices," *IEEE J. Select. Top. Quantum. Electron*. 7(5):769-773.
Jacobs et al. (2002) "Fabrication of a Cylindrical Display by Patterned Assembly," *Science* 296:323-325.
Jain et al. (2000) "III-Nitrides: Growth, Characterization, and Properties," *J. Appl. Phys*. 87:965-1006.
Jain et al. (2005) "Flexible Electronics and Displays: High-Resolution, Roll-to-Roll, Projection Lithography and Photoablation processing Technologies for High-Throughput Production," *Proc. IEEE* 93:1500-1510.
James et al. (1998) "Patterned Protein Layers on Solid Substrates by This Stamp Microcontact Printing," *Langmuir* 14:742-744.
Jang et al. (2003) "Lateral Growth of Aligned Multiwalled Nanotubes Under Electric Fields," *Solid State Commun*. 126:305-308.
Jang et al. (2006) "Low-Voltage and High-Field-Effect Mobility Organic Transistors with a Polymer Insulator," *Appl. Phys. Lett*. 88:072101.
Javey et al. (2002) "High-κ Dielectrics for Advanced Carbon-Nanotube Transistors and Logic Gates," *Nature Mater*. 1:241-246.
Javey et al. (2005) "High Performance n-Type Carbon Nanotube Field-Effect Transistors with Chemically Doped Contacts," *Nano Lett*. 5(2):345-348.
Javey et al. (Aug. 7, 2003) "Ballistic Carbon Nanotube Field-Effect Transistors," *Nature* 424:654-657.
Jenkins et al. (1994) "Gallium Arsenide Transistors: Realization Through a Molecularly Designed Insulator," *Science* 263:1751-1753.
Jeon et al. (1995) "Patterning of Dielectric Oxide Thin Layers by Microcontact Printing of Self-Assembled Monolayers," *J. Mater. Res*. 10:2996-2999.
Jeon et al. (2004) "Fabricating Complex Three-Dimensional Nanostructures with High Resolution Conformable Phase Masks," *Proc. Natl. Acad. Sci. USA* 101:12428-12433.
Jeon et al. (2004) "Three Dimensional Nanofabrication with Rubber Stamps and Conformable Photomasks," *Adv. Mater*. 16:593-600.
Jiang et al. (1999) "Preparation of Macroporous Metal Films from Colloidal Crystals," *J. Am. Chem. Soc*. 121:7957-7958.
Jiang et al. (2002) "Polymer-on-Polymer Stamping: Universal Approaches to Chemically Patterned Surfaces," *Langmuir* 18:2607-2615.
Jin et al. (2004) "Scalable Interconnection and Integration of Nanowire Devices Without Registration," *Nano Lett*. 4:915-919.
Jin et al. (2004) "Soft Lithographic Fabrication of an Image Sensor Array on a Curved Substrate," *J. Vac. Sci. Technol. B* 22:2548-2551.
Jiyun, C.H. (2003) "Guided Molecular Self-Assembly: A Review of Recent Efforts," *Smart Mater. Struct*. 12:564-271.
Johnson et al. (1999) "Ordered Mesoporous Polymers of Tunable Pore Size from Colloidal Silica Templates," *Science* 283:963-965.
Jortner et al. (2002) "Nanostructured Advanced Materials Perspectives and Directions," *Pure Appl. Chem*. 74(9):1491-1506.
Joselevich (2002) "Vectorial Growth of Metallic and Semiconducting Single-Wall Carbon Nanotubes," *Nano Lett*. 2(10:1137-1141.
Journet et al. (Aug. 21, 1997) "Large-Scale Production of Single-Walled Carbon Nanotubes by the Electric-Arc Technique," *Nature* 388:756-758.
Kagan (1999) "Organic-Inorganic Hybrid Materials as Semiconducting Channels in Thin-Film Field-Effect Transistors," *Science* 286:945-947.
Kagan et al. (2001) "Patterning Organic-Inorganic Thin-Film Transistors Using Microcontact Printed Templates," *Appl. Phys. Lett*. 79(21):3536-3538.
Kagan et al. (2003) *Thin Film Transistors*, Dekker, New York, pp. 1-34.
Kane et al. (2000) "Analog and Digital Circuits Using Organic Thin-Film Transistors on Polyester Substrates," *IEEE Electron. Dev. Lett*. 21:534-536.
Kang et al. (2007) "High-Performance Electronics Using Dense, Perfectly Aligned Arrays of Single-Walled Carbon Nanotubes," *Nat. Nanotechnol*. 2:230-236.
Kang et al. (2007) "Printed Multilayer Superstructures of Aligned Single-Walled Carbon Nanotubes for Electronic Applications," *Nano Lett*. 7(11):3343-3348.
Karnik et al. (2003) "Lateral Polysilicon $p^+$-p-$n^+$ and $p^+$-n-$n^+$ Diodes," *Solid-State Electronics* 47:653-659.
Karnik et al. (2003) "Multiple Lateral Polysilicon Diodes as Temperature Sensors for Chemical Microreaction Systems," *Jpn. J. Appl. Phys*. 42:1200-1205.
Katz et al. (2001) "Synthetic Chemistry for Ultrapure, Processable, and High-Mobility Organic Transistor Semiconductors," *Acc. Chem. Res*. 34:359-369.
Katz, H.E. (2004) "Recent Advances in Semiconductor Performance and Printing Processes for Organic Transistor-Based Electronics," *Chem. Mater*. 16:4748-4756.
Kawata et al. (2001) "Finer Features for Functional Microdevices," *Nature* 412:697-698.
Kendall, D.L. (1979) "Vertical Etching of Silicon at Very High Aspect Ratios," *Ann. Rev. Mater. Sci*. 9:373-403.
Khakani et al. (2006) "Lateral Growth of Single Wall Carbon Nanotubes on Various Substrates by Means of an "All-Laser" Synthesis Approach," *Diamond Related Mater*. 15:1064-1069.
Khan et al. (1993) "High Electron Mobility Transistor Based on a GaN-$Al_xGa_{1-x}N$ Heterojunction," *Appl. Phys. Lett*. 63:1214-1215.
Khang et al. (2006) "A Stretchable Form of Single-Crystal Silicon for High-Performance Electronics on Rubber Substraights," *Science* 311:208-212.
Kilby, J.S. (1976) "Invention of the Integrated Circuit," *IEEE Trans. Electron. Dev*. 23:648-654.
Kim et al. (2000) "Field Emission from Carbon Nanotubes for Displays," *Diamond and Related Mater*. 9(3-6):1184-1189.
Kim et al. (2002) "Nanolithography Based on Patterned Metal Transfer and its Application to Organic Electronic Devices," *Appl. Phys. Lett*. 80:4051-4053.
Kim et al. (2003) "Epitaxial self-assembly of block copolymers on lithographically defined nanopatterned substrates," *Nature* 424:411-414.
Kim et al. (Jan. 2008) "Complementary Logic Gates and Ring Oscillators on Plastic Substrates by Use of Printed Ribbons of Single-Crystalline Silicon," *IEEE Trans. Electron Devices* 29(1):73-76.
Kitiyanan et al. (Feb. 4, 2000) "Controlled Production of Single-Wall Carbon Nanotubes by Catalytic Decomposition of CO on Bimetallic Co-Mo Catalysts," *Chem. Phys. Lett*. 317(3-5):497-503.
Klauk et al. (Nov. 1, 2002) "High-Mobility Polymer Gate Dielectric Pentacene Thin Film Transistors," *J. Appl. Phys*. 92(9):5259-5263.

(56) References Cited

OTHER PUBLICATIONS

Klauk et al. (Feb. 15, 2007) "Ultralow-Power Organic Complementary Circuits," *Nature* 445:745-784.
Klein-Wiele et al. (2003) "Fabrication of Periodic Nanostructures by Phase-Controlled Multiple-Beam Interference," *Appl. Phys. Lett.* 83(23):4707-4709.
Knipp et al. (2003) "Pentacine Thin Film Transistors on Inorganic Dielectrics: Morphology, Structural Properties, and Electronic Transport," *J Appl. Phys*. 93:347-355.
Kocabas et al. (2004) "Aligned Arrays of Single-Walled Carbon Nanotubes Generated from Random Networks by Orientationally Selective Laser Ablation," *Nano Lett*. 4(12):2421-2426.
Kocabas et al. (2005) "Guided Growth of Large-Scale, Horizontally Aligned Arrays of Single-Walled Carbon Nanotubes and Their Use in Thin-Film Transistors," *Small* 1(11):1110-1116.
Kocabas et al. (2006) "Large Area Aligned Arrays of SWNTs for High Performance Thin Film Transistors," American Physical Society, APS March Meeting, Mar. 13-17, 2006, Abstract #W31.004.
Kocabas et al. (2006) "Spatially Selective Guided Growth of High-Coverage Arrays and Random Networks of Single-Walled Carbon Nanotubes and Their Integration into Electronic Devices," *J. Am. Chem. Soc*. 128:4540-4541.
Kocabas et al. (2007) "Experimental and Theoretical Studies of Transport Through Large Scale, Partially Aligned Arrays of Single-Walled Carbon Nanotubes in Thin Film Type Transistors," *Nano Lett*. 7(5):1195-1202.
Kocabas et al. (Feb. 5, 2008) "Radio Frequency Analog Electronics Based on Carbon Nanotube Transistors," *Proc. Nat. Acad. Sci. USA* 105(5):1405-1409.
Koide et al. (2000) "Patterned Luminescence of Organic Light-Emitting Diodes by Hot Microcontact Printing (H$\mu$CP) of Self-Assembled Monolayers," *J. Am. Chem. Soc*. 122:11266-11267.
Kong et al. (2004) "Single-Crystal Nanorings Formed by Epitaxial Self-Coiling of Polar Nanobelts," *Science* 303:1348-1351.
Kong et al. (Jan. 28, 2000) "Nanotube Molecular Wires as Chemical Sensors," *Science* 287:622-625.
Kulkarni et al. (2002) "Mesoscale Organization of Metal Nanocrystals," *Pure Appl. Chem* 74(9):1581-1591.
Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett*. 63(14):2002-2004.
Kumar et al. (1994) "Patterning Self-Assembled Monolayers: Applications in Materials Science," *Langmuir* 10:1498-1511.
Kumar et al. (2002) "Thermally-Stable Low-Resistance Ti/Al/Mo/Au Multilayer Ohmic Contacts on n-GaN," *J. Appl. Phys*. 92:1712-1714.
Kumar et al. (Aug. 5, 2005) "Percolating in Finite Nanotube Networks," *Phys. Rev. Lett*., 95, 066802.
Kumar et al. (2006) "Performance of Carbon Nanotube-Dispersed Thin-Film Transistors," *Appl. Phys. Lett*. 89:143501.
Kuo et al. (1985) "Effect of Mismatch Strain on Band Gap in III-V Semiconductors," *J. Appl. Phys*. 57:5428-5432.
Lacour et al. (2003) "Stretchable Gold Conductors on Elastomeric Substrates," *Appl. Phys. Lett*. 82(15):2404-2406.
Lacour et al. (2005) "Stretchable Interconnects for Elastic Electronic Surfaces," *Proc. IEEE* 93(8):1459-1467.
Lambacher et al. (2004) "Electrical Imaging of Neuronal Activity by Multi-Transistor-Array (MTA) Recording at 7.8 μm Resolution," *Appl. Phys. A* 79:1607-1611.
Landes et al. (2002) "Some Properties of Spherical and Rod-Shaped Semiconductor and Metal Nanocrystals," *Pure Appl. Chem*. 74(9):1675-1692.
Law et al. (2004) "Semiconductor Nanowires and Nanotubes," *Ann. Rev. Mater. Res*. 34:83-122.
Lay et al. (2004) "Simple Route to Large-Scale Ordered Arrays of Liquid-Deposited Carbon Nanotubes," *Nano Lett*.4(4):603-606.
Leclercq et al. (1998) "III-V Micromachined Devices for Microsystems," *Microelectronics J*. 29:613-619.
Lee et al. (2000) "Thin Film Transistors for Displays on Plastic Substrates," *Solid State Electron*. 44:1431-1434.
Lee et al. (2003) "High-Performance Poly-Si TFTs on Plastic Substrates Using a Nano-Structured Separation Layer Approach," *IEEE Elec. Dev. Lett*. 24:19-21.
Lee et al. (2004)"Organic Light-Emitting Diodes Formed by Soft Contact Lamination," *Proc. Natl. Acad. Sci. USA* 101(2):429-433.
Lee et al. (2005) "A Printable Form of Single-Crystalline Gallium Nitride for Flexible Optoelectronic Systems," *Small* 1:1164-1168.
Lee et al. (2005) "Large-Area, Selective Transfer of Microstructured Silicon (μs-Si): A Printing-Based Approach to High-Performance Thin0Film Transistors Supported on Flexible Substraights," *Adv. Mater*. 17:2332-2336.
Lee et al. (Feb. 2001) "Application of Carbon Nanotubes to Field Emission Displays," *Diamond and Related Mater*. 10(2):265-270.
Leek et al. (2005) "Charge Pumping in Carbon Nanotubes," *Phys. Rev. Lett*. 95:256802 (1-4).
Li et al. (2002) "High-Resolution Contact Printing with Dendrimers," *Nano Lett*. 2(4):347-349.
Li et al. (2003) "Ultrathin Single-Crystalline-Silicon Cantilever Resonators: Fabrication Technology and Significant Specimen Size Effect on Young's Modulus," *Appl. Phys. Lett*. 83:3081-3083.
Li et al. (2004) "Electrospinning of Nanofibers: Reinventing the Wheel," *Adv. Mater*. 16(14):1151-1170.
Li et al. (Web Release Oct. 30, 2001) "Growth of Single-Walled Carbon Nanotubes from Discrete Catalytic Nanoparticles of Various Sizes," *J. Phys. Chem. B* 105:11424-11431.
Li et al. (Web Release Jan. 22, 2004) Preferential Growth of Semiconducting Single-Walled Carbon Nanotubes by a Plasma Enhanced CVD Method. *Nano Lett*. 4:317-321.
Lieber, C. (2001) "The Incredible Shrinking Circuit," *Sci. Am*. 285(3):58-64.
Lieber, C.M. (2003) "Nanoscale Science and Technology: Building a Bog Future from Small Things," *MRS. Bull*. 28:486-.
Lim et al. (2005) "Flexible Membrane Pressure Sensor," *Sens. Act. A* 119:332-335.
Lin et al. (2005) "High-Performance Carbon Nanotube Field-Effect Transistor with Tunable Polarities," *IEEE Trans. Nano* 4(5):481-489.
Ling et al. (2004) "Thin Film Deposition, Patterning, and Printing in Organic Thin Film Transistors," *Chem. Mater*. 16:4824-4840.
Liu et al. (May 22, 1998) "Fullerene Pipes," *Science* 280:1253-1256.
Liu et al. (1999) "Controlled deposition of individual single-walled carbon nanotubes on chemically functionalized templates," *Chem. Phys. Lett*., 303:125-129.
Long et al. (1990) "Heterostructure FETs and Bipolar Transistors," In; *Gallium Arsenide Digital Integrated Circuit Design*, McGraw-Hill, New York, pp. 58-69.
Loo et al. (2002) "Additive, Nanoscale Patterning of Metal Films with a Stamp and a Surface Chemistry Mediated Transfer Process: Applications in Plastic Electronics," *Appl. Physics Lett*. 81:562-564.
Loo et al. (2002) "High-Resolution Transfer Printing on GaAs Surfaces Using Alkane Dithiol Monolayers," *J. Vac. Sci. Technol. B* 20(6):2853-2856.
Loo et al. (2002) "Interfacial Chemistries for Nanoscale Transfer Printing," *J. Am. Chem. Soc*. 124:7654-7655.
Loo et al. (2002) "Soft, Conformable Electrical Contacts for Organic Semiconductors: High-Resolution Plastic Circuits by Lamination," *Proc. Natl. Acad. Sci. USA* 99(16):10252-10256.
Loo et al. (2003) "Electrical Contacts to Molecular Layers by Nanotransfer Printing," *Nano Lett*. 3(7):913-917.
Luan et al. (1992) "An Experimental Study of the Source/Drain Parasitic Resistance Effects in Amorphous Silicon Thin Film Transistors," *J. Appl. Phys*. 72:766-772.
Madou, M. (1997) "Etch-Stop Techniques," In; *Fundamentals of Microfabrication*, CRC Press, New York, pp. 193-199.
Maikap et al. (2004) "Mechanically Strained-Si NMOSFETs," *IEEE Electron. Dev. Lett*. 25:40-42.
Maldovan et al. (2004) "Diamond-Structured Photonic Crystals," *Nature Materials* 3:593-600.
Maria et al. (2006) "Experimental and Computational Studies of Phase Shift Lithography with Binary Elastomeric Masks," *J. Vac. Sci. Technol. B* 24(2):828-835.

(56) References Cited

OTHER PUBLICATIONS

Markovich et al. (1999) "Architectonic Quantum Dot Solids," *Acc. Chem. Res*. 32:415-423.
Marquette et al. (2004) "Conducting Elastomer Surface Texturing: A Path to Electrode Spotting Application to the Biochip Production," *Biosens. Bioelectron*. 20:197-203.
Martensson et al. (2004) "Nanowire Arrays Defined by Nanoimprint Lithography," *Nano Lett*. 4:699-702.
Martin, C.R. (1995) "Template Synthesis of Electronically Conductive Polymer Nanostructures," *Acc. Chem. Res*. 28:61-68.
Mas-Torrent et al. (2006) "Large Photoresponsivity in High-Mobility Single-Crystal Organic Field-Effect Phototransistors," *ChemPhysChem* 7:86-88.
Matsunaga et al. (2003) "An Improved GaAs Device Model for the Simulation of Analog Integrated Circuit," *IEEE Trans. Elect. Dev*. 50:1194-1199.
McAlpine et al. (2003) "High-Performance Nanowire Electronics and Photonics on Glass and Plastic Substrates," *Nano Lett*. 3:1531-1535.
McAlpine et al. (2005) "High-Performance Nanowire Electronics and Photonics and Nanoscale Patterning on Flexible Plastic Substrates," *Proc. IEEE* 93:1357-1363.
McCaldin et al. (1971) "Diffusivity and Solubility of Si in the Al Metallization of Integrated Circuits," *Appl. Phys. Lett*. 19:524-527.
Meisel et al. (2004) "Three-Dimensional Photonic Crystals by Holographic Lithography Using the Umbrella Configuration: Symmetries and Complete Photonic Band Gaps," *Phys. Rev. B*. 70:165101:1-10.
Meitl et al. (2004) "Solution Casting and Transfer Printing Single-Walled Carbon Nanotube Films," *Nano Lett*. 4(9):1643-1647.
Meitl et al. (2006) "Transfer Printing by Kinetic Control of Adhesion to an Elastomeric Stamp," *Nat. Mater*. 5:33-38.
Melosh et al. (2003) "Ultrahigh-Density Nanowire Lattices and Circuits," *Science* 300:112-115.
Menard et al. (2004) "A Printable Form of Silicon for High Performance Thin Film Transistors on Plastic Substrates," *Appl. Phys. Lett*. 84:5398-5400.
Menard et al. (2004) "High-Performance n- and p-Type Single-Crystal Organic Transistors with Free-Space Gate Dielectrics," *Adv. Mat*. 16:2097-2101.
Menard et al. (2004) "Improved Surface Chemistries, Thin Film Deposition Techniques, and Stamp Designs for Nanotransfer Printing," *Langmuir* 20:6871-6878.
Menard et al. (2005) Bendable Single Crystal Silicon Thin Film Transistors Formed by Printing on Plastic Substrates *Appl. Phys. Lett*. 86:093507.
Menard et al. (Web Release Apr. 11, 2007) "Micro- and Nanopatterning Techniques for Organic Electronic and Optoelectronic Systems," *Chem. Rev*. 107:1117-1160.
Michel et al. (2001) Printing Meets Lithography: Soft Approaches to High-Resolution Patterning, *IBM J. Res. Dev*. 45(5):697-719.
Milliron et al. (2004) "Colloidal Nanocrystal Heterostructures with Linear and Branched Topology," *Nature* 430:190-195.
Min, G. (Apr. 4, 2003) "Plastic Electronics and Their Packaging Technologies," *Syn. Metals*. 135:141-143.
Mirkin et al. (Jul. 2001) "Emerging Methods for Micro- and Nanofabrication," *MRS Bull*. 26(7):506-507.
Misewich et al. (May 2, 2003) "Electronically Induced Optical Emission from a Carbon Nanotube FET," *Science* 300:783-786.
Mishra et al. (2002) "AlGaN/GaN HEMTs-an Overview of Device Operation and Applications," *Proc. IEEE* 90:1022-1031.
Mitzi et al. (2004) "High-Mobility Ulltrathin Semiconducting Films Prepared by Spin Coating," *Nature* 428:299-303.
Moon et al. (2002) "Ink-Jet Printing of Binders for Ceramic Components," *J. Am. Ceram. Soc*. 85(4):755-762.
Moore et al. (Sep. 9, 2003) "Individually Suspended Single-Walled Carbon Nanotubes in Various Surfactants," *Nano Lett*. 3(10):1379-1382.
Mori et al. (1978) "A New Etching Solution System, $H_3PO_4$-$H_2O_2$-$H_2O$, for GaAs and Its Kinetics," *J. Electrochem. Soc*. 125:1510-1514.
Morkoc et al. (1995) "High-Luminosity Blue and Blue-Green Gallium Nitride Light-Emitting Diodes," *Science* 267:51-55.
Morkved et al. (1994) "Mesoscopic Self-Assembly of Gold Islands on Diblock-Copolymer Films," *Appl. Phys. Lett*. 64:422-424.
Morra et al. (1990) "On the Aging of Oxygen Plasma-Treated Polydimethylsiloxane Surfaces," *J. Colloid Interface Sci*. 137:11-24.
Murakami et al. (May 4, 2005) "Polarization Dependence of the Optical Absorption of Single-Walled Carbon Nanotubes," *Phys. Rev. Lett*., 94, 087402.
Namazu et al. (2000) "Evaluation of Size Effect on Mechanical Properties of Single Crystal Silicon by Nanoscale Bending Test Using AFM," *J. MEMS* 9:450-459.
Nath et al. (2002) "Nanotubes of the Disulfides of Groups 4 and 5 Metals," *Pure Appl. Chem*. 74(9):1545-1552.
Nathan et al. (2002) "Amorphous Silicon Technology for Large Area Digital X-Ray and Optical Imaging," *Microelectronics Reliability* 42:735-746.
Newman et al. (2004) "Introduction to Organic Thin Film Transistors and Design of n-Channel Organic Semiconductors," *Chem. Mater*. 16:4436-4451.
Nirmal et al. (1999) "Luminescence Photophysics in Semiconductor Nanocrystals," *Acc. Chem. Res*. 32:407-414.
Noda et al. (1996) "New Realization Method for Three-Dimensional Photonic Crystal in Optical Wavelength Region," *Jpn. J. Appl. Phys*. 35:L909-L912.
Nomura et al. (2004) "Room-Temperature Fabrication of Transparent Flexible Thin-Film Transistors Using Oxide Semiconductors," *Nature* 432:488-492.
Novak et al. (Jun. 24, 2004) "Macroelectronic Applications of Carbon Nanotube Networks," *Solid State Electron*. 48:1753-1756.
Novak et al. (Nov. 10, 2003) "Nerve Agent Detection Using Networks of Single-Walled Carbon Nanotubes," *Appl. Phys. Lett*. 83(19):4026-4028.
O'Connell et al. (Jul. 26, 2002) "Bang Gap Fluorescence from Individual Single-Walled Carbon Nanotubes," *Science* 297:593-596.
O'Riordan et al. (2004) "Field Configured Assembly: Programmed Manipulation and Self-Assembly at the Mesoscale," *Nano Lett*. 4:761-765.
Odom et al. (2002) "Improved Pattern Transfer in Soft Lithography Using Composite Stamps," *Langmuir* 18:5314-5320.
Office Action, Corresponding to U.S. Appl. No. 11/145,542, Mailed Apr. 5, 2007.
Ong et al. (2004) "High-Performance Semiconducting Poolythiophenes for Organic Thin-Film Transistors," *J. Am. Chem. Soc*. 126:3378-3379.
Ong et al. (2005) "Design of High-Performance Regioregular Polythiophenes for Organic Thin-Film Transistors," *Proc. IEEE* 93:1412-1419.
Origin Energy (May 2004) "Fact Sheet—Sliver Cells," www.originenergy.com.au/sliver.
Ouyang et al. (2002) "High-Performance, Flexible Polymer Light-Emitting Diodes Fabricated by a Continuous Polymer Coating Process," *Adv. Mat*. 14:915-918.
Pan et al. (2001) "Nanobelts of Semiconducting Oxides," *Science* 291:1947-1949.
Panev et al. (2003) "Sharp Exciton Emission from Single InAs Quantum Dots in GaAs Nanowires," *Appl. Phys. Lett*. 83:2238-2240.
Pardo et al. (2000) "Application of Screen Printing in the Fabrication of Organic Light-Emitting Devices," *Adv. Mater*. 12(17):1249-1252.
Park et al. (1997) "Block Copolymer Lithography: Periodic Arrays of ~$10^{11}$ Holes in 1 Square Centimeter," *Science* 276:1401-1404.
Park et al. (1998) "Fabrication of Three-Dimensional Macroporous Membranes with Assemblies of Microspheres as Templates," *Chem. Mater*. 10:1745-1747.
Pearton et al. (1999) "GaN: Processing, Defects, and Devices," *J. Appl. Phys*. 86:1-78.
Philofsk. E. Intermetallic Formation in Gold-Aluminum Systems. Solid-State Electron. 13, 1391-& (1970.
Pimparkar et al. (Feb. 2007) "Current-Voltage Characteristics of Ling-Channel Nanobundle Thin-Film Transistors: A 'Bottom-Up' Perspective," *IEEE Electron. Dev. Lett*. 28(2):157-160.

(56) References Cited

OTHER PUBLICATIONS

Pimparkar et al. (Jul. 2007) "Limits of Performance Gain of Aligned CNT Over Randomized Network: Theoretical Predictions and Experimental Validation," *Electron Dev. Lett*. 28(7):593-595.
Pimparkar et al. (Apr. 2007) Performance Assessment of Sub-percolating Nanobundle Network Thin-Film Transistors by an Analytical Model. *IEEE T. Electron Dev*. 54(4):637-644.
Pimparkar et al. (2005) Performance Assessment of Sub-Percolating Nanobundle Network Transistors by an Analytical Model. *IEDM Tech.Digest* 21:541-544.
Pimparkar et al. (2009) "Theory and Practice of 'Stripping' for Improved ON/OFF Ratio in Carbon Nanonet Thin Film Transistors," *Nano Res*.2:167-175.
Podzorov et al. (2005) "Hall Effect in the Accumulation Layers on the Surface of Orgaic Semiconductors," *Phys. Rev. lett*. 95:226601.
Preisler et al. (2005) "Ultrathin Epitaxial Germanium on Crystalline Oxide Metal-Oxide-Semiconductor-Field-Effect Transistors," *Appl. Phys Lett*. 86:223504.
Pushpa et al. (2002) "Stars and Stripes. Nanoscale Misfit Dislocation Patterns on Surfaces," *Pure Appl. Chem*. 74(9):1663-1671.
Quake et al (2000) "From Micro- to Nanofabrication with Soft Materials," *Science* 290:1536-1540.
Radosavljevic et al. (Sep. 22, 2003) "Drain Voltage Scaling in Carbon Nanotube Transistors," *Appl. Phys. Lett*. 83(12):2435-2437.
Raman et al. (1989) "Study of Mesa Undercuts Produced in GaAs with $H_3PO_4$-Based Etchants," *J. Electrochem. Soc*. 136:2405-2410.
Rao et al. (Sep. 4, 2003) "Large-scale assembly of carbon nanotubes," *Nature*, 425:36-37.
Razeghi et al. (1994) "High-Power Laser Diodes Based on InGaAsP Alloys," *Nature* 369:631-633.
Reuss et al. (2005) "Macroelectronics: Perspectives on Technology and Applications," *Proc. IEEE* 93:1239-1256.
Ribas et al. (1998) "Bulk Micromachining Characterization of 0.2 μm HEMT MMIC Technology for GaAs MEMS Design," *Mater. Sci. Eng. B* 51:267-273.
Ridley et al. (1999) "All-Inorganic Field Effect Transistors Fabricated by Printing," *Science* 286:746-749.
Rinzler et al. (1998) "Large-Scale Purification of Single-Wall Carbon Nanotubes: Process, Product, and Characterization," *Appl. Phys. A* 67:29-37.
Roberts et al. (1979) "Looking at Rubber Adhesion," *Rubber Chem. Technol*. 52:23-42.
Robinson et al. (1983) "GaAs Readied for High-Speed Microcircuits," *Science* 219:275-277.
Rogers et al. (1997) "Using an Elastomeric Phase Mask for Sub-100 nm Photolithography in the Optical Near Field," *Appl. Phys. Lett*. 70:2658-2660.
Rogers et al. (1998) "Generating ~90 Nanometer Features Using Near Field Contact Mode Photolithography with an Elastomeric Phase Mask," *J. Vac. Sci. Technol*. 16(1):59-68.
Rogers et al. (1998) "Quantifying Distortions in Soft Lithography," *J. Vac. Sci. Technol*. 16:88-97.
Rogers et al. (1998) "Using Printing and Molding Techniques to Produce Distributed Feedback and Bragg Reflector Resonators for Plastic Lasers," *Appl. Phys. Lett*. 73:1766-1768.
Rogers et al. (1999) Printing Process Suitable for Reel-to-Reel Production of High-Performance Organic Transistors and Circuits, *Adv. Mater*. 11(9):741-745.
Rogers et al. (2000) "Organic Smart Pixels and Complementary Inverter Circuits Formed on Plastic Substrates by Casting and Rubber Stamping," *IEEE Electron Dev. Lett*. 21(3):100-103.
Rogers et al. (2001) "Paper-Like Electronic Displays: Large-Area Rubber-Stamped Plastic Sheets of Electronics and Microencapsulated Electrophoretic Inks," *Proc. Natl. Acad. Sci. USA* 98:4835-4840.
Rogers et al. (2002) "Printed Plastic Electronics and Paperlike Displays," *J. Polym. Sci. Part A. Polym. Chem*. 40:3327-3334.
Rogers, J.A. (2001) "Rubber Stamping for Plastic Electronics and Fiber Optics," *MRS Bulletin* 26(7):530-534.
Rogers, J.A. (2001) "Toward Paperlike Displays," *Science* 291:1502-1503.
Rosenblatt et al. (2002) "High Performance Electrolyte Gated Carbon Nanotube Transistors," *Nano Lett*. 2(8):869-872.
Rotkin et al. (2003) "Universal Description of Channel Conductivity for Nanotube and Nanowire Transistors," *Appl. Phys. Lett*. 83:1623-1625.
Roundy et al. (2003) "Photonic Crystal Structure with Square Symmetry within Each Layer and a Three-Dimensional Band Gap," *Appl. Phys Lett*. 82:3835-3837.
Samuelson et al. (2004) "Semiconductor Nanowires for Novel One-Dimensional Devices," *Physica E* 21:560-567.
Sangwal et al. (1997) "Nature of multilayer steps on the {100} cleavage planes of MgO single crystals," *Surf. Sci*., 383:78-87.
Sanyal et al. (2002) "Morphology of Nanostructures Materials," *Pure Appl. Chem*. 74(9):1553-1570.
Sazonov et al. (2005) "Low-Temperature Materials and Thin-Film Transistors for Flexible Electronics," *Proc. IEEE* 93:1420-1428.
Schellekens et al. (2003) *Materials Research Society Fall Meeting*, pp. M2.9.1.
Schlegel et al. (2002) "Structures of quartz (1010)- and (1011)-water interfaces determined by X-ray reflectivity and atomic force microscopy of natural growth surfaces," *Geochim. Cosmochim. Acta* 66(17):3037-3054.
Schmid et al. (2003) "Preparation of Metallic Films on Elastomeric Stamps and Their Application for Contact Processing and Contact Printing," *Adv. Funct. Mater*. 13:145-153.
Schnable et al. (1969) "Aluminum Metallization; Advantages and Limitations for Integrated Circuit Applications," *IEEE* 57:1570-1580.
Schon et al. (1995) "Ambipolar Pentacene Field-Effect Transistors and Inverters," *Science* 287:1022-1023.
Schrieber et al. (1998) "The Effectiveness of Silane Adhesion Promotors in the Performance of Polyurethane Adhesives," *J. Adhesion* 68:31-44.
Seager et al. (Aug. 15, 1974) "Percolation and Conductivity: A Computer Study," *Phys. Rev. B* 10(4):1421.
Search Report Corresponding to International PCT Application No. PCT/US05/19354 Mailed Apr. 18, 2007.
Search Report for Patent Application, Corresponding to Republic of China (Taiwan) Patent Application No. 094118507 dated Feb. 24, 2007.
Seidel et al. (Web Release Apr. 10, 2004) "High-Current Nanotube Transistors," *Nano Lett*., vol. 4, No. 5, pp. 831-834.
Sekitani et al. (2005) "Bending Experimant on Pentacene Field-Effect Transistors on Plastic Films," *Appl. Phys. Lett*. 86:073511.
Sekitani et al. (Dec. 2003) "Organic Field-Effect Transistors with Bending Radius Down to 1mm," *Materials Research Society (MRS) Meeting*, Boston, MA, Dec. 1-5, 93-98.
Sekitani et al. (Web Release Apr. 29, 2007) "A Large-Area Wireless Power-Transmission Sheet Using Printed Organic Transistors and Plastic MEMS Switches," *Nat. Mater*. 6:413-417.
Sen et al. (2002) "Nonequilibrium Processes for Generating Silicon Nanostructures in Single-Crystalline Silicon," *Pure Appl. Chem*. 74(9):1631-1641.
Servanti et al. (2005) "Functional Pixel Circuits for Elastic AMOLED displays," *Proc. IEEE* 93:1257-1264.
Sharp et al. (2003) "Holographic Photonic Crystals with Diamond Symmetry," *Phys. Rev. B* 68:205102/1-205102/6.
Sheraw et al. (2002) "Organic Thin-Film Transistor-Driven Polymer-Dispersed Liquid Crystal Displays on Flexible Polymeric Substrates," *Appl. Phys. Lett*. 80:1088-1090.
Shetty et al. (2005) "Formation and Characterization of Silicon Films on Flexible Polymer Substrates," *Mater. Lett*. 59:872-875.
Shim et al. (2006) "Insights on Charge Transfer Doping and Intrinsic Phonon Line Shape of Carbon Nanotubes by Simple Polymer Adsorption," *J. Am. Chem. Soc*. 128:7522-7530.
Shtein et al. (Oct. 15, 2004) "Direct Mask-Free Patterning of Molecular Organic Semiconductors Using Organic Vapor Jet Printing," *J. Appl. Phys*. 96(8):4500-4507.
Shtein et al. (Sep. 16, 2004) "Direct, Mask- and Solvent-Free Printing of Molecular Organic Semiconductors," *J. Adv. Mater*. 16(18):1615-1620.

(56) References Cited

OTHER PUBLICATIONS

Shull et al. (1998) "Axisymmetric Adhesion Tests of Soft Materials," *Macromol. Chem. Phys*. 199:489-511.
Sim et al. (1993) "An Analytical Back-Gate Bias Effect Model for Ultrathin SOI CMOS Devices," *IEEE Trans. Elec. Dev*. 40:755-765.
Singh et al. (Web Release Mar. 7, 2006) "Progress in Plastic Electronics Devices," *Ann. Rev. Mater. Res*. 36:199-230.
Sirringhaus et al. (2003) "Inkjet Printing of Functional Materials," *MRS Bull*. 28:802-806.
Sirringhaus et al. (Dec. 15, 2000) "High-Resolution Inkjet Printing of All-Polymer Transistor Circuits," *Science* 290:2123-2126.
Sirringhaus, H. (2005) "Device Physics of Solution-Processed Organic Field-Effect Transistors," *Adv. Mater*. 17:2411-2425.
Smay et al. (2002) "Colloidal Inks for Directed Assembly of 3-D Periodic Structures," *Langmuir* 18:5429-5437.
Smith et al. (2000) "Electric-Field Assisted Assembly and Alignment of Metallic Nanowires," *Appl. Phys. Lett*. 77(9):1399-1401.
Snow et al. (Mar. 31, 2003) "Random networks of carbon nanotubes as an electronic material," *Appl. Phys. Lett*. 82(13):2145-2147.
Snow et al. (2005) "High-mobility carbon-nanotube transistors on a polymeric substrate," *Appl. Phys. Lett*. 86:033105.
Someya et al. (2005) "Conformable, Flexible, Large-Area Networks of Pressure and Thermal Sensors with Organic Transistor Active Matrixes," *Proc. Nat. Acad. Sci. USA* 102:12321-12325.
Someya et al. (2005) "Integration of Organic FETs with Organic Photodiodes for a Large Area, Flexible, and Lightweight Sheet Image Scanners," *IEEE Trans. Electron Devices* 52:2502-2511.
Someya et al. (Jul. 6, 2004) "A Large-Area, Flexible Pressure Sensor Matrix With Organic Field-Effect Transistors for Artificial Skin Applications," *Proc. Nat. Acad. Sci. USA* 101(27):9966-9970.
Son et al. (Jul. 2005) "Formation of Pb/63Sn Solder Bumps Using a Solder Droplet Jetting Method," *IEEE Trans. Electron. Package Manufac*. 28(3):274-281.
Stafford et al. (2004) "A Buckling-Based Metrology for Measuring the Elastic Moduli of Polymeris Thin Films," *Nature Mater*. 3:545-550.
Star et al. (Web Release Jun. 16, 2004) "Nanotube Optoelectric Memory Devices," *Nano Lett*. 4(9):1587-1591.
Strano et al. (Mar. 12, 2004) "Understanding the Nature of the DNA-Assisted Separation of Single-Walled Carbon Nanotubes Using Fluorescence and Raman Spectroscopy," *Nano Lett*. 4(4):543-550.
Su et al. (2000) "Lattice-Oriented Growth of Single-Walled Carbon Nanotubes," *J. Phys. Chem. B*. 104(28):6505-6508.
Su et al. (May 26, 2000) "A Scalable CVD Method for the Synthesis of Single-Walled Carbon Nanotubes with High Catalyst Productivity," *Chem. Phys. Lett*. 322(5):321-326.
Sun et al. (2004) "Fabricating Semiconductor Nano/Microwires and Transfer Printing Ordered Arrays of them onto Plastic Substrates," *Nano Lett*. 4:1953-1959.
Sun et al. (2005) "Advances in Organic Field-Effect Transistors," *J. Mater. Chem*. 15:53-65.
Sun et al. (2005) "Bendable GaAs Metal-Semiconductor Field-Effect Transistors Formed with a Printed GaAs Wire Arrays on Plastic Substrates," *Appl. Phys. Lett*. 87:083501.
Sun et al. (2005) "Photolithographic Route to the Fabrication of Micro/Nanowires of III-V Semiconductors," *Adv. Funct. Mater*. 15:30-40.
Sundar et al. (2004) "Elastomeric Transistor Stamps: Reversible Probing of Charge Transport in Organic Crystals," *Science* 303:1644-1646.
Suo et al. (Feb. 22, 1999) "Mechanics of Rollable and Foldable Film-on-Foil Electronics," *Appl. Phys. Lett*. 74(8):11771179.
Sze et al. (1985) *Semiconductor Devices, Physics and Technology*, 2*nd* ed., Wiley, New York, pp. 190-192.
Sze, S. (1985) "Lithography and Etching," In; *Semiconductor Devices: Physics and Technology*, New York: Wiley, pp. 428-467.
Sze, S. (1988) "Ion Implantation," In; *VLSI Technology*, Mcgraw-Hill, 327-374, 566-611.
Sze, S. (1994) "Semiconductor Sensor Technologies," In; *Semiconductor Sensors*, John Wiley and Sons: New York pp. 17-95.
Szleifer et al. (Web Release Jun. 22, 2005) "Polymers and Carbon Nanotubes—Dimensionality, Interactions and Nanotechnology," *Polymer* 46:7803-7808.
Takenobu et al. (2003) "Hydrogen Storage in $C_{70}$ Encapsulated Single-Walled Carbon Nanotube," *Synthetic Mater.*135-136:787-788.
Tanase et al. (2002) "Magnetic Trapping and Self-Assembly of Multicomponent Nanowires," *J. Appl. Phys*. 91:8549-8551.
Tang et al. (2005) "One-Dimensional Assemblies of Nanoparticles: Preparation, Properties, and Promise," *Adv. Mater*. 17:951-962.
Tao et al. (2003) "Langmuir-Blodgett Silver Nanowire Monolayers for Molecular Sensing Using Surface-Enhanced Raman Spectroscopy," *Nano Lett*. 3:1229-1233.
Tate et al. (2000) "Anodization and Microcontact Printing on Electroless Silver: Solution-Based Fabrication Procedures for Low-Voltage Electronic Systems with Organic Active Components," *Langmuir* 16:6054-6060.
Theiss et al. (1998) "PolySilicon Thin Film Transistors Fabricated at 100°C on a Flexible Plastic Substrate," *IEDM* 98:257-260.
Thess et al. (Jul. 26, 1996) "Crystalline Ropes of Metallic Carbon Nanotubes," *Science* 273:483-487.
Toader et al. (Jan. 30, 2004) "Photonic Band Gap Architectures for Holographic Lithography," *Phy. Rev. Lett*. 92(4):043905/1-043905/4.
Toader et al. (Jun. 13, 2003) "Photonic Band Gaps Based on Tetragonal Lattices of Slanted Pores," *Phys. Rev. Lett*. 90(23):233901/1-233901/4.
Tong (1999) "Stresses in Bonded Wafers," In; *Semiconductor Wafer Bonding:Science and Technology*, John Wiley; New York, pp. 187-221.
Trau et al. (1997) "Microscopic Patterning of Orientated Mesoscopic Silica Through Guided Growth," *Nature* 390:674-676.
Trentler et al. (1995) "Solution-Liquid-Solid Growth of Crytalline III-V Semiconductors: An Analogy to Vapor-Liquid-Solid Growth," *Science* 270:1791-1794.
Ucjikoga, S. (2002) "Low-Temperature Polycrystalline Silicon Thin-Film Transistor Technologies for System-on-Glass Displays," *MRS Bull*. 27:881-.
Velev et al. (1997) "Porous silica via colloidal crystallization," *Nature* 389:447-448.
Vilan et al. (2000) "Molecular Control Over Au/GaAs Diodes," *Nature* 404:166-168.
Vissenberg et al. (May 15, 1998) "Theory of the Field-Effect Mobility in Amorphous Organic Transistors," *Phys. Rev. B* 57(20):12964-12967.
Vlasov et al. (2001) "On-Chip Natural Assembly of Silicon Photonic Bandgap Crystals," *Nature* 414:289-293.
Voss, D. (2000) "Cheap and Cheerful Circuits," *Nature* 407:442-444.
Wagner et al. (2003) "Silicon for Thin-Film Transistors," *Thin Solid Films* 430:15-19.
Wagner et al. (2005) "Electronic Skin: Architecture and Components," *Physica E* 25:326-334.
Wang et al. (2003) "A Solution-Phase, Precursor Route to Polycrystalline $SnO_2$ Nanowires That Can Be Used for Gas Sensing under Ambient Conditions," *J. Am. Chem. Soc*. 125:16176-16177.
Wang et al. (2005) "Electronically Selective Chemical Functionalization of Carbon Nanotubes: Correlation between Raman Spectral and Electrical Responses," *J. Am. Chem. Soc.*, 127:11460-11468.
Weber et al. (Jan. 2004) "A Novel Low-Cost, High Efficiency Micromachined Silicon Solar Cell," *IEEE Electron Device Lett*. 25(1):37-39.
Whang et al. (2003) "Large-Scale Hierarchical Organization of Nanowire Arrays for Integrated Nanosystems," *Nano Lett*. 3(9):1255-1259.
Willner et al. (2002) "Functional Nanoparticle Architectures for Sensoric, Optoelectronic, and Bioelectronic Applications," *Pure Appl. Chem*. 74(9):1773-1783.
Wind et al. (May 20, 2002) "Vertical Scaling of Carbon Nanotube-Field-Effect Transitors Using Top Gate Electrodes," *Appl. Phys. Lett*. 80(20):3871-3819.

(56) References Cited

OTHER PUBLICATIONS

Won et al. (2004) "Effect of Mechanical and Electrical Stresses on the Performance of an a-Si:H TFT on Plastic Substrate," *J. Electrochem. Soc.* 151:G167-G170.
Wu et al. (2001) "Amorphous Silicon Crystallization and Polysilicon Thin Film Transistors on SiO2 Passivated Steel Foil Substrates," *Apple. Surf. Sci* 175-176:753-758.
Wu et al. (2001) "Thermal Oxide of Polycrystalline Silicon on Steel Foil as a Thin-Film Transistor Gate Dielectric," *Appl. Phys. Lett.* 78:3729-2731.
Wu et al. (2002) "Growth of Au-Catalyzed Ordered GaAs Nanowire Arrays by Molecular-Beam Epitaxy," *Appl. Phys. Lett.* 81:5177-5179.
Wu et al. (2003) "Growth, Branching, and Kinking of Molecular-Beam Epitaxial (110) GaAs Nanowires," *Appl. Phys. Lett.* 83:3368-3370.
Xia (1998) "Soft Lithography" *Angew. Chem. Int. Ed.* 37:551-575.
Xia et al. (1998) "Soft Lithography," *Annu. Rev. Mater. Sci.* 28:153-184.
Xia et al. (1999) "Unconventional Methods for Fabricating and Patterning Nanostructures," *Chem. Rev.* 99:1823-1848.
Xia et al. (2003) "One-Dimensional Nanostructures: Synthesis, Characterization and Applications," *Adv. Mater.* 15:353-389.
Xiao et al. (Jul. 7, 2003) "High-mobility thin-film transistors based on aligned carbon nanotubes," *Appl. Phys. Lett.*83(1):150-152.
Yang et al. (1997) "Mesoporous Silica with Micrometer-Scale Designs," *Adv. Mater.* 9:811-814.
Yang et al. (2000) "Stability of Low-Temperature Amorphous Silicon Thin Film Transistors Formed on Glass and Transparent Plastic Substrates," *J. Vac. Sci. Technol. B* 18:683-689.
Yang et al. (2002) "Creating Periodic Three-Dimensional Structures by Multibeam Interface of Visible Laser," *Chem. Mater.* 14:2831-2833.
Yang, P. (2005) "The Chemistry and Physics of Semiconductor Nanowires," *MRS Bull.* 30:85-.
Yanina et al. (2002) "Terraces and ledges on (001) spinel surfaces," *Surf. Sci.*, 513:L402-L412.
Yao et al. (Mar. 2000) "High-Field Effect Electrical Transport in Single-Walled Carbon Nanotubes," *Phys. Rev. Lett.* 84(13):2941-2944.
Yeh et al. (1994) "Fluidic Self-Assembly for the Integration of GaAs Light-Emitting Diodes on Si Substrates," *IEEE Photon. Technol. Lett.* 6:706-708.
Yin et al. (2000) "A Soft Lithography Approach to the Fabrication of Nanostructures of Single Crystalline Silicon with Well-Defined Dimensions and Shapes," *Adv. Mater.* 12:1426-1430.
Yin et al. (2005) "Colloidal Nanocrystal Synthesis and the Organic-Inorganic Interface," *Nature* 437:664-670.
Yoon et al. (2005) "Low-Voltage Organic Field-Effect Transistors and Inverters Enabled by Ultrathin Cross-Linked Polymers as Gate Dielectrics," *J. Am. Chem. Soc.* 127:10388-10395.
Yu et al. (2003) "Solution-Liquid-Solid Growth of Soluble GaAs Nanowires," *Adv. Mater.* 15:416-419.
Yu et al. (2003) "Two- Versus Three-Dimensional Quantum Confinement in Indium Phosphide Wires and Dots," *Nat. Mater.* 2:517-520.
Yurelki et al. (Jul. 24, 2004) "Small-Angle Neutron Scattering from Surfactant-Assisted Aqueous Dispersions of Carbon Nanotubes," *J. Am. Chem. Soc.* 126(32):9902-9903.
Zakhidov et al. (1998) "Carbon Structure with Three-Dimensional Periodicity at Optical Wavelengths," *Science* 282:897-901.
Zaumseil et al. (2003) "Nanoscale Organic Transistors that use Source/Drain Electrodes Supported by High Resolution Rubber Stamps," *Appl. Phys. Lett.* 82(5):793-795.
Zaumseil et al. (2003) "Three-Dimensional and Multilayer Nanostructures Formed by Nanotransfer Printing," *Nano Lett.* 3(9):1223-1227.
Zhang et al. (Jan. 5, 2001) "Electric-field-directed growth of aligned single-walled carbon nanotubes," *Appl. Phys. Lett.*, vol. 79, No. 19. pp. 3155-3157.
Zheng et al. (Web Release Mar. 4, 2002) "CVD Synthesis and Purification of Single-Walled Carbon Nanotubes on Aerogel-Supported Catalyst," *Appl. Phys. A* 74:345-348.
Zheng et al. (2004) "Shape-and Solder-Directed Self-Assembly to Package Semiconductor Device Segments," *Appl. Phys. Lett.* 85:3635-3637.
Zhou et al. (2002) "An Efficient Two-Photon-Generated Photoacid Applied to Positive-Tone 3D Microfabrication," *Science* 296:1106-1109.
Zhou et al. (2004) "p-Channel, n-Channel Thin Film Transistors and p-n Diodes Based on Single Wall Carbon Nanotube Networks," *Nano Lett.* 4:2031-2035.
Zhou et al. (2005) "Band Structure, Phonon Scattering, and the Performance Limit of Single-Walled Carbon Nanotube Transistors," *Phys. Rev. Lett.* 95:146805.
Zhou et al. (2006) "High-Contrast Organic Light-Emitting Devices with Improved Electrical Characteristics," *Appl. Phys. Lett.* 88:233505.
Zhou et al. (Feb. 2006) "Flexible Substrate Microcrystalline Silicon and Gated Amorphous Silicon Strain Sensors," *IEEE Tran. Electron Device* 53(2):380-385.
Zhu et al. (2005) "Spin on Dopants for High-Performance Single-Crystal Silicon Transistors on Flexible Plastic Substrates," *Appl. Phys. Lett.* 86:133507.

* cited by examiner

6A

6B

6C

6D

7A

7B

21A

21B

21C

21D

21E

22A

22B

22C

22D

25A

25B

25C

MEDIUM SCALE CARBON NANOTUBE THIN FILM INTEGRATED CIRCUITS ON FLEXIBLE PLASTIC SUBSTRATES

CROSS-REFERENCE TO RELATED APPLICATIONS

This application claims the benefit of priority to U.S. provisional Patent Applications 61/061,710 filed Jun. 16, 2008 and 61/074,254 filed Jun. 20, 2008, which are hereby incorporated by reference in their entirety.

STATEMENT REGARDING FEDERALLY SPONSORED RESEARCH OR DEVELOPMENT

This invention was made with government support awarded by the following agencies: National Science Foundation Grant NIRT-0403489 and U.S. Department of Energy Grant DE-FG02-07ER46471. The United States government has certain rights in the invention.

BACKGROUND OF INVENTION

Since their discovery in the early 1990s, a great deal has been learned about the composition and properties of carbon nanotube materials. This research has demonstrated that carbon nanotubes exhibit extraordinary mechanical, electronic and chemical properties, which has stimulated substantial interest in developing applied technologies exploiting these properties. Accordingly, substantial research is directed at developing techniques for organizing, arranging and incorporating carbon nanotube materials into useful functional devices.

Carbon nanotubes are allotropes of carbon comprising one or more cylindrically configured graphene sheets and are classified on the basis of structure as either single walled carbon nanotubes (SWNTs) or multiwalled carbon nanotubes (MWNTs). Typically having small diameters (≈1-30 nanometers) and large lengths (up to several microns), SWNTs and MWNTs commonly exhibit length to diameter ratios of $\approx 10^2$ to about $10^7$). Carbon nanotubes exhibit either metallic or semiconductor electrical behavior, and the energy band structure of nanotube materials varies considerably depending on their precise molecular structure and diameter. Doped nanotubes having intercalants, such as potassium, have been prepared and the central cavities of nanotubes have been filled with a variety of materials, including crystalline oxide particles, metals, gases and biological materials.

Single walled carbon nanotubes (SWNTs), in particular, are identified as candidates for functional materials in a new generation of high performance passive and active nanotube based electronic devices. SWNTs are made up of a single, contiguous graphene sheet joined with itself to form a hollow, seamless tube, in some cases with capped ends similar in structure to smaller fullerenes. SWNTs typically have very small diameters (≈1 nanometer) and are often present in curled, looped and bundled configurations. SWNTs are chemically versatile materials capable of functionalization of their exterior surfaces and encapsulation of materials within their hollow cores, such as gases or molten materials.

A number of unique properties of SWNTs make these materials particularly attractive for a variety of emerging applied technologies, including sensors, light emissive systems, flexible electronics and novel composite materials. First, SWNTs are believed to have remarkable mechanical properties, such as tensile strengths at least 50 times that of steel. Second, the electron transport behavior in SWNTs is predicted to be essentially that of a quantum wire, and the electrical properties of SWNTs have been observed to vary upon charge transfer doping and intercalation, opening up an avenue for potentially tuning the electrical properties of nanotube materials. Finally, SWNTs have also been demonstrated to have very high intrinsic field affect mobilities (e.g., about 10,000 $cm^2V^{-1}s^{-1}$) making them interesting for possible applications in nanoelectronics.

The astonishing electronic and mechanical properties of SWNTs, together with the ability to deposit nanotubes onto plastics and other unusual device substrates, make them well-suited for use in large-scale distributed electronics for steerable antenna arrays, flexible displays, and other systems. Recent work indicates that random networks of SWNTs can form effective semiconductor layers for thin-film transistor-(TFT-) type devices. Device geometries accessed using random networks of SWNTs are particularly promising for enabling low cost, high-performance devices and device arrays for the field of large area electronics. First, random SWNT networks can be effectively assembled at relatively low costs using a range of solution deposition-based fabrication techniques, including solution casting, ink jet printing and screen printing. Second, device geometries employing random SWNT networks for semiconductor channels in electronic devices are also compatible with low temperature assembly on a range of substrates, including flexible polymer substrates desirable for applications of flexible electronics.

Despite substantial progress in developing a SWNT-based electronic device platform using random SWNT networks, several factors impede commercialization of these systems. First, the device mobilities that have been achieved with these networks are far below the intrinsic tube mobilities inferred from measurements of transistors that incorporate an individual tube (or small number of tubes) spanning the gap between the source and drain electrodes. The resistance at the many tube-tube contacts that are inherent in the networks may limit charge transport. Second, films comprising random SWNT networks are typically a mixture of metallic tubes and semiconducting tubes. The presence of metallic tubes in the network often results in a significant extent of purely metallic conductive pathways between the source/drain (S/D) electrodes of SWNT-based thin-film transistor (TFT) devices. Such metallic conductive pathways decrease the device on/off ratio attainable and generally increase the static power consumption, thereby preventing their applications for important classes of electronics systems.

U.S. Pat. No. 7,226,818, issued on Jun. 5, 2007, discloses field-effect transistors based on random SWNT networks enriched in semiconducting nanotubes relative to metallic nanotubes. Enrichment of the semiconducting nanotube component is reported as providing enhanced on/off ratios for thin film transistors based on random SWNT networks. Techniques for enriching the semiconducting nanotube component described in this reference include solution fractionation techniques and selective chemical removal of metallic nanotubes. The authors also report that the channel length can be adjusted to assure that no individual tube spans its length, thus precluding a metallic tube from directly short-circuiting the thin film transistor.

U.S. Pat. No. 6,918,284, issued on Jul. 19, 2005, discloses electronic devices having a semiconductor component comprising an interconnected network or array of carbon nanotubes. The authors exemplify very dilute networks such that at least 75% or substantially all the carbon nanotubes are at least partially in contact with the substrate. The authors report that applying a large source-drain bias while gating off any semiconductive nanotubes can be used to selectively burn metallic nanotubes.

The reference "p-Chanel, n-Channel Thin Film Transistors and p-n Diodes Based on Single Wall Carbon Nanotube Networks", Nanoletters, Vol. 4, No. 10 (2004) 2031-2035, by Zhou et al., discloses single wall carbon nanotube networks providing semiconductor channels for thin film transistors. The disclosed device geometry is designed to electrically isolate adjacent devices, and the strip widths are wider than the channel lengths.

It will be appreciated from the foregoing that there is currently a need in the art for improved device geometries, components, and fabrication methods to enable passive and active carbon nanotube electronic devices based on random SWNT networks.

SUMMARY OF THE INVENTION

The present invention provides device component geometries and fabrication strategies for enhancing the electronic performance of electronic devices based on thin films of randomly oriented or partially aligned semiconducting nanotubes. In certain aspects, devices and methods of the present invention incorporate a patterned layer of randomly oriented or partially aligned carbon nanotubes, such as one or more interconnected SWNT networks, providing a semiconductor channel exhibiting improved electronic properties relative to conventional nanotube-based electronic systems.

Embodiments of this aspect include, for example, electronic devices and device components comprising a patterned layer of randomly oriented or partially aligned carbon nanotubes having void regions, such as etched regions, channels and/or cavities in the nanotube layer, that reduce the number and extent of purely metallic conductive pathways between electrodes of an electronic device. Methods and devices of certain aspects reduce the number and extent of purely metallic conductive pathways in one or more interconnected carbon nanotube networks so as to access nanotube-based transistors exhibiting improved on/off ratios and decreased static power consumption. In specific embodiments, void regions are patterned into a monolayer or sub-monolayer film of randomly oriented or partially aligned nanotubes, for example by photolithography and etching methods, that define a plurality of physically isolated or interconnected strips comprising interconnected carbon nanotube networks (e.g., bands of interconnected nanotube networks). In some embodiments, strips are provided, for example, comprising discrete bands of interconnected carbon nanotube networks that extend lengths from the first electrode to the second electrode. Optionally, each of the bands extend an average width in a dimension orthogonal to the average length, wherein the average width of the band is less than the length of the strip, for example, 10 times less or preferably for some embodiments 50 times less or preferably for some embodiments 100 times less. As semiconducting SWNTs are more abundant than metallic SWNTs in the nanotube layer, the formation of strips by patterning voids in the interconnection carbon nanotube network effectively limits the extent and number of purely metallic conductive pathways between the source and drain electrodes of the transistor. Accordingly, the patterned nanotube layer device geometries of the present invention provide an effective means of increasing device on/off ratios by at least an order of magnitude (and in some embodiments up to 4 orders of magnitude) while only slightly impacting the overall effective device mobility of these systems.

The present fabrication methods and device geometries are versatile, thereby providing a platform enabling a new class of nanotube-based electronic devices and systems well suited for a range of device applications, including thin film electronics, large area electronics (e.g., macroelectronics), flexible electronics, and sensing. Methods and devices of the present invention are compatible with low temperature, solution-based processing and assembly on a wide range of device substrates, including mechanically flexible substrates such as polymer substrates. Processing methods and design strategies of the present invention are complementary to conventional microfabrication and nanofabrication platforms, and can be effectively integrated into existing photolithographic, etching and thin film deposition patterning strategies, systems and infrastructure. In specific embodiments, methods and device geometries of the present invention enable low cost fabrication of high performance nanotube based semiconductor devices, such as thin film transistors, transistor arrays, and integrated electronic circuits.

In an aspect, the present invention provides electronic devices and components thereof having a semiconductor channel comprising a layer of randomly oriented or partially aligned carbon nanotubes that is patterned so as to provide a reduction in the number of purely metallic conductive pathways through the nanotube layer. In a specific embodiment, for example, an electronic device of the present invention comprises: a first electrode; a second electrode; and a patterned layer of randomly oriented or partially aligned carbon nanotubes provided in one or more interconnected carbon nanotube networks positioned between and in electrical contact with the first electrode and the second electrode. In an embodiment, the patterned layer has a thickness less than or equal to 10 nanometers and has one or more void regions without carbon nanotubes. In some embodiments, for example, void region(s) are provided in the patterned layer so as to reduce by at least 20% the number of purely metallic conductive pathways between the first electrode and the second electrode in the one or more interconnected carbon nanotube networks. As used herein, interconnected carbon nanotube network refers to a network of carbon nanotubes having at least one nanotube crossing. As used herein, interconnected nanotube networks of the present invention include networks wherein only, a portion and not all, of the nanotubes are interconnected.

In the context of this description, the reduction of purely metallic conductive pathways between first and second electrodes is defined relative to a corresponding interconnected nanotube network layer not having void regions (e.g., a corresponding layer having the same or similar, physical dimensions (e.g., length, width and thickness), nanotube composition, nanotube surface concentration, nanotube size distribution, electrical connection to the electrodes, etc.). In an embodiment, the patterned layer has a plurality of void regions, optionally provided in a preselected pattern. In an embodiment, the electronic device further comprises a substrate, such as a mechanically flexible substrate, provided to support the first electrode, second electrode and patterned layer. In the context of this description, the substrate can support these device elements directly or via one or more intermediate structures, such as thin film layers, device components or other structures. In an embodiment, the patterned nanotube layer provides a semiconductor channel between the first and second electrodes, wherein the semiconductor channel has a length selected over the range of 50 nanometers and 1000 microns, preferably for some applications 100 nanometers to 100 microns, preferably for some applications 1 micron to 10 microns.

The presence of void regions in patterned nanotube layers of the present device provides a means of effectively controlling, limiting, and/or reducing the number and extent of purely metallic conductive pathways through the patterned nanotube layer. In the context of this description, the term "void region" refers to a region of the patterned layer that does not have carbon nanotubes present. Void regions useful in the present systems and components thereof include cavities, grooves, openings, channels and/or holes provided in the layer of randomly oriented or partially aligned carbon nanotubes. Void regions in some embodiments electrically isolate discrete regions of the interconnected nanotube network of the patterned layer. For example, void regions in some embodiments, electrically isolated strips of interconnected nanotube network of the patterned layer. In an embodiment, void regions of the patterned layer are regions wherein carbon nanotubes have been selectively removed via etching, such as oxygen plasma etching, or other material removal techniques such as laser ablation patterning. For example, the present invention includes embodiments wherein the void regions comprise a pattern etched into the patterned layer, such as an etch pattern comprising one or more lines, channels, parallel lines, serpentine lines, dashed lines, diagonal lines, or dots. Optionally, void regions of the present patterned layer may be filled with one or more insulating and/or semiconducting material. In an embodiment, for example, void regions in the patterned layer are filed with a polymer and/or dielectric layer or thin film. In an embodiment, the invention provides a semiconductor device having a patterned layer comprising the semiconductor channel in the device, wherein the patterned layer has 2 to 1000 void regions, preferably for some applications 5 to 500 void regions and preferably for some applications 10 to 100 void regions.

In electronic devices of the present invention, the presence of void regions in the patterned nanotube layer provides semiconductor channels between first and second electrodes having less purely metallic conductive pathways relative to a corresponding nanotube layer not patterned with the void regions (e.g., a corresponding layer having the same or similar, physical dimensions such as length, width and thickness). In some embodiments, the reduction in purely metallic conductive pathways provides transistors having high on/off ratios and low static power consumption. The physical dimensions, positions and/or pattern of the void regions in the patterned layer determine, at least in part, the extent to which the number of purely metallic conductive pathways is reduced in semiconductor channels of the present invention. In some embodiments, for example, the position, physical dimensions and/or pattern of void regions in the patterned layer is selected so that the number of purely metallic conductive pathways between electrodes through the carbon nanotube layer is reduced by more than 20%, 25%, 30%, 35%, 40,%, 45%, 50%, 55%, 60%, 65%, 70%, 75%, 80%, 85%, 95%, 97%, 99% or 99% relative to a corresponding layer not having the void regions of the patterned layer.

Void regions in the patterned layer of the present invention can have a range of physical dimensions. Useful physical dimensions in some embodiments are such that the void regions disrupt one or more metallic conductive pathway in the nanotube layer. In some embodiments, void regions of the patterned layer extend the entire thickness of the patterned layer, or substantially the entire thickness (e.g., within 10%) of the patterned layer. Use of void regions extending the entire thickness of the patterned layer is useful for some applications to electrically isolate discrete regions of interconnected nanotube networks, such as electrically isolated strips of interconnected carbon nanotubes. In some embodiments, the thickness (e.g., depth into the patterned layer) of the void region is selected from the range of 2 to 10 nanometers. In some embodiments, the lateral dimensions, such as length, width, radius, diameter etc., of the void regions is selected over the range of 50 nanometers to 1000 microns, preferably for some applications 100 nanometers to 10 microns, and preferably for some applications 1 micron to 10 microns. As used herein lateral dimensions are dimensions along axes orthogonal to the thickness dimension, such as length and width dimensions in a plane parallel to the substrate surface supporting the interconnected nanotube network) Void regions of the present invention may have a range of shapes, including void regions having a lateral cross sectional shape selected from the group consisting of rectangle, square, circle, and oval. Void regions are optionally provided in a preselected pattern in the patterned layer. A range of patterns for void regions are useful in the present invention. In an embodiment, void regions are provided in a pattern having a periodic spatial distribution. Alternatively, the present invention includes devices and device components having a patterned layer wherein void regions are provided in a pattern having an aperiodic spatial distribution. Patterns of void regions useful in the present invention include, but are not limited to, parallel lines, grids, and arrays of lines, dots and/or dashes.

In a specific embodiment, patterned layers of randomly oriented or partially aligned carbon nanotubes comprise a plurality of void regions that define one or more interconnected or physically isolated strips comprising interconnected carbon nanotube networks extending between the first and second electrode. Embodiments of the present invention having a patterned layer comprising a plurality of physically isolated strips, for example, enable nanotube-based transistors exhibiting enhanced on/off ratios relative to conventional transistors based on random networks of SWNTs. In an embodiment, for example, void regions comprise a plurality of cavities or channels in the patterned layer extending the entire distance from the first electrode to the second electrode, thereby defining a plurality of strips of interconnected carbon nanotube networks in the patterned layer. Accordingly, this configuration provides a plurality of strips positioned to directly connect the first and second electrodes. In an embodiment, for example, cavities in the patterned layer separate the strips such that the strips do not physically contact each other. Optionally, cavities may be provided having lateral dimensions, such as widths, large enough to prevent electron transport directly between adjacent strips of the patterned layer. In an embodiment, for example, adjacent strips of the patterned layer are separated from each other by an average distance selected over the range of 50 nanometers to 1000 microns, preferably for some applications 100 nanometers to 10 microns, preferably for some applications 100 nanometers to 1 micron.

Selection of the number, physical dimensions and pattern of strips in patterned nanotube layers of this aspect determines, at least in part, the overall conductance of the patterned layer, and in some embodiments the electronic properties (e.g., on/off ratios, field effect mobility, etc.) of transistors of the present invention. Patterned nanotube layers of this aspect of the present invention may comprise a plurality of strips providing useful properties for a desired electronic device application, such a semiconductor channel for a transistor exhibiting useful properties. In an embodiment, for example, the patterned layer has a plurality of void regions comprising cavities that define from 2 to 1000 strips of interconnected carbon nanotubes extending from first to second electrodes, in some embodiments 10-500 strips of interconnected carbon nanotubes extending from first to second electrodes, and in some embodiments 20 to 100 strips of interconnected carbon nanotubes extending from first to second electrodes. In some embodiments, each of the strips of the patterned layer has an average width and extends an average length from first to second electrodes at least 10 times greater than the average width, preferably for some applications a length at least 50 times greater than the average width, preferably for some applications a length at least 100 times greater than the average width and preferably for some applications a length at least 1000 times greater than the average width. Strips useful in this aspect of the present invention may have aspect ratios (aspect ratio=(average length)/(average width), wherein the length corresponds to the direction from first to second electrodes (e.g., from source electrode to drain electrode) selected over the range of 10 to 1000, and preferably for some applications aspect ratios selected over the range of 50 to 500, preferably for some applications aspect ratios selected over the range of 100 to 250 and preferably for some applications 20 to 100. Strips useful in this aspect of the present invention may have an average width selected over the range of 50 nanometers to 1000 microns (preferably for some embodiments 100 nanometers to 10 microns) and an average length from first to second electrode selected over the range of 500 nanometers to 10000 microns (preferably for some embodiments 100 nanometers to 10 microns) wherein the length corresponds to the direction from first to second electrodes. Strips useful in this aspect of the present invention may have a lateral cross sectional shape selected from the group consisting of rectangular, circular, oval, and trapezoidal. In some embodiments, strips of the patterned layer are provided in a parallel orientation, wherein each strip extends a length from first to second electrodes that is parallel to a central alignment axis. Alternatively, strips of the patterned layer are provided in a serpentine configuration extending from first to second electrodes. Alternatively, strips of the patterned layer are interconnected with each other. In an embodiment, the strips of interconnected carbon nanotubes of the patterned layer extend from first electrode to second electrode and have an area of 1 micron$^2$ to 100,000 micron$^2$, preferably for some embodiments 10 micron$^2$ to 10,000 micron$^2$, and preferably for some embodiments 100 micron$^2$ to 1,000 micron$^2$.

Carbon nanotubes of the present invention may be single walled carbon nanotubes, multiwalled carbon nanotubes or a mixture of both. Use of single walled nanotubes (SWNTs) is preferred for some applications given their particularly useful semiconducting properties. In an embodiment, the patterned layer is a monolayer or sub-monolayer of carbon nanotubes. In an embodiment, the carbon nanotubes of the patterned layer have an average length selected over the range of 20 nanometers to 100 microns, preferably for some applications selected over the range of 100 nanometers to 10 microns. In an embodiment, the carbon nanotubes of the patterned layer have a surface concentration selected over the range of 0.2 carbon nanotubes micron$^{-2}$ to 100 carbon nanotubes micron$^{-2}$, preferably for some embodiments 0.5 carbon nanotubes micron$^{-2}$ to 20 carbon nanotubes micron$^{-2}$, preferably for some embodiments 1 carbon nanotubes micron$^{-2}$ to 10 carbon nanotubes micron$^{-2}$. As used herein, the terms "nanotube surface concentration" and "nanotube density" are used interchangeably and refer to the number of nanotubes per area of substrate having the nanotubes. In an embodiment, carbon nanotubes of the patterned layer are a mixture of semiconducting nanotubes and metallic nanotubes, wherein there are more semiconducting nanotubes than metallic nanotubes. Conventional sources of carbon nanotubes, such as SWNTs, typically generate mixtures having more semiconducting nanotubes than metallic nanotubes, for example mixtures having between 60-80% semiconducting nanotubes and 40-20% metallic nanotubes or mixtures having between 65-75% semiconducting nanotubes and 35-25% metallic nanotubes. In an embodiment, carbon nanotubes of the patterned layer are a mixture of semiconducting nanotubes and metallic nanotubes, wherein there are more semiconducting nanotubes than metallic nanotubes, for example a mixture wherein there are at least 1.5 times more semiconducting nanotubes than metallic nanotubes, and in some embodiments wherein there are 1.5-4 times more semiconducting nanotubes than metallic nanotubes. Carbon nanotubes of the patterned layer can be generated by a range of synthetic methods including, chemical vapor deposition, pyrolysis, arc discharge, catalytic methods and laser ablation methods. Patterned layers of carbon nanotubes of the present invention may further comprise additional components, such as dopants or components enhancing the mechanical properties of the nanotube layer. In an embodiment, for example, carbon nanotubes of the patterned layer are optionally provided in a polymeric matrix, such as a polymer encapsulation layer encapsulating the nanotubes of the patterned layer. Use of an encapsulation layer encapsulating the nanotubes of the patterned layer is beneficial in some embodiments for providing mechanical robust, flexible and/or deformable electronic devices.

Devices and device components of the present invention may be supported by a substrate. Useful substrates for supporting devices and device components of the present invention include but are not limited to mechanically flexible substrates such as polymer substrates, dielectric substrates, metal substrates, ceramic substrates, glass substrates, semiconductor substrates and functional substrates prepatterned with one or more device components. The present invention also includes devices and device components provided on (i.e. supported by) contoured substrates, including curved substrates, curved rigid substrates, concave substrates, and convex substrates.

In an embodiment, the present invention provides a transistor wherein the patterned nanotube layer provides a semiconductor channel between first and second electrodes comprising source and drain electrodes. Transistors of the present invention may further comprise a gate electrode and dielectric layer; wherein the dielectric layer is provided between the gate electrode and the patterned layer. In some embodiments, the gate electrode is electrically isolated from, and positioned close enough to, the semiconductor channel such that electron transport through the channel is modulated by application of an electric potential to the gate electrode. In some embodiments, the patterned layer has a strip geometry and comprises a plurality of strips of interconnected carbon nanotube networks, wherein strips of interconnected carbon nanotubes extend lengths from source to drain electrodes and are aligned in the electron transport direction of the transistor, optionally in a parallel strip orientation. In an embodiment, a transistor of this aspect is a thin film transistor. In an embodiment, a transistor of this aspect has an on/off ratio greater than or equal to 100, and preferably for some applications greater than or equal to 1000. In an embodiment, a transistor of this aspect has a field effect mobility greater than or equal to 0.1 cm$^2$ V$^{-1}$ s$^{-1}$, and preferably for some applications a field effect mobility greater than or equal to 10 cm$^2$ V$^{-1}$ s$^{-1}$. The invention provides nanotube-based transistor arrays and integrated circuits comprising a plurality of nanotube-based transistors.

In another aspect, the invention provides a method of making an electronic device comprising the steps of: (i) providing a first electrode; (ii) providing a second electrode; and (iii) providing a patterned layer of randomly oriented or partially aligned carbon nanotubes provided in one or more interconnected carbon nanotube networks positioned between and in electrical contact with the first electrode and the second electrode, the patterned layer having a thickness less than 10 nanometers and having one or more void regions in the patterned layer without carbon nanotubes; wherein the one or more void regions provided between the first and second electrodes reduces by at least 20% the number of purely metallic conductive pathways between the first electrode and the second electrode in the one or more interconnected carbon nanotube networks. In some embodiments, the void regions comprise a plurality of cavities or channels in the patterned layer that extend entirely from the first electrode to the second electrode, thereby defining a plurality of strips of interconnected carbon nanotube networks in the patterned layer. In some embodiments, the cavities in the patterned layer separate the strips such that they do not physically contact each other, and/or optionally each of the strips has an average width and extends an average length from first to second electrode at least 10 times greater than the average width and optionally 100 times greater than the average width.

In a specific method of this aspect, the step of providing a patterned layer of randomly oriented or partially aligned carbon nanotubes provided in one or more interconnected carbon nanotube networks positioned between and in electrical contact with the first electrode and the second electrode comprises the steps of: (i) providing a precursor layer of the randomly oriented carbon nanotubes in electrical contact with the first and second electrodes; and (ii) patterning the precursor layer so as to generate the patterned layer. In an embodiment, the step of providing the precursor layer in electrical contact with the first and second electrodes is selected from the group consisting of: (i) growing the carbon nanotubes on a device substrate, thereby generating the precursor layer; (ii) dispersing the carbon nanotubes in a solvent, thereby generating a carbon nanotube solution comprising a suspension of the carbon nanotubes, and depositing the carbon nanotube solution on to a device substrate, thereby generating the precursor layer; and (iii) contact printing the carbon nanotubes on to a device substrate, thereby generating the precursor layer. In an embodiment, contact printing of carbon nanotubes is achieved using soft lithography methods, such as dry transfer printing techniques using a conformable transfer device such as an elastomeric stamp.

In a specific method of this aspect, the step of patterning the precursor layer is carried out using one or more photolithography techniques. In an embodiment, for example, the step of patterning the precursor layer comprises the steps: (i) providing a layer of resist on the precursor layer; (ii) patterning the resist layer by selectively removing regions of the resist layer, thereby generating exposed regions of the precursor layer; and (iii) removing carbon nanotubes from the exposed regions of the precursor layer, thereby generating the patterned layer comprising the one or more strips extending between the first and second electrodes. Methods of this aspect may further comprise the step of removing the resist layer, for example by dissolution in an appropriate solvent. In an embodiment, the step of patterning the resist layer is carried out via photolithography, soft lithography, phase shift lithography, electron beam writing lithography or deep ultraviolet lithography. In an embodiment, the step of removing carbon nanotubes from the exposed regions of the precursor layer comprises etching the exposed regions of the precursor layer.

In a specific method of this aspect, the step of providing a patterned layer of randomly oriented carbon nanotubes in electrical contact with the first electrode and the second electrode comprises ink jet printing the carbon nanotubes, thermal transfer printing the carbon nanotubes, contact printing the carbon nanotubes, or screen printing the carbon nanotubes.

Electronic devices of the present invention include a range of nanotube-based devices. Electronic devices of the present invention include for example, transistors, diodes, light emitting diodes and photodetectors comprising one or more patterned layer of randomly oriented or partially aligned carbon nanotubes provided in the present interconnected carbon nanotube networks.

In another aspect, the present invention provides a transistor comprising: (i) a source electrode; (ii) a drain electrode; (iii) a gate electrode; (iv) a patterned layer of randomly oriented or partially aligned carbon nanotubes provided in one or more interconnected carbon nanotube networks positioned between and in electrical contact with the source electrode and the drain electrode, the patterned layer having a thickness less than 10 nanometers and having one or more void regions in the patterned layer without carbon nanotubes; wherein the one or more void regions provided between the first and second electrodes reduces by at least 20% the number of purely metallic conductive pathways between the source and drain electrodes in the one or more interconnected carbon nanotube networks; and (v) a dielectric layer positioned between the patterned layer and the gate electrode. In this embodiment, the patterned layer provides the semiconductor channel of the transistor. A transistor of this aspect comprises a thin film transistor wherein source electrode, gate electrode, drain electrode and dielectric layer transistor components are thin film structures. The present invention also provides arrays of transistors, including thin film transistor arrays, and integrated circuits.

In another aspect, the present invention provides a method for reducing the number of purely metallic conductive pathways in one or more interconnected carbon nanotube networks provided between a first electrode and second electrode comprising the step(s) of: providing a patterned layer of randomly oriented or partially aligned carbon nanotubes provided in one or more interconnected carbon nanotube networks positioned between and in electrical contact with the first electrode and the second electrode, the patterned layer having a thickness less than 10 nanometers and having one or more void regions in the patterned layer without carbon nanotubes; wherein the one or more void regions provided between the first and second electrodes reduces by at least 20% the number of purely metallic conductive pathways between the first and second electrodes in the one or more interconnected carbon nanotube networks.

Without wishing to be bound by any particular theory, there can be discussion herein of beliefs or understandings of underlying principles or mechanisms relating to the invention. It is recognized that regardless of the ultimate correctness of any explanation or hypothesis, an embodiment of the invention can nonetheless be operative and useful.

BRIEF DESCRIPTION OF THE DRAWINGS

FIG. 1.

FIG. 6 shows that an optimal $W_S$ can be identified for any given combination of $L_S$, $L_C$, and tube density to achieve an on/off ratio sufficiently high for real applications (e.g. on/off ratio>1,000) and maintain the highest possible $g_m$.

FIG. 8A provides a schematic vertical cross-sectional view of a SWNT PMOS inverter on a PI substrate (PI: Polyimide, PU: Polyurethane, PAA: Polyamic acid). FIG. 8B provides a SEM image of a part of the SWNT circuit, collected before deposition of the gate dielectric, gate or gate level interconnects. A magnified SEM image of the network strips (FIG. 8C) corresponding to a region of the device channel highlighted with the white box in FIG. 8B, and theoretical modeling results for the normalized current distribution (FIG. 8D) in the 'on' state of the device, where color indicates current density (yellow: high; red: medium; blue: low) are also shown. FIG. 8E provides a photograph of a collection of SWNT transistors and circuits on a thin sheet of plastic (PI).

FIG. 9A shows the measured (solid dots) and simulated (open dots) influence of the width of the strips on the on/off ratio ($I_{on}/I_{off}$) and normalized transconductance ($g_m/g_{m0}$; where $g_{m0}$ represents the response without strips), of transistors with channel lengths of 100 μm. Error bars represent s.d. of n=6 TFTs. FIG. 9B shows a plot of measured (solid lines) and simulated (dashed lines) $V_{GS}$–$I_{DS}$ characteristics of depletion-mode and enhancement-mode SWNT TFTs, whose channel widths are 200 μm and channel lengths are 100 μm. ($V_{DS}$: Drain-source voltage=−1 V, $I_{DS}$: Drain-source current, $V_{GS}$: Gate-source voltage). Inset: $V_{GS}$–$I_{DS}$ curve of the enhancement mode device plotted on a logarithmic scale with $V_{DS}$=−0.5 V (navy), −2 V (green), and −5 V (magenta) from bottom to up. FIG. 9C provides measured (solid lines) and simulated (dashed lines) $V_{DS}$–$I_{DS}$ characteristics of an enhancement-mode TFT ($V_{GS}$ changed from −2 V to 2 V in steps of 0.5 V.). FIG. 9D provides a plot of $g_m/g_{m0}$ of a TFT and normalized voltage gain ($G/G_0$, in both cases "0" represents the response in the unbent state) in an inverter as a function of bend radius. FIG. 9E provides measured ($V_{DS}$=−0.2 V, solid lines) and simulated (dashed lines) distribution of $I_{on}$ ($\bar{I}_{on}$: averaged on current). FIG. 9F provides a two dimensional histogram showing the correlation between $I_{on}/I_{off}$ (measured at $V_{DS}$=−0.2 V) and threshold voltage ($V_T$) distributions. Inset: Correlation between $I_{on}/I_{off}$ and normalized n branch transconductance ($g_{mn}/\bar{g}_{mn}$). The dashed line depicts a linear fitting result. The dashed area shows the distribution of $I_{on}/I_{off}$ predicted by percolation models that do not explicitly account for the influence of source/drain contacts.

FIG. 10B provides a plot of Vout and gain measurements. In FIGS. 10F and 10I, any specific combination of input-output signals is indicated as (logic address level inputs)logic address level outputs, and the timescales on the x axes are omitted because data collection involved the switching of voltage settings by hand. In FIGS. 10B, 10F and 10I, dashed lines represent circuit simulation results. Scale bars in FIGS. 10E and 10H are 100 mm.

FIG. 11A provides an optical image of a flexible SWNT IC chip bonded onto a curved surface. An optical micrograph (11B) and circuit diagram (11C) of a four-bit row decoder with sixteen outputs (0-15) are also provided. The bits are designated as most significant bit (MSB), second bit (SB), third bit (TB), and least significant bit (LSB). $V_{dd}$ applied was −5 V versus ground (GND). FIG. 11D provides characteristics of the four-bit decoder. In descending order, the first four traces are inputs, labeled LSB, TB, SB, and MSB on the right axis; the remaining traces, labeled 0-15, show the output voltages of the sixteen outputs. Inset: Measured (blue) and SPICE simulated (red dashed) dynamic response of one output line under square wave input pulse (black) at clock frequency of 1 kHZ.

FIG. 12A provides $I_{DS}$–$V_{GS}$ characteristics ($V_{DS}$: Drain-source voltage=−0.2 V) of devices with channel widths (W) of 200 μm and channel lengths ($L_C$), from top to bottom, of 10 μm, 25 μm, 50 μm, 75 μm, and 100 μm. ($I_{DS}$: Drain-source current, $V_{GS}$: Gate-source voltage). Inset: Width-normalized ON resistance ($R_{ON}W$) under different gate voltages as a function of channel length ($L_C$). The solid lines represent the linear least square fit of the data. FIG. 12B provides effective mobility ($\mu_{eff}$), extracted from both linear region and saturation region, and device on/off ratio ($I_{on}/I_{off}$, measured with $V_{DS}$=−0.2 V) as a function of channel length ($L_C$). FIG. 12C provides $I_{DS}^{1/2}$–$V_{GS}$ characteristics ($V_{DS}$=−2 V) of a device with W of 200 μm and $L_C$ of 100 μm. Dashed lines serves as a visual guide to extract threshold voltage ($V_T$).

DETAILED DESCRIPTION OF THE INVENTION

Figure 1A:
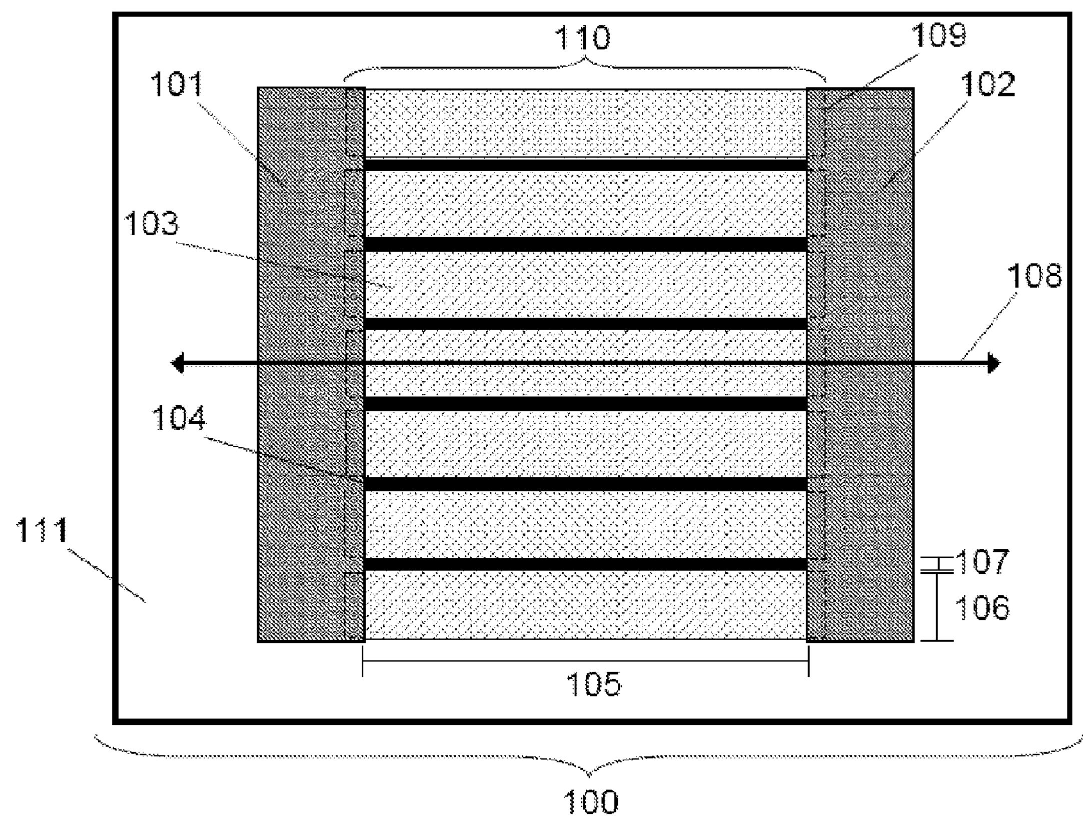
FIGS. 1A-1J provide schematic diagrams illustrating plan views of electronic devices of the present invention, and demonstrate useful configurations of patterned carbon nanotube layers comprising a semiconductor channel of an electronic device.
Figure 1B:
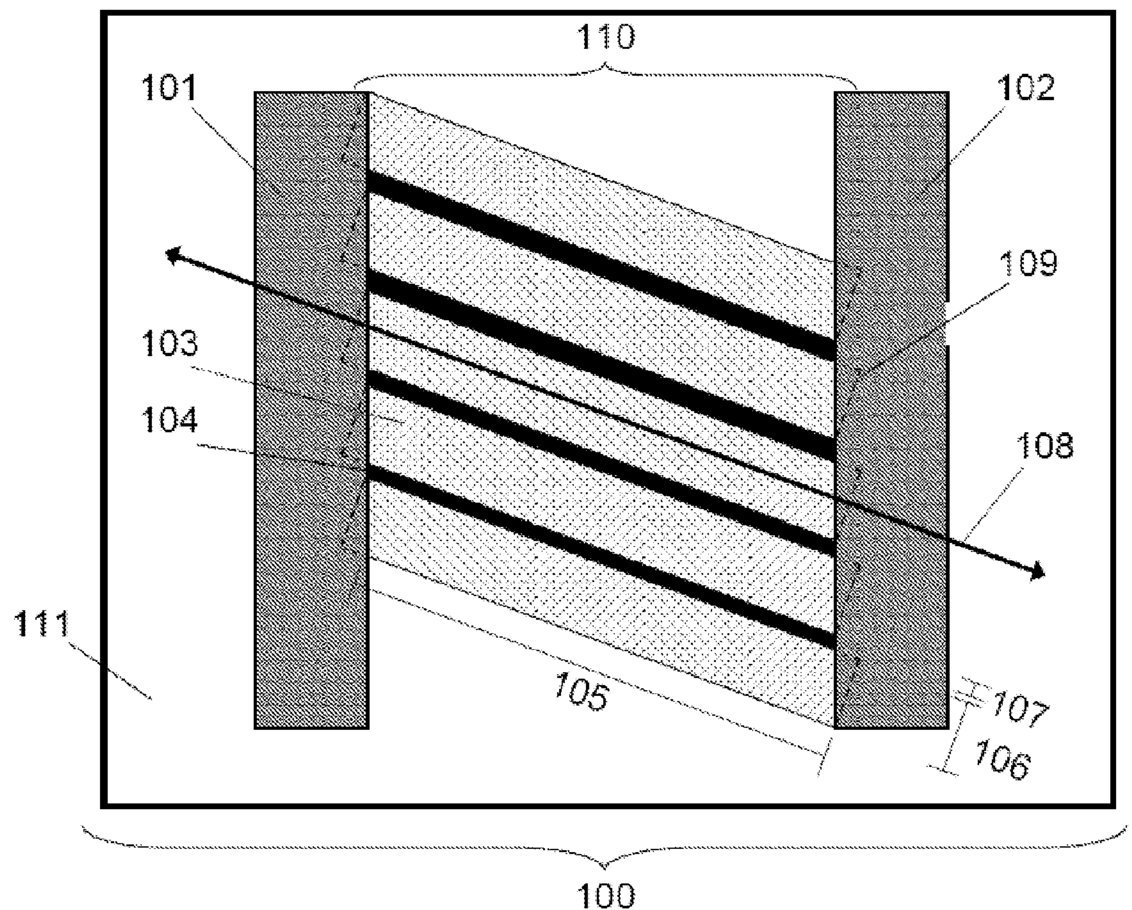
Figure 1C:
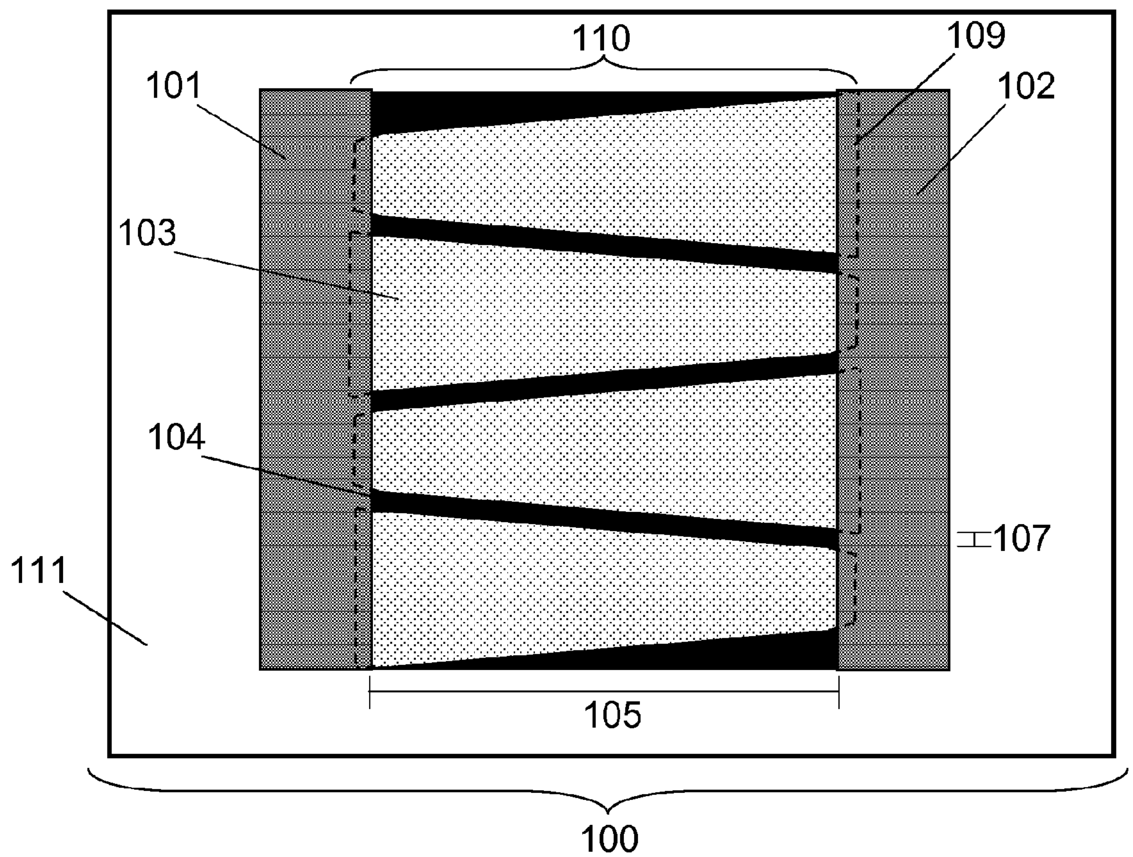
Figure 1D:
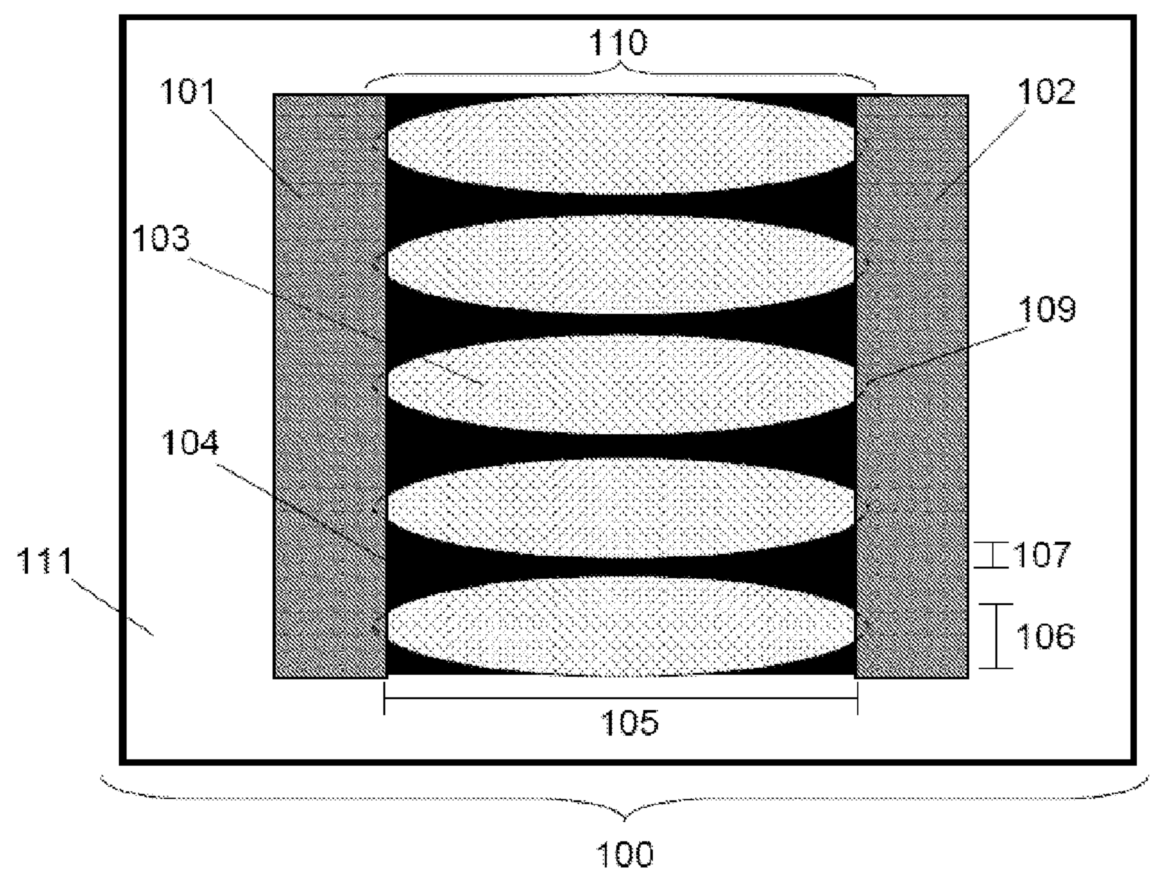

Referring to the drawings, like numerals indicate like elements and the same number appearing in more than one drawing refers to the same element. In addition, hereinafter, the following definitions apply:

"Carbon nanotube" and "nanotube" are used synonymously and refer to allotropes of carbon comprising one or more cylindrically configured graphene sheets. Carbon nanotubes include single walled carbon nanotubes (SWNTs) and multiwalled carbon nanotubes (MWNTs). Carbon nanotubes typically have small diameters (≈1-10 nanometers) and large lengths (up to several microns), and therefore may exhibit length to diameter ratios $\approx 10^2$ to about $10^7$. The longitudinal dimension of a nanotube is its length and the cross sectional dimension of a nanotube is its diameter (or radius). Carbon nanotubes include semiconducting carbon nanotubes, metallic carbon nanotubes and mixtures of both semiconducting carbon nanotubes and metallic carbon nanotubes. In some embodiments, the compositions and methods of the present invention include a mixture of semiconducting and metallic carbon nanotubes, for example, wherein the ratio of semiconducting nanotubes to metallic nanotubes varies over the range of 9-0.5. In some embodiments, the compositions and methods of the present invention include a mixture of semiconducting and metallic carbon nanotubes, for example, wherein the ratio of semiconducting nanotubes to metallic nanotubes is greater than or equal to 1, preferably for some application greater than or equal to 2. In some embodiments, the compositions and methods of the present invention include a mixture of semiconducting and metallic carbon nanotubes, for example, wherein the extent of semiconducting nanotubes is enriched, for example using fractionation or other purification techniques.

The compositions and methods of the invention include carbon nanotube networks comprising a plurality of randomly oriented and/or partially aligned carbon nanotubes, including interconnected nanotube networks having at least one carbon nanotube crossing. The present invention includes interconnected nanotube networks having a surface concentration of carbon nanotubes selected over the range of 0.2 carbon nanotubes $micron^{-2}$ to 500 carbon nanotubes micron$^{-}$ 2, preferably for some embodiments selected over the range of 0.5 carbon nanotubes micron$^{-2}$ to 20 carbon nanotubes micron$^{-2}$. Nanotube crossings in this context refers to a configuration wherein two or more nanotubes are in electrical contact, physical contact and/or in an overlapping configuration. For example, nanotube crossings in some embodiments refers to a configuration with two, three or four different nanotubes are provided on top of or underneath each other. In some embodiments, interconnected nanotube networks of the invention include nantoube networks having 0.1 to 100 nanotube crossings μm$^{-2}$, preferably for some applications having 0.2 to 10 nanotube crossings μm$^{-2}$.

"Solution processing" is intended to refer to processes whereby one or more structures, such as carbon nanotubes, are dispersed into a carrier medium and delivered in a concerted manner to a substrate surface. In an exemplary solution printing method, delivery of structures to selected regions of a substrate surface is achieved by methods that are independent of the morphology and/or physical characteristics of the substrate surface undergoing patterning. Solution printing methods useable in the present invention include, but are not limited to, ink jet printing, thermal transfer printing, and capillary action printing.

"Supported by a substrate" refers to a structure that is present at least partially on a substrate surface or present at least partially on one or more intermediate structures positioned between the structure and the substrate surface. The term "supported by a substrate" may also refer to structures partially or fully embedded in a substrate, structures partially or fully immobilized on a substrate surface via an encapsulating layer (e.g., polymer layer) and structures partially or fully laminated on a substrate surface.

"Partially aligned nanotubes" have lengths extending in longitudinal directions that are aligned with respect to each other but not provided in an absolutely parallel configuration. In some embodiments, for example, partially aligned nanotubes have a partially linear geometry wherein their lengths assume a configuration with deviations from absolute linearity greater than about 10%, and in some embodiments with deviations from absolute linearity greater than about 20%. As used in this context, the term "parallel" refers to a geometry in which the lengths of carbon nanotubes are equidistant from each other for at least a portion of the points along their respective lengths and have the same direction or curvature. In one embodiment, for example partially aligned nanotubes are aligned relative to each other with deviations from absolute parallelism that are greater than or equal to 20 degrees, and in some embodiments deviations from absolute parallelism that are greater than or equal to 10 degrees. In some embodiments, compositions and methods of the invention includes carbon nanotube networks comprising partially aligned nanotubes having at least one nanotube crossing. Alternatively, compositions and methods of the invention includes carbon nanotube networks comprising randomly oriented nanotubes having at least one nanotube crossing.

"Monolayer of nanotubes" refers to a layer nanotubes on a substrate surface wherein the coverage of the area of the surface of the substrate having nanotubes is less than 100%, preferably for some embodiment substantially less than 100%. In some embodiments, for example, a monolayer refers to a layer of nanotubes wherein the coverage of the area of the surface of the substrate having nanotubes is less than 10%, preferably for some applications less than 2%, and preferably for some applications less than 1%. In some embodiments, for example, a monolayer refers to a layer of nanotubes wherein the coverage of the area of the surface of the substrate having nanotubes is selected over the range of 0.1-10%, or preferably for some embodiments selected over the range of 0.5-2%. As used herein, monolayers of carbon nanotubes includes carbon nanotube networks having overlapping nanotubes, for example, layers having a plurality of nanotube crossings and/or discrete regions characterized by two, three or four overlapping nanotubes. In this sense, monolayers include layers of nanotubes having discrete bilayer and trilayer regions or components. In some embodiments a monolayer of carbon nanotubes has a thickness less than or equal to 20 nanometers, preferably for some applications less than of equal to 10 nanometers and preferably for some applications less than or equal to 5 nanometers. Use of monolayers of carbon nanotubes in some embodiments of the invention are useful for achieving effective gate modulation in a nanotube-based electronic devices.

"Flexible" refers to a property of an object, such as a substrate, which is deformable in a reversible manner such that the object or material does not undergo damage when deformed, such as damage characteristic of fracturing, breaking, or inelastically deforming. Flexible polymers are useful with the methods described herein. Specific flexible polymers include, but are not limited to: rubber (including natural rubber, styrene-butadiene, polybutadiene, neoprene, ethylene-propylene, butyl, nitrile, silicones), acrylic, nylon, polycarbonate, polyester, polyethylene, polypropylene, polystyrene, polyvinyl chloride, polyolefin, elastomers and other flexible polymers known to those of skill in the art. In certain embodiments, flexible objects or materials can undergo strain levels selected over the range of 1% to 1300%, 10% to 1300%, or 100% to 1300% without resulting in mechanical failure (e.g., breaking, fracturing or inelastically deforming). In some embodiments, flexible objects or materials can be deformed to a radius of curvature selected over the range of 100 μm to 3 m without resulting in without resulting in mechanical failure (e.g., breaking, fracturing or inelastically deforming).

The present invention provides methods and device geometries to enhance the device on/off ratio for thin-film transistors based on patterned layers comprising randomly oriented or partially aligned, and optionally unsorted single-walled carbon nanotubes. In some embodiments, isolated strips comprising interconnected carbon nanotube networks are provided between source and drain electrodes of a transistor. Strips may be aligned in electron transport direction with optimal strip width, determined by nanotube surface concentration, average tube length, and device channel length, to minimize the effect on device transconductance. Also provided are electronic devices and circuits compromising nanotube strips.

FIGS. 1A-1J provide lateral cross section views of electronic devices of the present invention, wherein the channel of the device comprises a patterned layer of randomly oriented or partially aligned carbon nanotubes. In these embodiments, the patterned layer has a plurality of void regions provided to reduce the number of purely conductive pathways between first and second electrodes. Referring to FIGS. 1A-1H, an electronic device 100 of the present invention comprises a first electrode 101, a second electrode 102, and a channel region comprising the patterned layer 110. Optionally, first electrode 101, second electrode 102, and the channel region are supported by a flexible substrate 111. The patterned layer 110, positioned between the first and second electrodes 101 and 102, includes regions having one or more interconnected carbon nanotube networks 103 provided in electrical contact with the electrodes, and void regions 104 without carbon nanotubes, such as cavities, grooves, openings and/or holes in the patterned layer 110. In some embodiments, the void regions 104 comprise an etch pattern in patterned layer 110.

In some embodiments, the void regions 104 extend through the entire thickness of patterned layer 110, or substantially all (e.g., within 10%) of the thickness of patterned layer 110. Electrical contact between the patterned layer 110 and electrodes 101 and 102 is achieved in these embodiments by overlapping region 109 wherein the patterned layer 110 overlaps the two electrodes 101 and 102 (e.g., either above or below the electrodes). In some embodiments, the regions of interconnected nanotube networks 103 may have an average length 105 extending from first electrode 101 to second electrode 102, and an average width 106 extending between void regions 104. In some embodiments, the void regions 104 comprise one or more cavities extending through the entire thickness of patterned layer 110, and have appropriate dimensions (e.g., width 107) to disrupt metallic conductive pathways by preventing physical contact between and electron transport through nanotube networks 103 on opposing sides of the void regions. However, the void regions 104 are patterned such that most semiconducting pathways of the interconnected carbon nanotube network extend from the first electrode 101 to the second electrode 102 without being disrupted by the void regions 104, wherein the pathways contains at least one semiconducting nanotube. As used herein, the width and length of strips of void regions refer to lateral dimensions (e.g., dimensions in a plane parallel to the substrate surface supporting the nanotubes), and thickness refers to a vertical dimension orthogonal to the lateral dimensions. Accordingly, patterned layer 110 of the present invention is capable of reducing the number of purely metallic conductive pathways between the first and second electrodes relative to a system having no void regions, while at the same time not dramatically impacting the field effect mobilities achievable. This aspect is useful for providing nanotube-based transistors having large on/off ratios and useful field effect mobilities.

Figure 1E:
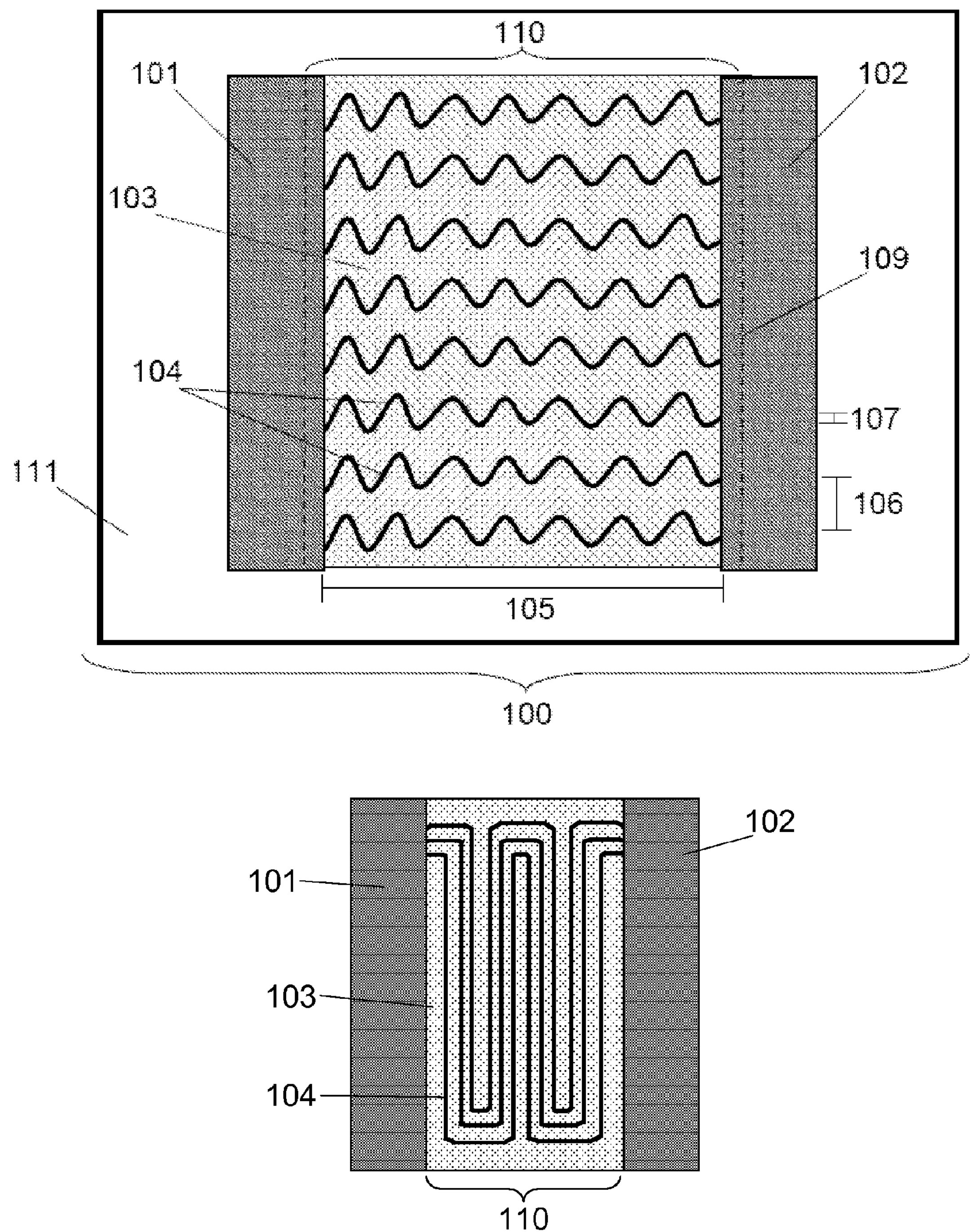

Useful configurations of void regions 104 in the patterned layer 110, occupying the channel of an electronic device 100, are provided in FIGS. 1A-1H, although additional configurations are possible. As shown in FIG. 1A, an embodiment has void regions 104 patterned in a periodic manner extending the entire distance from first electrode 101 to second electrode 102 and arranged parallel to an alignment axis 108, that is optionally provided orthogonal to both first and second electrodes. Void regions 104 in this embodiment define strips 103 of interconnected carbon nanotube networks in the patterned layer 110 that extend between, and are in electrical contact with the two electrodes 101 and 102. In the specific embodiment shown in FIG. 1A, the void regions 104 and strips 103 have a rectangular shape in a lateral cross section. In a similar embodiment, shown in panel 1B of FIG. 1, the void regions 104 extend from the first 101 to the second electrode 102 parallel to an axis that is inclined at a non-orthogonal angle to the two electrodes. Further embodiments comprise a patterned layer 110 having voids 104 that define strips of interconnected nanotube networks 103 with non-rectangular shapes. For example, the strips 103 may have a lateral cross sectional shape that is trapezoidal (FIG. 1C), or oval (FIG. 1D), or provided in a serpentine configuration (FIG. 1E). In these embodiments, the strips 103 have an average length 105 extending from the first electrode 101 to the second electrode 102, an average width 106, and are separated from adjacent strips by an average distance 107.

Figure 1F:
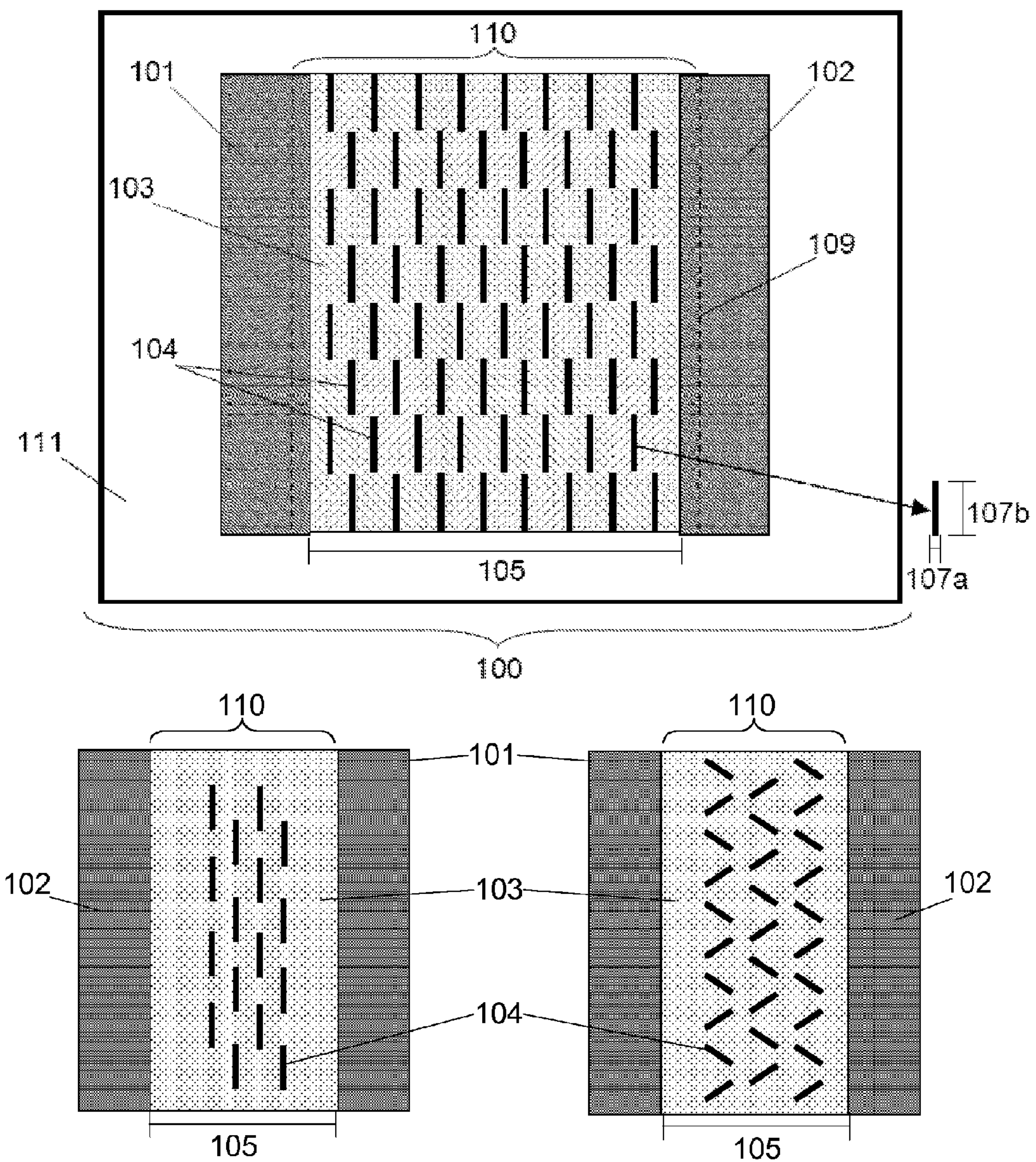
Figure 1G:
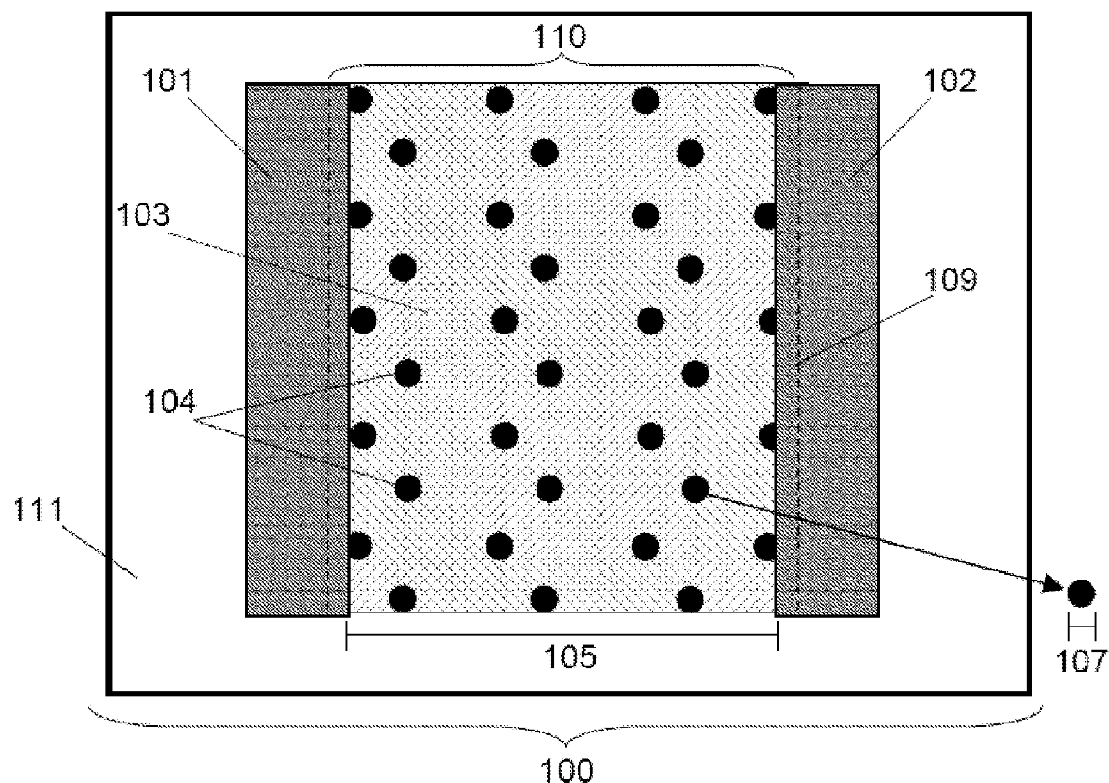
Figure 1H:
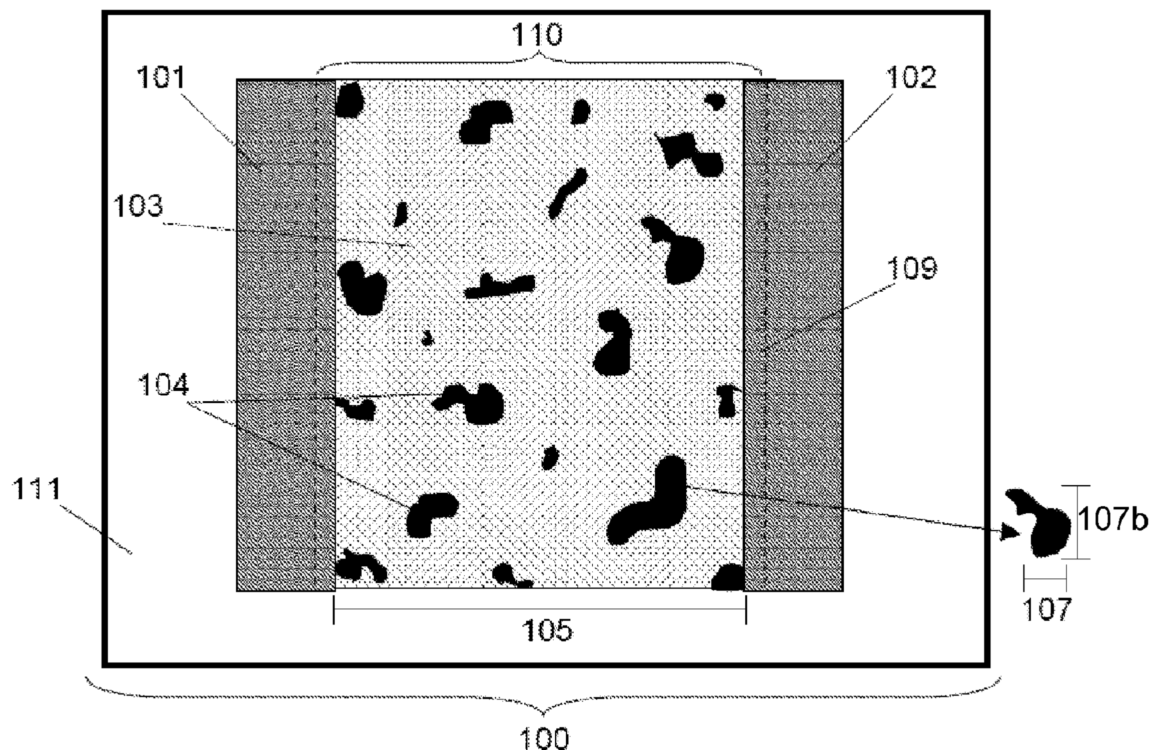
Figure 1I:
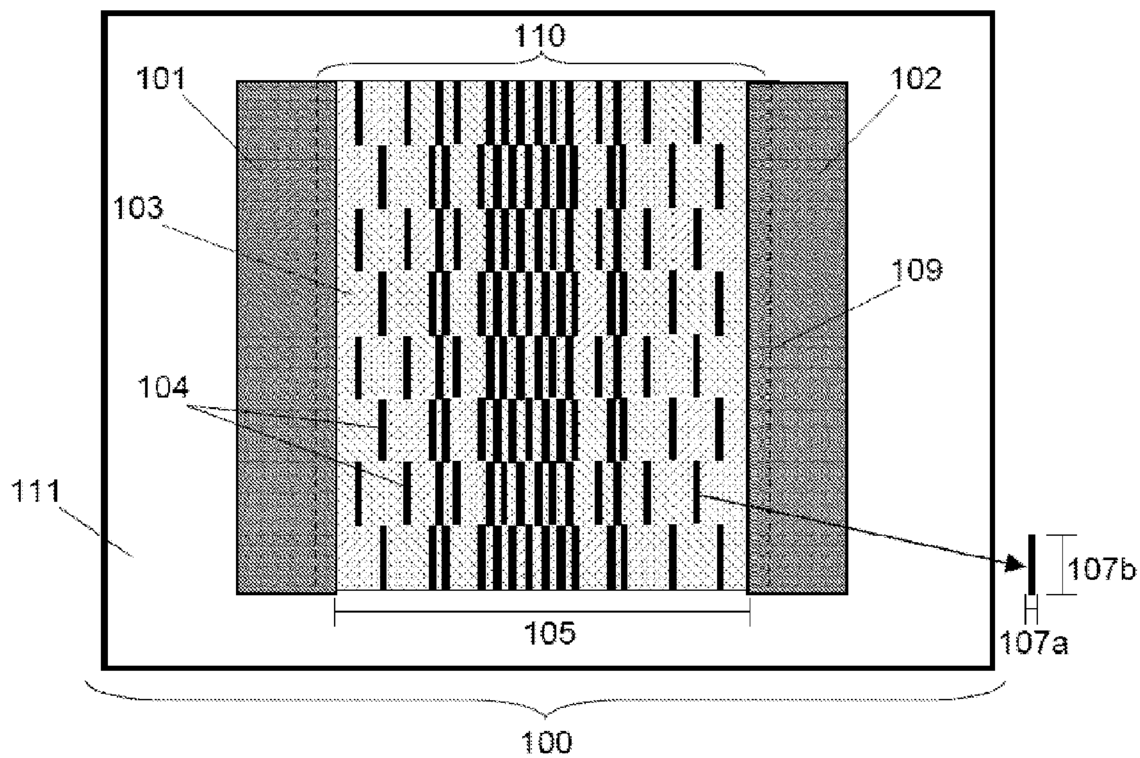
Figure 1J:
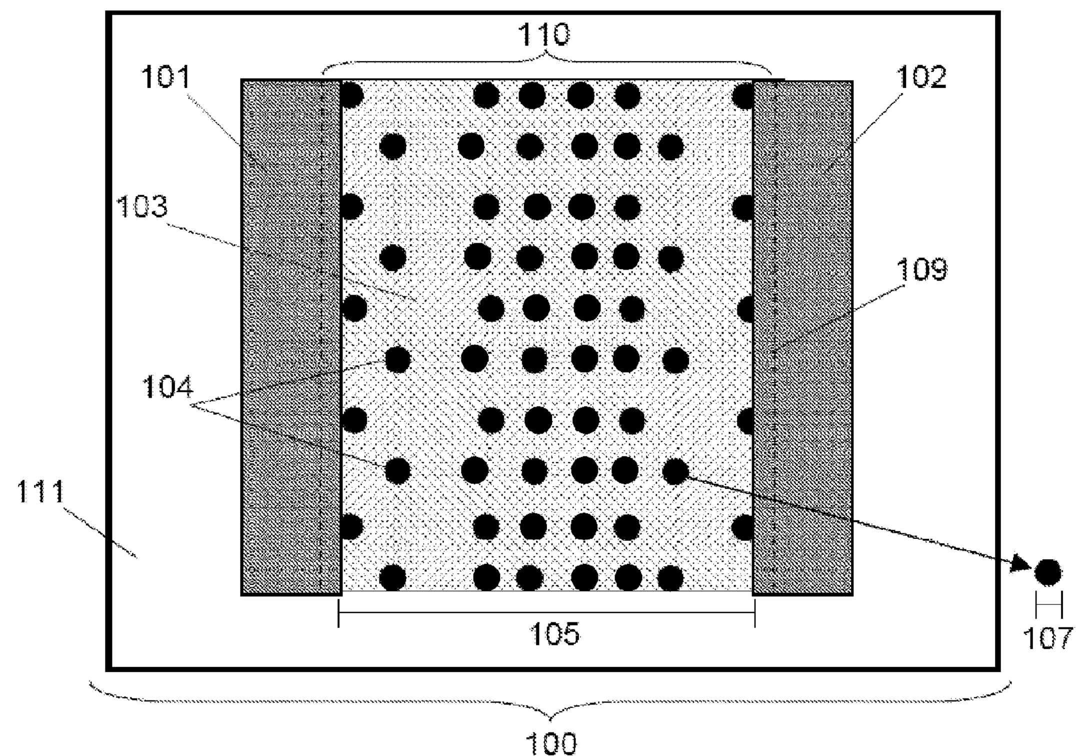

In other embodiments of the present invention, the void regions 104 may extend only a portion of the distance from the first electrode 101 to the second electrode 102. For example, as shown in FIGS. 1F-1H, the void regions 104 may have lateral dimensions 107*a* and 107*b* that are smaller than the channel length 105. These void regions 104 may be patterned in a periodic or aperiodic manner. The void regions 104 may have lateral cross-sectional shapes that are rectangular (FIG. 1F), circular (FIG. 1G), or any other shape as shown in FIG. 1H. In such embodiments, the void regions 104, similarly act to disrupt metallic conductive pathways in the interconnected carbon nanotube networks 103.

In some embodiments, the spatial distribution of void regions 104 is uniform throughout the patterned layer. Alternatively, the invention includes embodiments wherein the spatial distribution of void regions 104 varies with respect to position in the channel region comprising the patterned layer. For example, the invention include embodiments wherein the patterned layer has a plurality of void regions, wherein the density of void regions (e.g. voids regions per micron$^2$) varies in the patterned layer, for example, wherein the density of void regions is smaller adjacent to or proximate to the electrodes than away from the electrodes (e.g., in the center of the channel region comprising the patterned layer). In an embodiment, the density of void regions decreases by greater than 10% from the center of the channel to a region of the patterned layer adjacent to the electrodes. In the embodiments shown in FIGS. 1I and 1J, for example, the void regions 104 are positioned closer to each other in a region of the channel region positioned away from the electrodes. As shown in these figures, the density of void regions 104 is greatest in the center of the channel relative to regions proximate to the electrodes.

Figure 2:
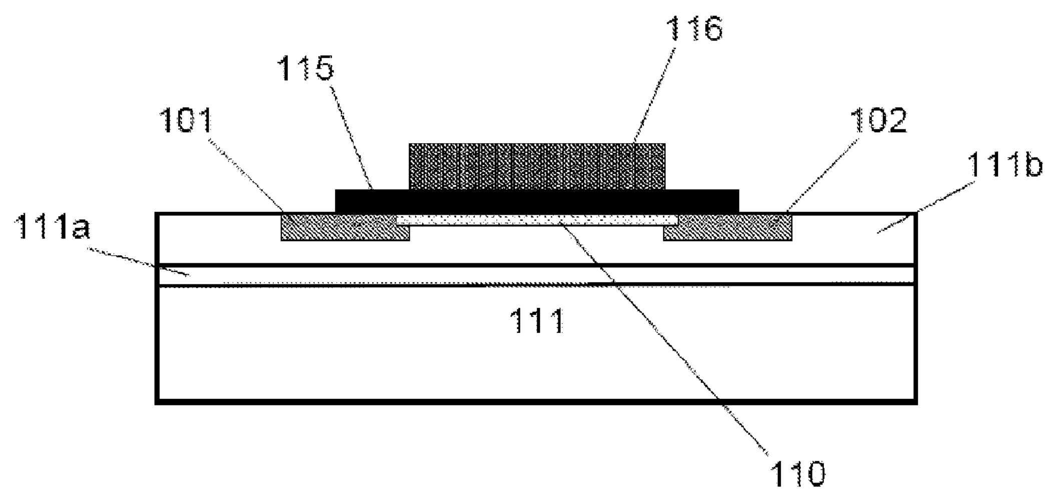
FIG. 2 provides a vertical cross sectional view of a field-effect transistor or thin film transistor incorporating the present invention.

FIG. 2 provides a vertical cross sectional view of a field-effect transistor comprising a thin film transistor of the present invention, having a source electrode 101, a drain electrode 102, a patterned layer of randomly oriented or partially aligned carbon nanotubes 110 in electrical contact with the source and drain electrodes 101 and 102, a gate electrode 116, and a dielectric layer 115 insulating the patterned layer 110 from the gate electrode 116. The patterned layer 110, having void regions 104 that disrupt metallic conductive pathways in the semiconductor channel, forms one or more interconnected carbon nanotube networks to provide a semiconducting channel between the source and drain electrodes. As shown in FIG. 2, the electronic device is supported by a flexible substrate 111, optionally having additional layers 111*a* and 111*b*. In an embodiment, the flexible substrate is a polyimide 111 coated with polyurethane 111*a*, beneath a layer of polyamic acid 111*b*. The source and drain electrodes 101 and 102, and patterned layer of nanotubes 110 are coated with and embedded in the polyamic acid layer 111*b*. The gate electrode 116 may be positioned above or below the patterned carbon nanotube layer.

Figure 3:
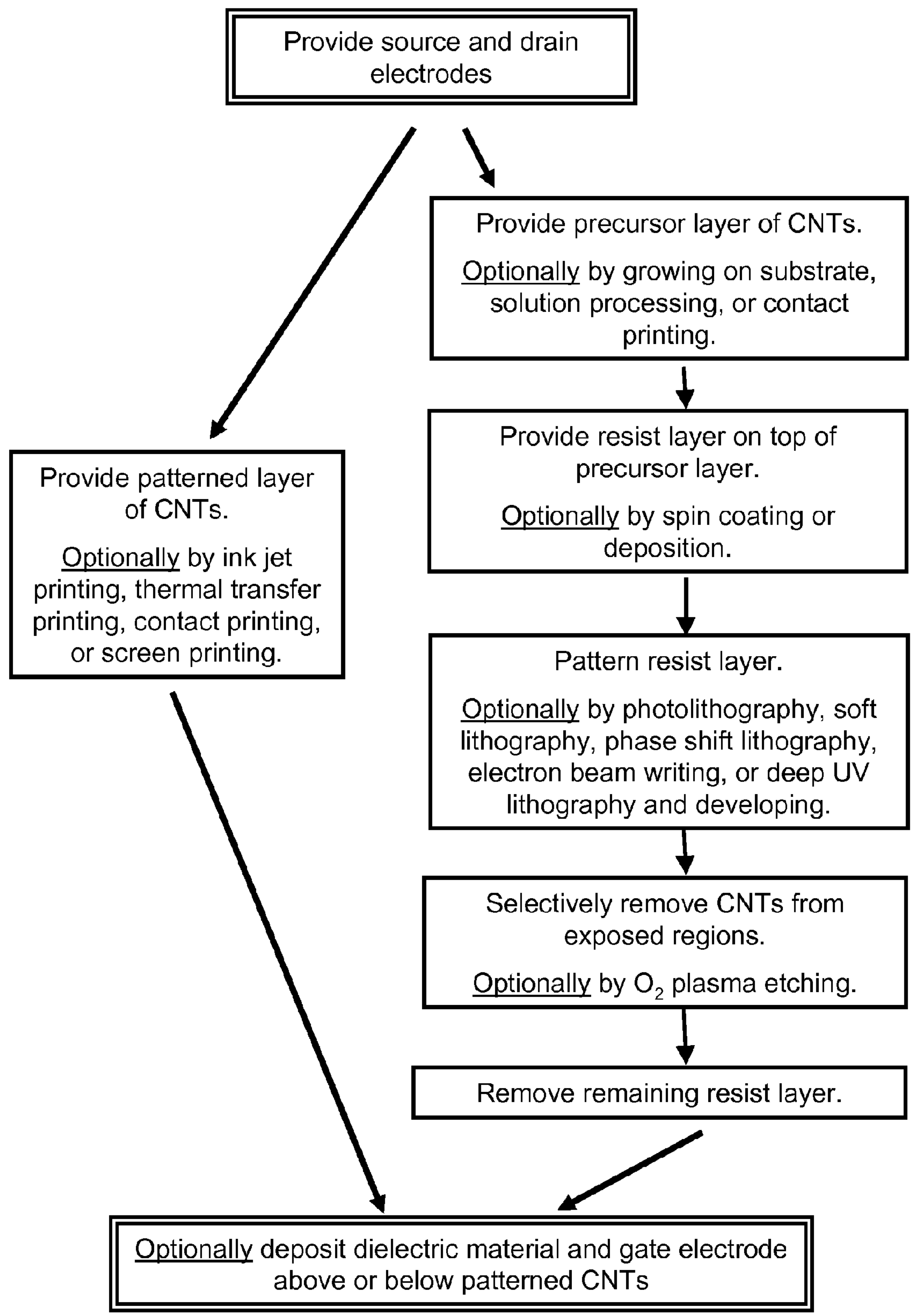
FIG. 3 provides a schematic diagram of an exemplary method for making an electronic device incorporating the present invention.

FIG. 3 provides a schematic diagram of an exemplary method for making an electronic device having a channel region comprising a patterned layer of randomly oriented or partially aligned carbon nanotubes. The method comprises the following steps: (i) providing a first and second electrode which optionally may comprise a source and drain electrode; (ii) providing a patterned layer of randomly oriented carbon nanotubes, having regions of interconnected nanotube networks and void regions without carbon nanotubes, in electrical contact with the first and second electrodes; and (iii) optionally depositing a dielectric layer and gate electrode above or below the patterned nanotube layer. The first and second electrode may optionally be deposited and patterned over an already existing layer of patterned nanotubes (i.e. after step ii), and the gate electrode and dielectric material may optionally be provided in step (i).

In an embodiment, step (ii) may be carried out by a number of different methods; the first method utilizing printing techniques such as: ink jet printing, thermal transfer printing, contact printing, or screen printing. Alternatively, a second method for providing a patterned layer of carbon nanotubes comprises the following steps: providing a precursor sub-monolayer of nanotubes by growing the nanotubes on a substrate, dispersing the nanotubes in a solvent and depositing the nanotube solution on a device substrate, or contact printing the nanotubes on a device substrate; spin coating a layer of resist on the precursor nanotube layer; patterning the resist layer by photolithography, soft lithography, phase shift lithography, electron beam writing or deep ultraviolet lithography to selectively remove regions of the resist layer and expose regions of the precursor layer; removing exposed regions of the precursor nanotube layer by $O_2$ plasma etching; and removing the remaining resist layer such that a patterned layer of carbon nanotubes remains.

Figure 4:
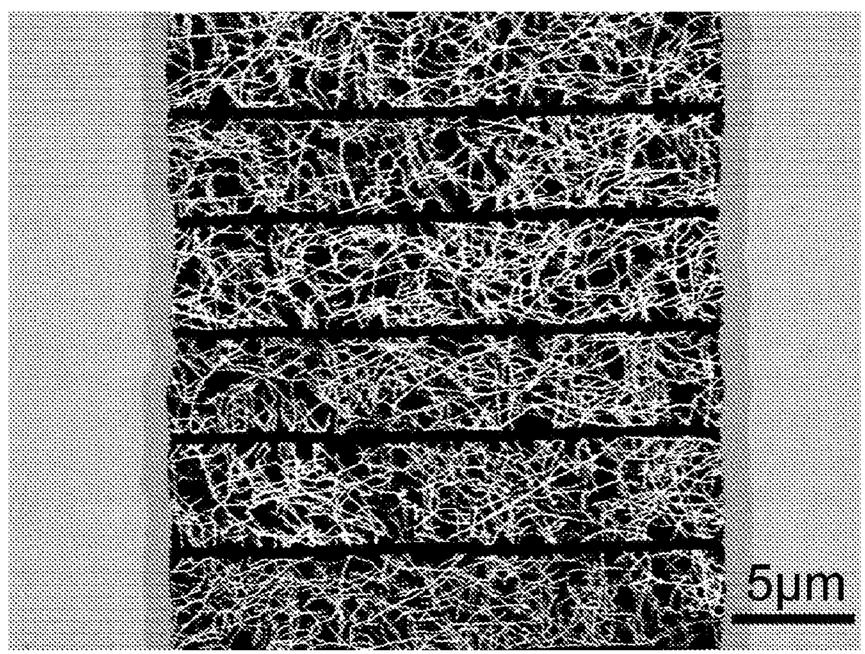
FIG. 4 provides an array of SWNT strips formed by phase shift lithography on $SiO_2$/Si substrate.

Nanotube strips useful in patterned layers of the present invention can be formed by firstly patterning a photoresist (PR) layer with either conventional photolithography or novel nanofabrication methods such as phase shift lithography. The shape and position of strips can be controlled in this step. Oxygen plasma etching removes nanotubes in exposed area and PR layer can be subsequently removed with acetone. FIG. 4 shows an array of SWNT strips formed by phase shift lithography on $SiO_2$/Si substrate.

Figure 5:
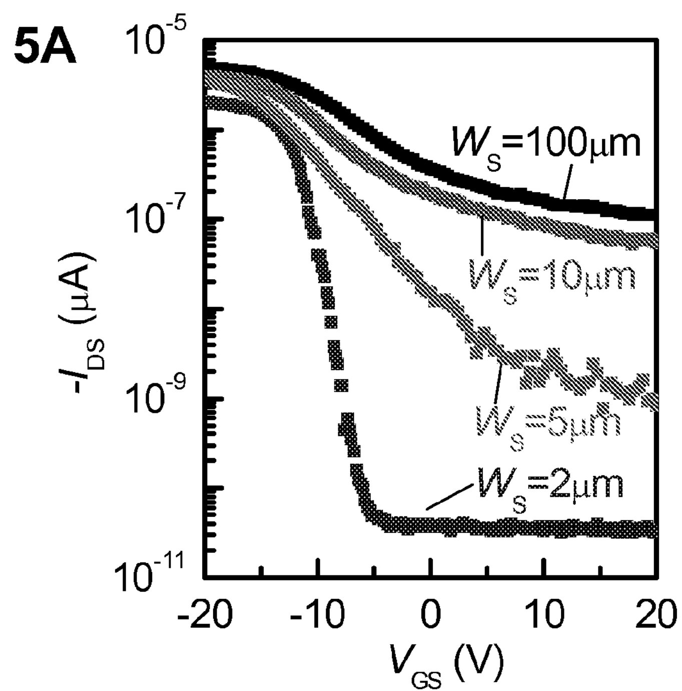
FIG. 5 shows the influence of the geometry of the etch lines on electrical characteristics of devices with 100 μm channel length, which is selected to be compatible with low-cost patterning techniques for flexible electronics, and moderate high density of SWNTs. For strips having a width of ~5 μm, incorporation of the etched lines increases the on/off ratios ($I_{on}/I_{off}$) by three orders of magnitude, while reducing the transconductance (gm) by only ~40%. Moreover, this influence can be predicted, with reasonable accuracy, according to a heterogeneous percolative theory modeling as shown in FIG. 5B.
Figure 5:
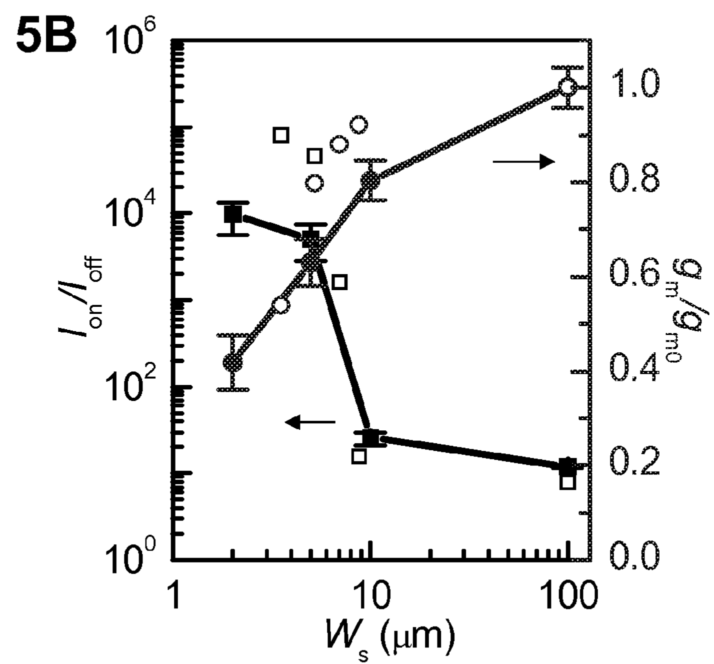

FIG. 5 shows the influence of the geometry of the etch lines on electrical characteristics of devices with 100 μm channel length, which is selected to be compatible with low-cost patterning techniques for flexible electronics, and moderate high density of SWNTs. For a strip width of ~5 μm, on/off ratios are increased by three orders of magnitude, while reducing the transconductance (gm) by only ~40%. Moreover, this influence can be predicted, with reasonable accuracy, according to a heterogeneous percolative theory modeling as shown in FIG. 5B.

Figure 6:
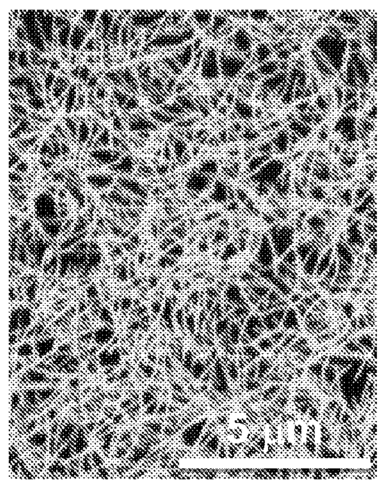
FIG. 6 shows the relationship among $g_m$, on/off ratio, channel length ($L_C$), and strip width ($W_S$) for two different tube densities and average tube lengths ($L_S$).
Figure 6:
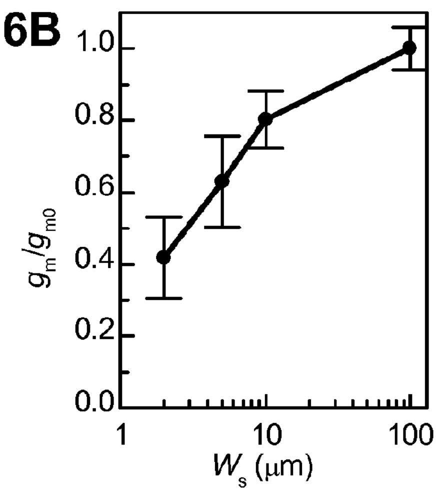
Figure 6:
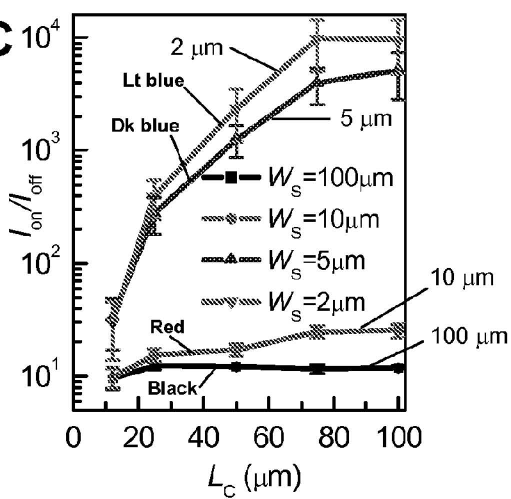
Figure 6:
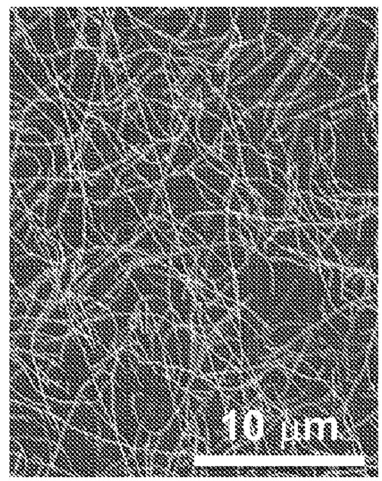
Figure 6:
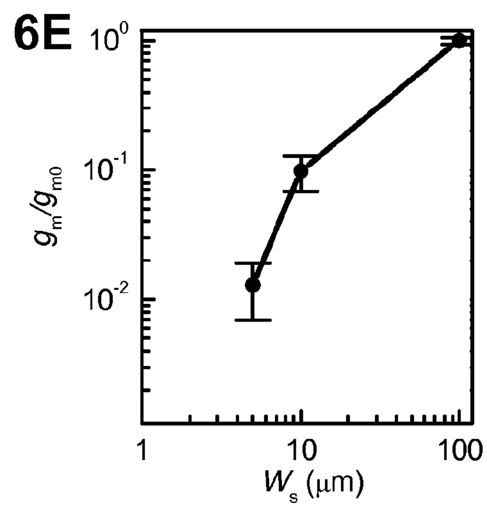
Figure 6:
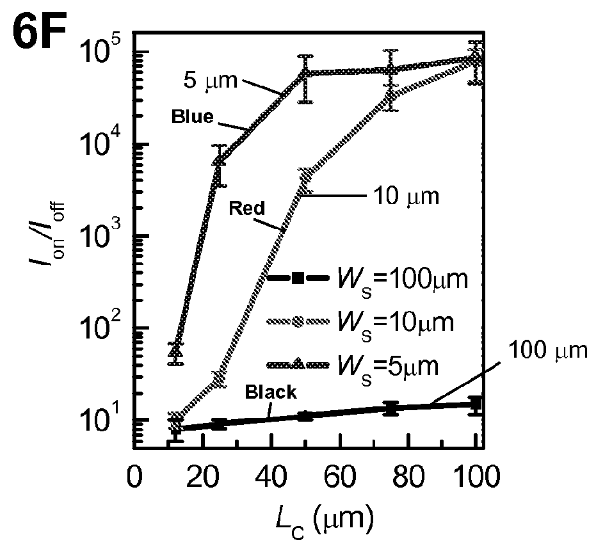

The effectiveness of this approach depends on choosing optimal strip width ($W_S$) according to nanotube density, average tube length ($L_S$), and device channel length ($L_C$). FIG. 6 shows the relationship among $g_m$, on/off ratio, $L_C$, and $W_S$ for two different tube densities and $L_S$. An optimal $W_S$ can be identified for any given combination of $L_S$, $L_C$, and tube density to achieve on/off ratio sufficiently high for real applications, e.g. on/off ratio>1,000, and maintain the highest possible $g_m$.

Figure 7:
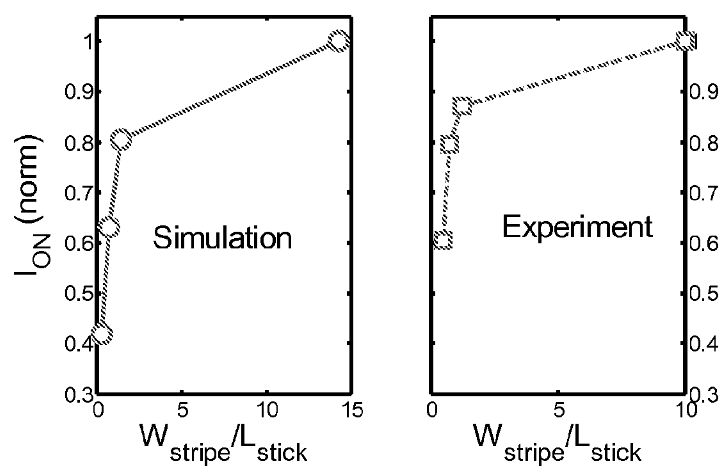
FIG. 7 provides simulated (FIG. 7A) and experimental (FIG. 7B) ON current ($I_{ON}$) vs. effective stripe width stripe ($W_{stripe}/L_{stick}$, for tube density D=40 $\mu m^{-2}$ and effective channel length $L_C/W_{stripe}$=15. The ON current decreases as the stripe width is reduced as more and more intersecting parallel paths are broken. The simulations match the experiments quite well. Experimental (FIG. 7C) and simulated (FIG. 7D) ON/OFF ratio vs. effective channel length $L_C/W_{stripe}$ for various values of effective stripe width $W_{stripe}/L_{stick}$ for tube density D=40 $\mu m^{-2}$ are also shown.
Figure 7:
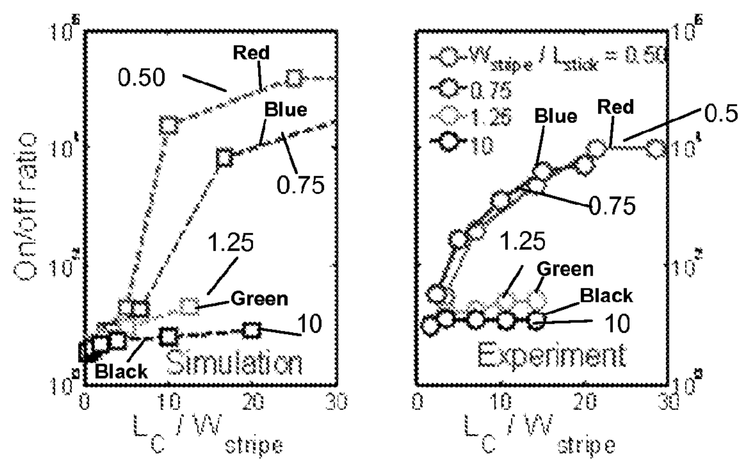
Figure 7:
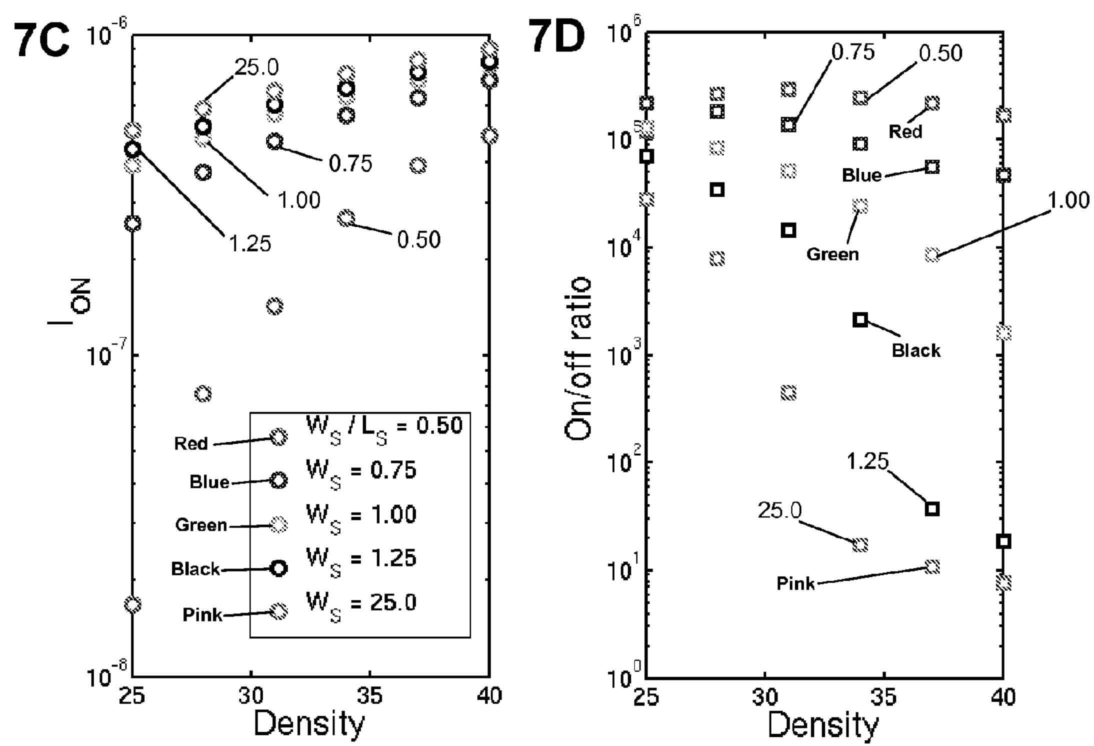

To avoid the time consuming "trail-and-try" strategy, percolative modeling can be used to find the optimal $W_S$ with its ability to accurately represent experimental data as shown in FIG. 7. FIG. 7 provides: (a) Simulated and (b) experimental ON current ($I_{ON}$) vs. effective stripe width ($W_{stripe}/I_{stick}$) for tube density D=40 $\mu m^{-2}$ and effective channel length $L_C/W_{stripe}$=15. The ON current decreases as the stripe width is reduced as more and more intersecting parallel paths are broken. The simulations match the experiments quite well. (c) Experimental and (d) simulated ON/OFF ratio vs. effective channel length $L_C/W_{stripe}$ for various values of effective stripe width $W_{stripe}/L_{stick}$ for tube density D=40 $\mu m^{-2}$.

This approach can be applied over large size SWNT films, making them suitable for constructing integrated circuits/systems.

The invention may be further understood by the following non-limiting example.

Example 1

Medium Scale Carbon Nanotube Thin Film Integrated Circuits on Flexible Plastic Substrates The ability to form integrated circuits (ICs) on flexible sheets of plastic enables attributes (e.g. conformal and flexible formats, lightweight and shock resistant construction) in electronic devices that are difficult or impossible to achieve with technologies that use semiconductor wafers or glass plates as substrates.[1] Organic small molecule and polymer based materials represent the most widely explored types of semiconductors for such flexible ICs.[2] Although these materials and those that use films or nanostructures of inorganics have promise for certain applications, existing demonstrations of them in ICs on plastic indicate modest performance characteristics that might restrict the application possibilities. In this Example we disclose advanced implementations of a comparatively high-performance carbon-based semiconductor comprising sub-monolayer, random networks of single-walled carbon nanotubes (SWNTs) to yield small-scale to medium-scale, integrated digital circuits, composed of up to nearly one hundred transistors on plastic substrates. Transistors in these ICs demonstrate excellent properties: mobilities as high as 80 $cm^2$/Vs, subthreshold slopes as low as 140 mV/dec, operating voltages <5 V together with deterministic control over the threshold voltages, on/off ratios as high as $10^5$, switching speeds well in the kHz range even for coarse (~100 μm) device geometries and good mechanical bendability, all with levels of uniformity and reproducibility that enable high yield fabrication of ICs. Theoretical calculations, ranging from percolation transport through the networks to compact models for the transistors to circuit level simulations, provide quantitative and predictive understanding of these systems. Taken together, these results demonstrate that sub-monolayer films of SWNTs provide an attractive type of carbon-based semiconductor for flexible ICs, with many potential areas of application in consumer and other areas of electronics.

Efforts to develop polymer and small molecule semiconductors for electronics have yielded several impressive demonstrations, including ICs with more than one thousand transistors[3], flexible displays[3,4], sensor sheets[5] and other systems[6,7]. In all cases, however, the field effect mobilities of the transistors are modest: typically ~1 $cm^2$/Vs for isolated devices[8,9], and <0.05 $cm^2$/Vs in ICs[3-7]. Although these properties are sufficient for electrophoretic displays and certain other applications, improvements in the materials would expand the possibilities.[1] Separately, for any given application, increases in mobility relax the requirements on critical feature sizes in the circuits (e.g. transistor channel lengths) and tolerances on their multilevel registration, which can be exploited to reduce the cost of the plastic substrates and patterning systems to achieve roll-to-roll fabrication by dry printing[10] or ink-jet printing[11]. Recently developed carbon-based semiconducting nanomaterials, especially SWNTs, provide an opportunity to achieve extremely high intrinsic mobilities, high current carrying capacities and exceptional mechanical/optical characteristics,[12] in bendable formats on plastic substrates. Sub-monolayer random networks[13-16] or aligned arrays[17,18] of SWNTs can serve as thin film semiconductors which, in the best cases, inherit the exceptional properties (e.g. device mobilities up to ~2,500 $cm^2$/Vs, on current above several milliamperes, and cut-off frequency above 1 GHz for devices on plastic) of the tubes. The network geometry is of particular interest for flexible electronics because it is achievable by printing SWNTs from solution suspensions.[19] The present Example demonstrates advanced implementations of SWNT networks in flexible ICs on plastic that have attractive characteristics, together with corresponding theoretical models and simulation tools that capture all of the key aspects.

Figure 8:
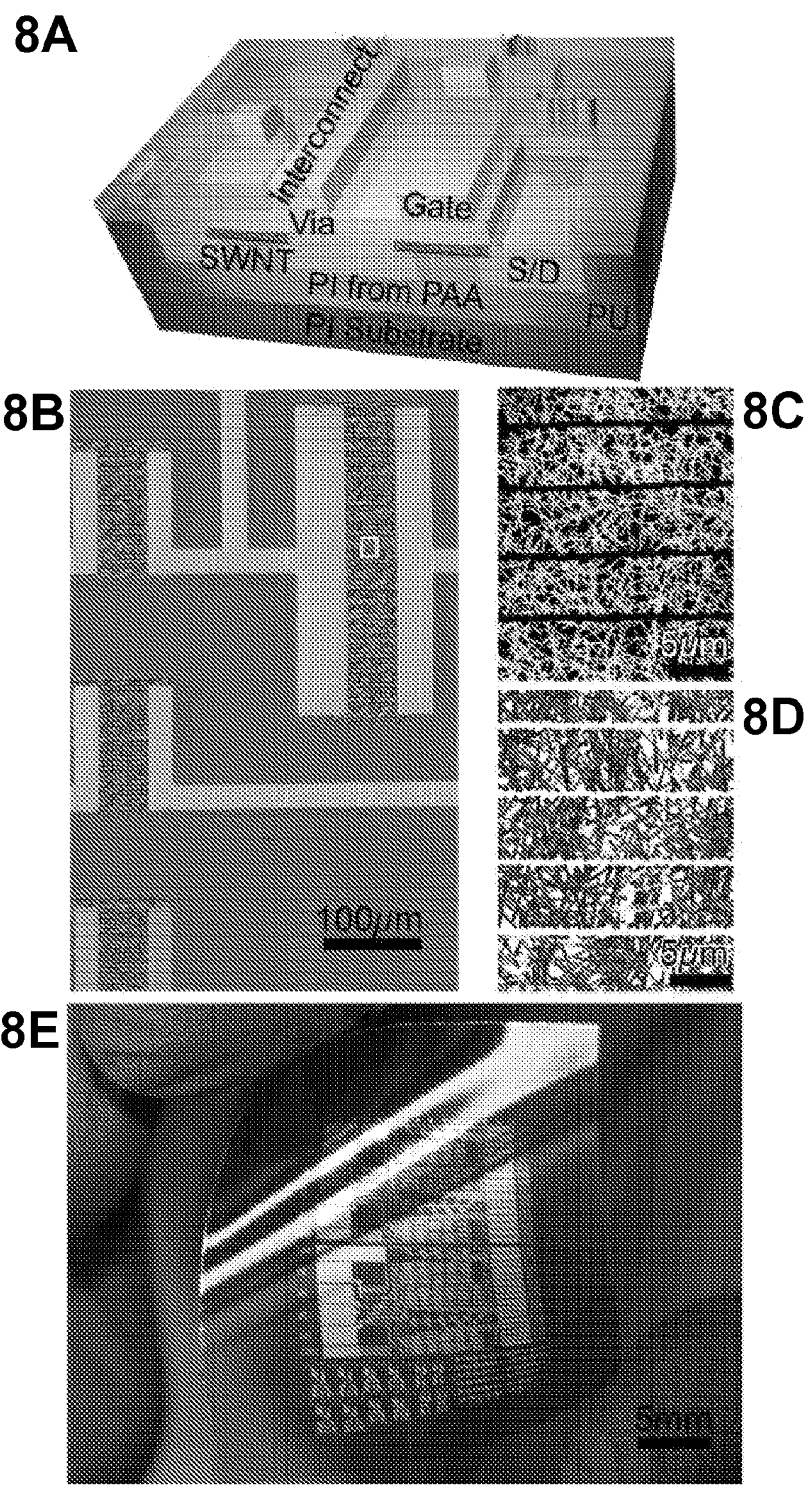
FIG. 8 provides a schematic illustration, scanning electron microscope (SEM) images, theoretical modeling results and photographs of flexible SWNT integrated circuits on plastic.
Figure 12:
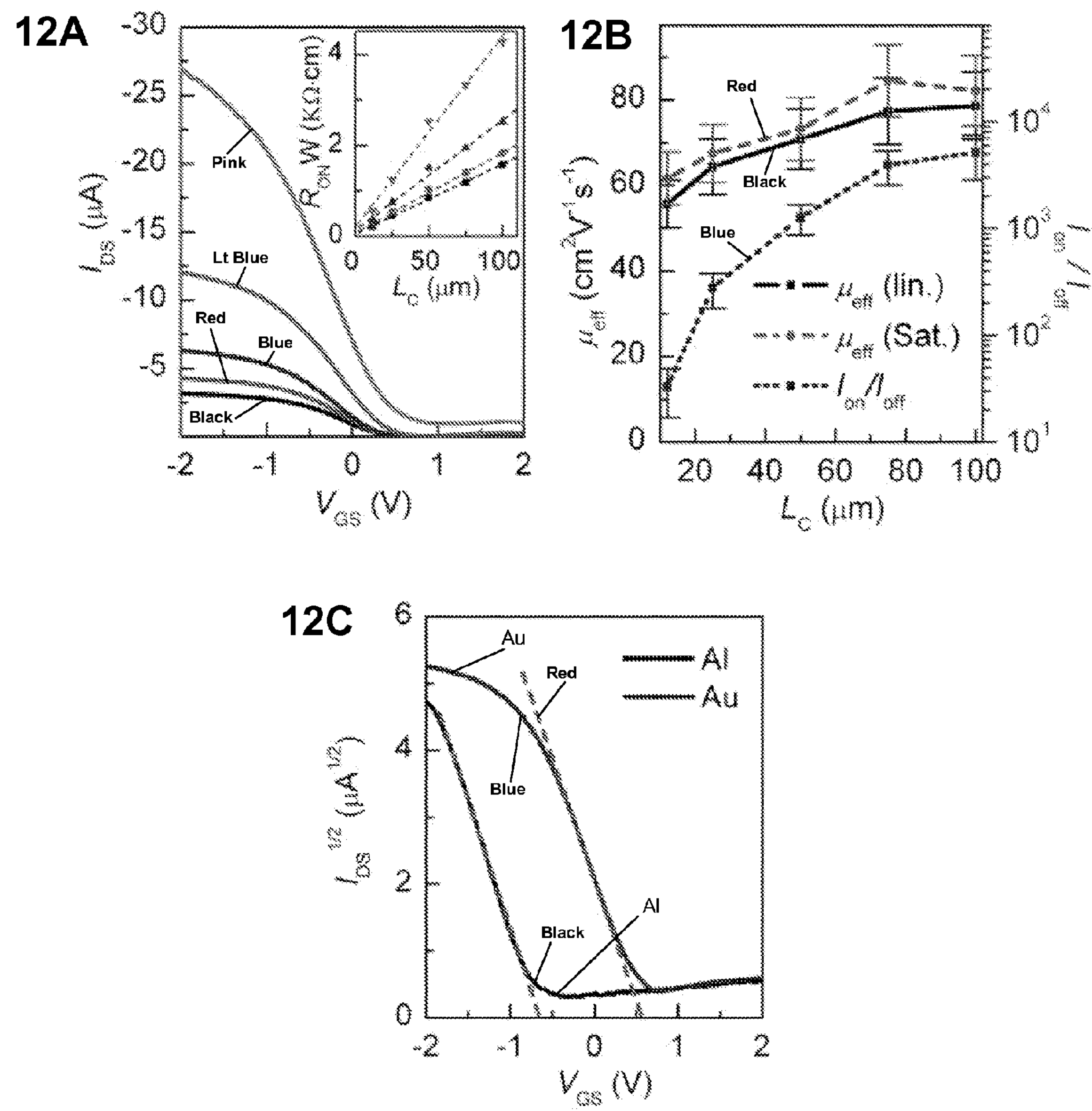
FIG. 12 provides channel length scaling properties of SWNT thin-film transistors.

The system layouts, as schematically illustrated in FIG. 8*a*, exploit architectures similar to those in established silicon ICs. A thin (50 μm) sheet of polyimide serves as the substrate. Random networks of SWNTs grown by chemical vapour deposition and subsequently transfer printed onto the polyimide forms the semiconductor layer.[17] Source and drain (S/D) electrodes of Au serve as low resistance contacts to these networks, as determined by scaling studies (FIG. 12). Although roughly one third of the SWNTs are metallic, purely metallic transport pathways between source and drain can be eliminated by suitably engineering the average tube lengths and the network layouts. For present purposes, we used soft lithography and reactive ion etching to cut fine lines into the networks. The resulting network strips are oriented along the overall direction of transport, with widths designed to reduce the probability of metallic pathways below a practical level without significantly reducing the effective thin film mobility of the network. FIG. 8*b* shows a scanning electron micrograph (SEM) of a region of an IC just before deposition of the gate dielectric. A magnified view of a part of the SWNT network in the channel of one of the devices (FIG. 8*c*, the S/D electrodes are to the right and left, outside of the field of view) reveals narrow, dark horizontal lines, corresponding to the etched regions. The critically important role of these features on the electrical characteristics can be quantified through first principles modeling studies that consider percolation transport through sticks with average lengths and layouts (e.g. etched lines, densities of SWNTs, etc) corresponding to experiment.[20] FIG. 8*d* shows the distribution of current flow for a typical case, in which the color indicates the current density in the 'on' state of the device. In addition to providing guidance on optimal design (FIG. 9*a*), these simulations reveal that networks in this geometry and coverage (~0.6%) distribute current evenly, thereby serving as an effective film for transport. A typical device incorporates ~16,000 individual SWNTs. The circuits are completed in top gate configurations by depositing and patterning high capacitance, hysteresis-free dielectrics (~40 nm of $HfO_2$) directly on the tubes, followed by gate metallization, vias and interconnects. FIG. 8*e* shows a representative system, complete with arrays of isolated enhancement-mode (lower right region) and depletion mode (lower middle region) transistors, various logic gates (lower left part), and two twenty-logic-gate size four-bit row decoders (middle and upper parts). Fabrication details are further described in the Methods Section.

Figure 9:
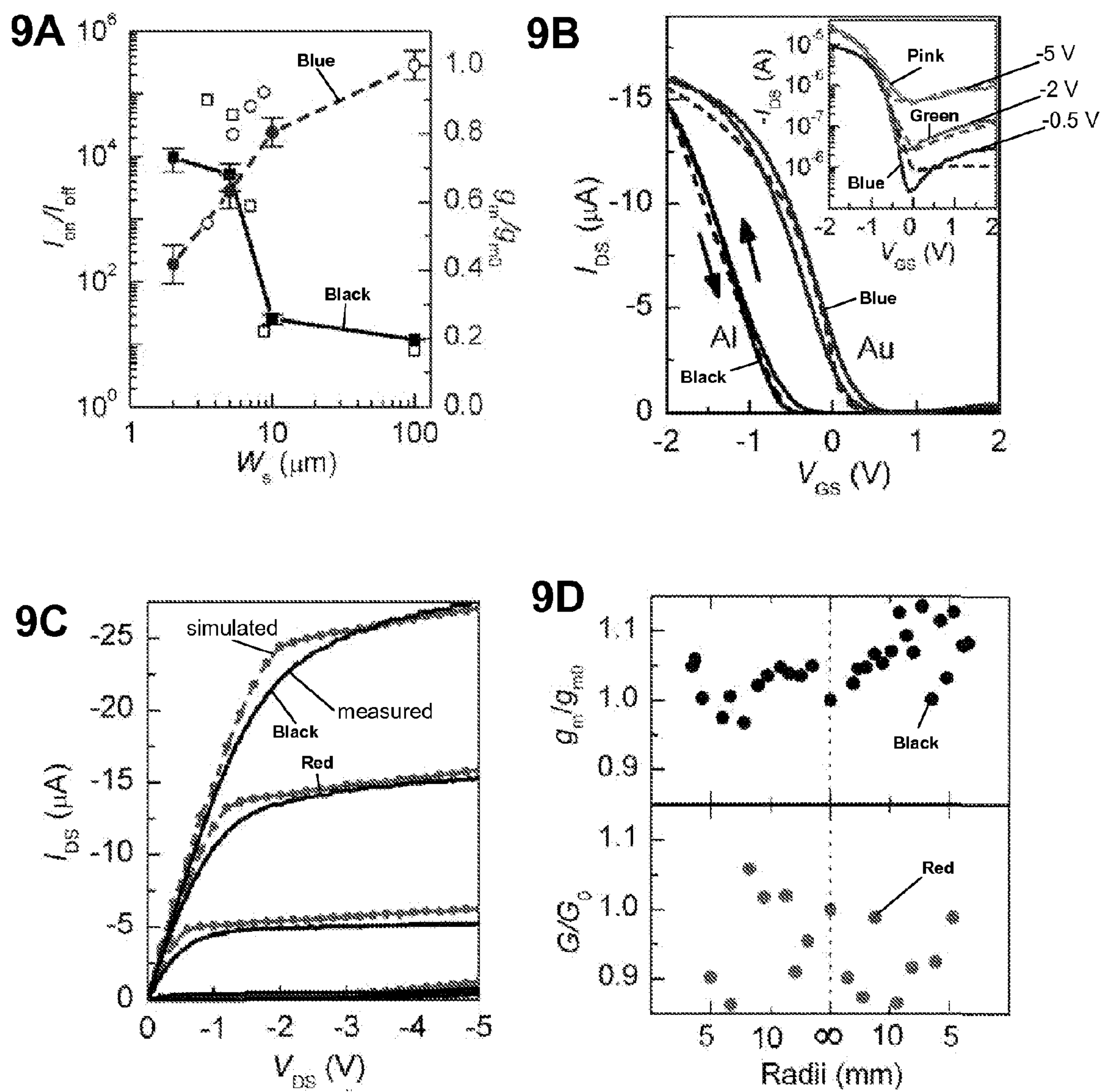
FIG. 9 provides plots showing electrical properties of TFTs that use SWNT network strips for the semiconductor, on thin plastic substrates.
Figure 9:
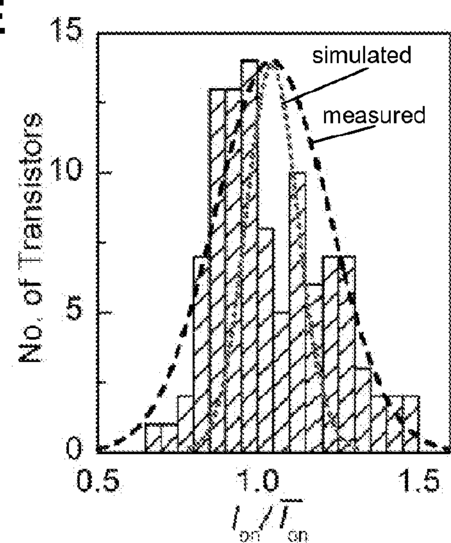
Figure 9:
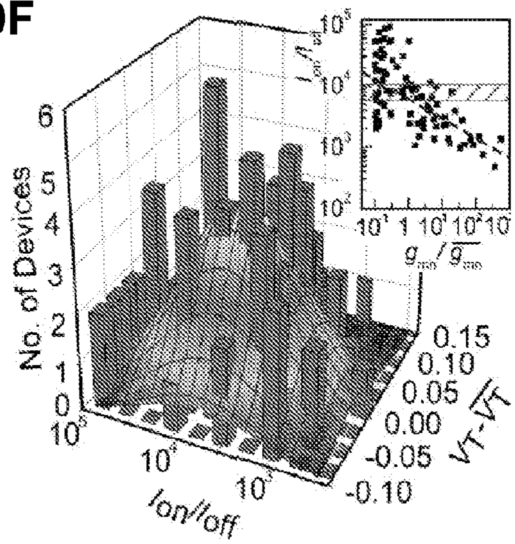
Figure 14:
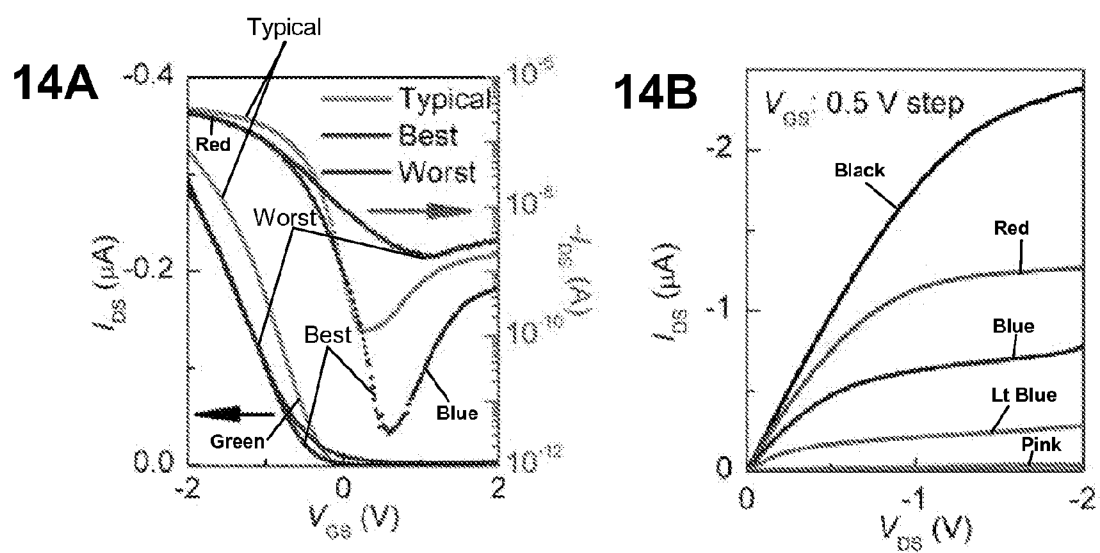
FIG. 14 provides $I_{DS}$–$V_{GS}$ characteristics ($V_{DS}$: Drain-source voltage=−0.2 V) in both linear scale (left axis) and logarithmic scale (right axis) of three representative devices with typical (dark yellow), high (blue), and low (dark red) on/off ratios (14A) and $I_{DS}$–$V_{DS}$ characteristics ($V_{GS}$: Gate-source voltage changed from −2 V to 0 V) (14B) of a top gate device with a high on/off ratio. For all three devices, channel widths are 200 μm and channel lengths are 100 μm, with photolithographically defined 5 μm wide strips and source/drain electrodes patterned after transfer ($I_{DS}$: Drain-source current).
Figure 15:
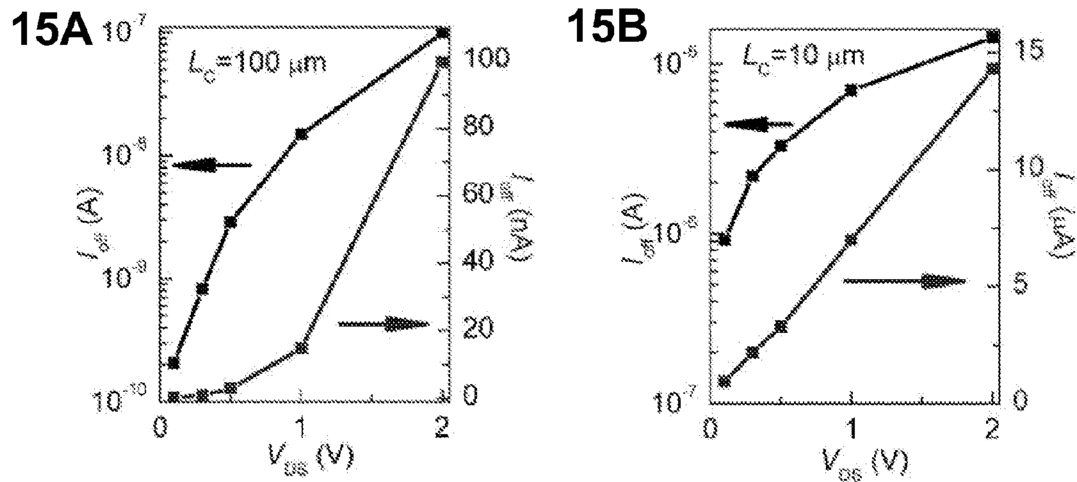
FIG. 15 provides off state current ($I_{off}$) as a function of drain-source voltage ($V_{DS}$) for devices with channel length ($L_C$) of 100 μm (15A) and 10 μm (15B) respectively, shown in both linear scale (right axis) and logarithmic scale (left axis).

FIG. 9 summarizes measurements on individual transistors. FIG. 9*a* illustrates the predicted and measured influence of the geometry of the etched lines described above on devices with coarse dimensions (i.e. 100 μm channel lengths), selected to be compatible with established low cost patterning techniques such as screen printing,[21] and with sufficiently high densities of SWNTs to achieve good performance and uniformity as a thin film type semiconductor. For carbon nanotube strips having widths of ~5 μm, the etched lines increase the on/off ratios by up to four orders of magnitude, while reducing the transconductances ($g_m$) by only ~40%. FIG. 9*b* and *c* show characteristics of transistors with this geometry, illustrating well behaved responses with minimal hysteresis and with excellent transconductances ($g_m$ as high as 0.15 $\mu S\ \mu m^{-1}$ and typically 0.12 $\mu S\ \mu m^{-1}$ for $L_C \geq 50$ μm, which corresponds to an estimated cut-off frequency of >100 kHz.), device mobilities ($\mu_{eff}$ as high as ~80 $cm^2V^{-1}s^{-1}$ and typically ~70 $cm^2V^{-1}s^{-1}$ as calculated using standard MOSFET models with measured gate capacitances (FIG. 13), for both the linear and the saturation regimes) and subthreshold swings (S as low as 160 mV/dec and typically ~200 mV/dec). The transconductances and the subthreshold behaviors, in particular, exceed those that have been demonstrated in flexible ICs on plastic with organic thin film semiconductors ($g_m$<0.02 $\mu S\ \mu m^{-1}$ for $L_C$~50 μm, S>140 mV/dec)[22,23] or with Si nanowires ($g_m$<0.01 $\mu S\ \mu m^{-1}$ for $L_C$~50 μm, S>280 mV/dec)[24] and are competitive with the best reports of p-channel single crystalline Si ribbons ($g_m$~0.25 $\mu S\ \mu m^{-1}$ for $L_C$=50 μm, S ~230 mV/dec)[25]. Under low to moderate bias conditions, the on/off ratios are as high as $10^5$ (see FIG. 9*f* and FIG. 14*a*), and typically ~$10^3$, for transistors with this geometry. The inset to FIG. 9*b* and FIG. 15*a* show a decrease in the on/off ratio with increasing drain-source voltage ($V_{DS}$), due primarily to the slightly ambipolar nature of the device operation. These ratios also decrease with channel length (FIG. 12*b*). The favorable direct-current (DC) properties of long channel devices are achieved at short channel lengths, for improved operating speeds, by use of correspondingly shorter SWNTs and narrower etched stripes, as suggested by modeling results, or utilizing pre-enriched semiconducting SWNTs.[26] The threshold voltage ($V_T$) are controlled by using gate metals with different work functions, because the high capacitance gate dielectrics reduce the relative contribution of voltage across the dielectric to $V_T$.[27] For example, replacing Au with Al as the gate metal shifts $V_T$ by −0.6~0.8V, thereby hanging the device operation from depletion mode to enhancement mode (FIG. 9*b*). Systematic bending tests of individual devices and inverters showed no significant change in device performance during inward or outward bending to radii as small as ~5 mm (FIG. 9*d*). Collectively, these properties are as good as or better than those of previously reported SWNT network devices, in spite of the moderate decreases in gm associated with the etching procedures. Transistors that use aligned arrays of SWNTs have improved performance, but these layouts cannot be formed readily with solution printing techniques. As such, they are not relevant for the type of printed, flexible electronics applications contemplated here.

For use in ICs, the yields and performance uniformity of the transistors are critically important. We examined these aspects through measurements on more than 100 devices, as summarized in FIG. 9-9*f* and FIG. 16. The results show standard deviations of ~20% for the normalized on-state current ($I_{on}$) and ~0.05V for $V_T$. The former result is quantitatively in agreement with percolation theory, illustrated also in FIG. 9*e*. Although on/off ratios vary by roughly two orders of magnitude, most of values are >103. The distribution, as shown in FIG. 9*f*, indicates no correlation with $V_T$ (suggesting the importance of extrinsic doping effects on SWNTs[28]), and is much larger than what is predicted by percolation models (FIG. 9*f*, right inset) that do not explicitly include effects of S/D contacts. These results suggest strongly that the variation in on/off ratio results from electron conduction caused by tunneling through the Schottky barriers at S/D contacts (FIG. 9*f*, right inset).[29] Doping techniques similar to those demonstrated in single SWNT devices can be used to suppress the ambipolar behaviour and improve on/off ratio uniformity.[30] Such doping methods also help to eliminate decreases in on/off ratio with increasing $V_{DS}$ as mentioned previously and illustrated in FIG. 9*b* and FIG. 15*a*.

Figure 10:
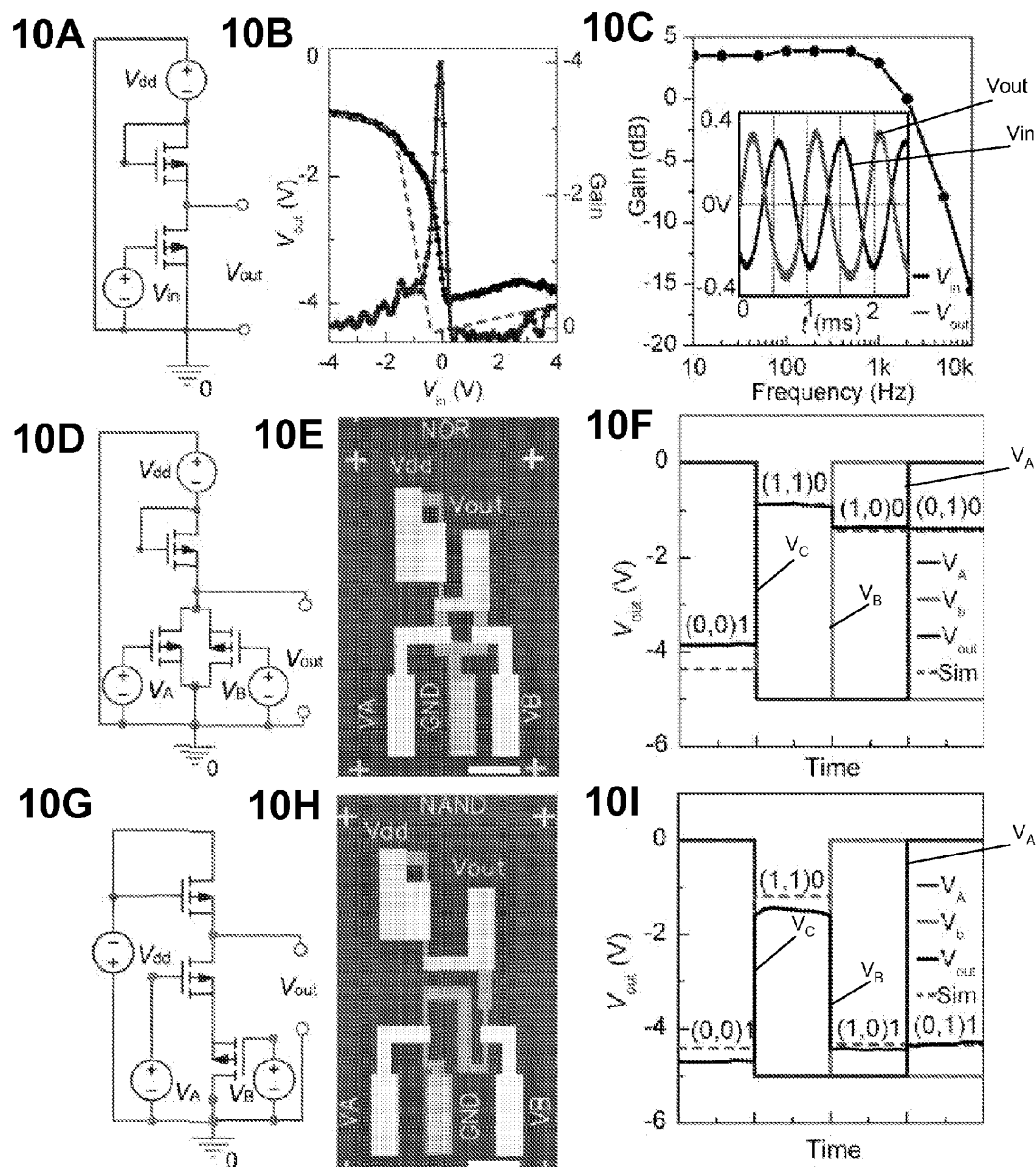
FIG. 10 provides circuit diagram, optical micrographs, output-input characteristics and circuit simulation results for different logic gates, such as inverter (FIGS. 10A-C), NOR (FIGS. 10D-F), and NAND (FIGS. 10G-I) gates. We adopt a negative logic system. The $V_{dd}$ applied to these logic gates is −5 V relative to GND. The logic-'0' and -'1' input signals of two terminals of the NOR and NAND gates are driven by 0 V and 25 V, respectively. The logic-'0' and -'1' outputs of the NOR gate are −(0.88-1.39) V and −3.85 V, respectively. The logic-'0' and -'1' outputs of the NAND gate are −1.47 V and −(4.31-4.68) V, respectively.

We find that standard models for silicon device technologies can capture the device behaviors. FIG. 9*b* & *c* illustrate the level of agreement that can be achieved with a level 3 PMOS SPICE model that uses a parallelly connected exponential current source controlled by both gate voltage and $V_{DS}$ to mimic the electron tunneling current. This level of compatibility with established simulation tools allows the use of existing, sophisticated computer aided design platforms developed for Si ICs. As the first step toward large scale integration, we modeled and then built "universal" logic gates. FIG. 10*a* provides a circuit diagram of a PMOS inverter with enhancement load. The inverter exhibits well defined static voltage transfer characteristics, consistent with simulation, at a supply voltage of −5V as shown in FIG. 10*b*. The rise in output voltage with increasing positive input voltage arises from the ambipolar behavior of the driving transistor. Maximum voltage gains of ~4, together with good noise immunity with a width of the transition region <0.8 V and a logic swing >3 V are achieved, indicating that the inverter can be employed to switch subsequent logic gates without losing logic integrity. Measuring their alternating-current (AC) responses generated a magnitude Bode plot closely resembling the characteristics of low-pass amplifiers (FIG. 10*c*), with operation in kHz range even for devices with long (~100 μm) channel length and significant (~40 fF/μm) overlap capacitance. The ability to achieve switching speeds in the kHz range with device geometries that are compatible with techniques such as screen printing is important for use of such SWNT networks in low cost, printed electronics. By adding another driving transistor to the inverter, either in parallel with the pulling down transistor to incorporate OR logic (FIG. 10*d, e*) or in series to incorporate AND logic (FIG. 10*g, h*), NOR and NAND logic gates are achievable, respectively. The output characteristics and simulation results are presented in FIG. 10*f* & *i*. Voltage amplification is observed in all cases.

Figure 11:
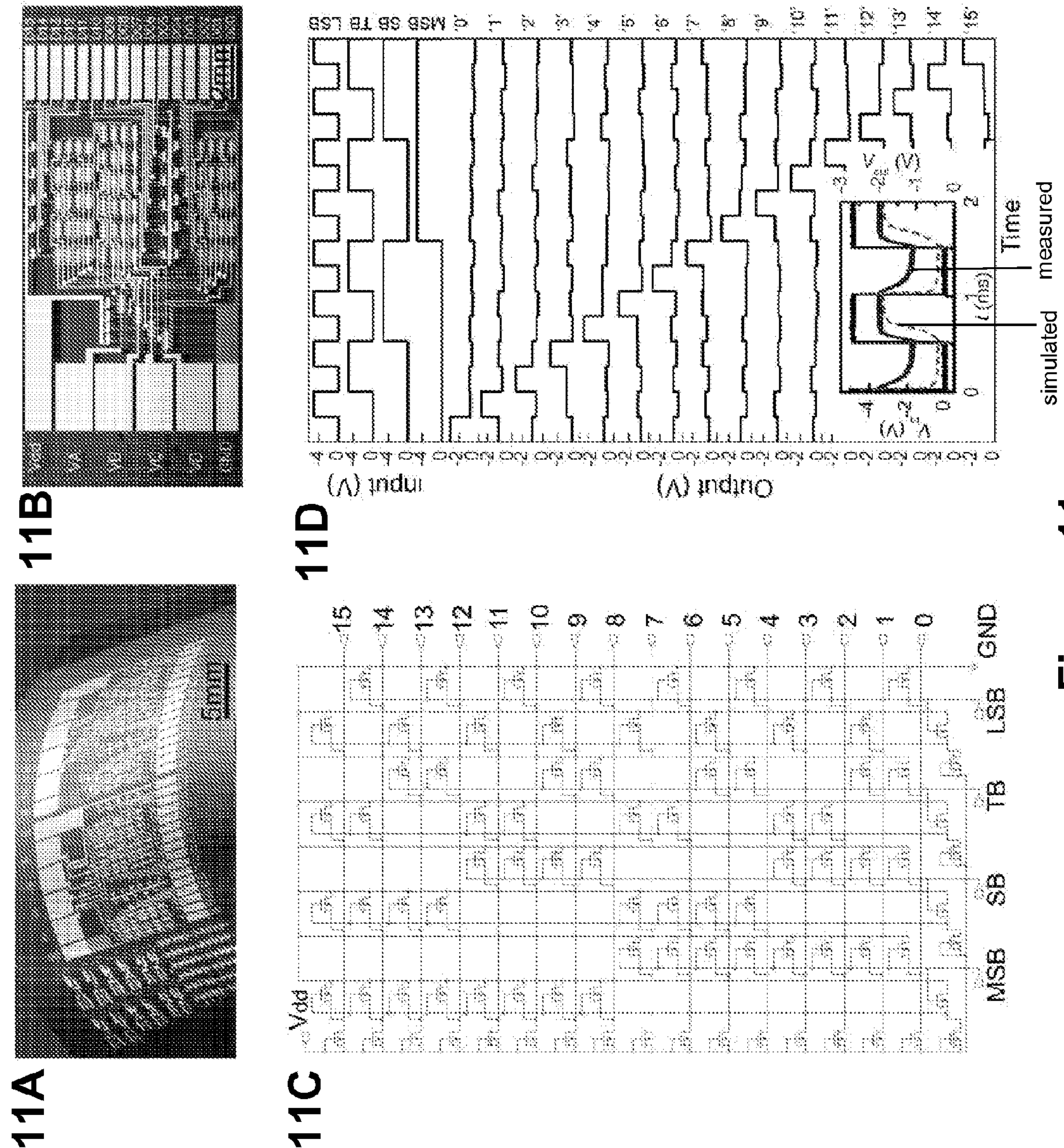
FIG. 11 provides medium scale integrated circuits based on SWNT network strips on thin plastic substrates.
Figure 17:
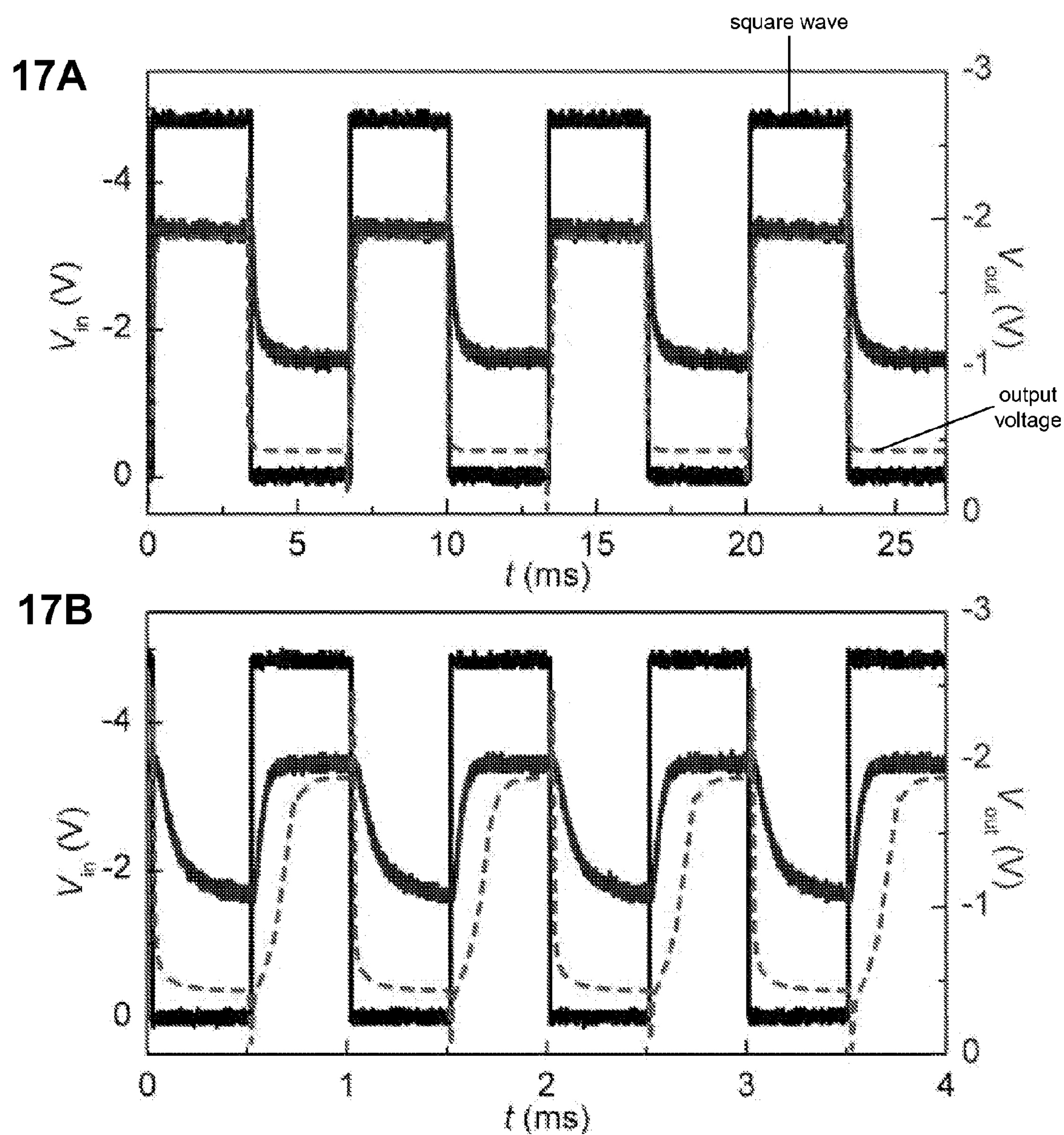
FIG. 17 provides plots of dynamic switching characteristics of the four-bit decoder. The data show the output voltage of the least significant bit of the No. 7 output line, and the square wave input pulse, at clock frequency of 150 Hz (17A) and 1 kHz (17B), and constant bias from other input lines.

All of these experimental and computational components can be used together to yield SWNT based digital circuits, as shown in FIG. 11*a*. The largest circuit in this chip is a four-bit row decoder, designed using modeling tools and measured characteristics of standalone logic gates. This circuit incorporates eighty eight transistors, in four inverters and a NOR array with the output of the inverter serving as one of the inputs for the NOR gate. The circuit diagram, depicted in FIG. 11*c*, is configured such that any given set of inputs only give one logic "1" output. The input-output characteristics of the decoder are shown in FIG. 11*d* and FIG. 17, which demonstrates its ability to decode a binary encoded input of four data bits into sixteen individual data output lines, at frequency in kHz regime. These results demonstrate that SWNT networks can form the basis for a potentially interesting and scalable alternative to conventional organic or other classes of semiconductors for flexible IC applications.

Methods Summary

Figure 19:
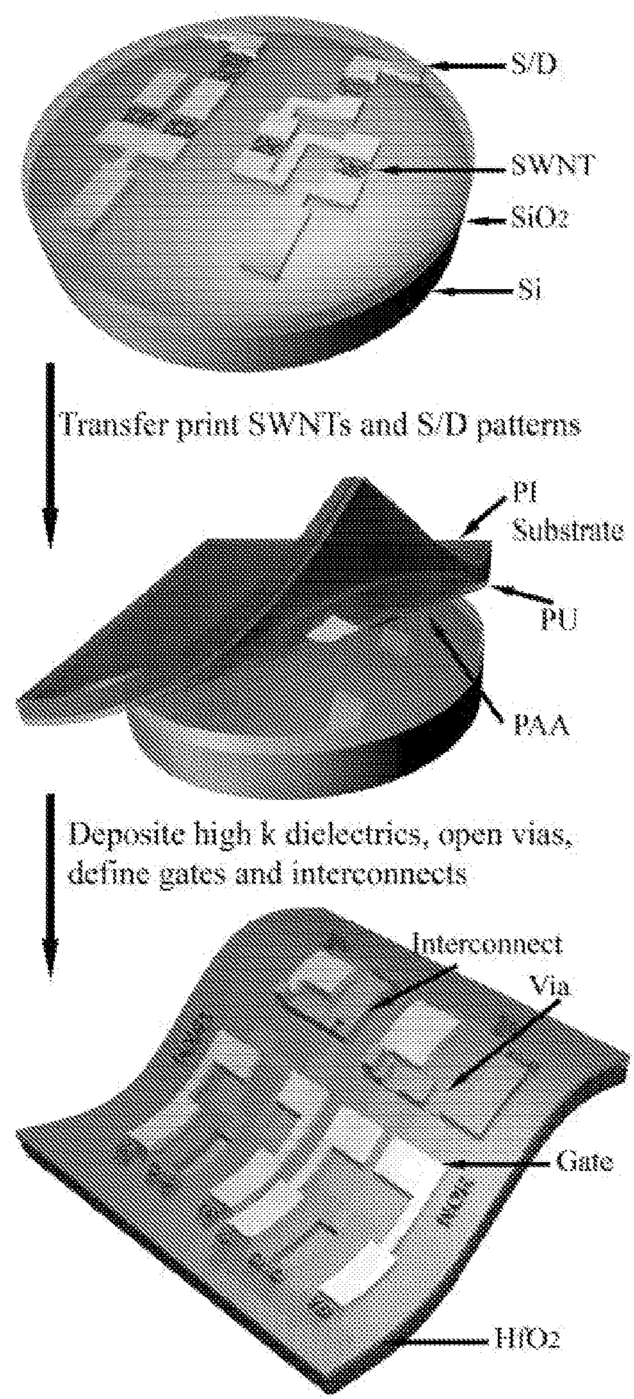
FIG. 19 provides a schematic illustration of the process for fabricating circuits on plastics with transfer-printed single-walled carbon nanotube (SWNT) networks (S/D: Source/Drain electrodes, PI: Polyimide, PU: Polyurethane, PAA: Polyamic acid).

The process flow for fabricating SWNT IC on plastics is depicted in FIG. 19. SWNTs are synthesized by chemical vapor deposition on $SiO_2$/Si wafers and then etched into strips using an experimentally simple, optical soft lithography technique. Standard photolithography, electron-beam evaporation, Au wet chemical etching, and oxygen plasma etching are used to pattern S/D electrodes and isolate each device. A film of polyamic acid (PAA) is then used to encapsulate predefined S/D electrodes and SWNT networks on the growth wafers for transfer to a polyimide (PI) substrate coated with liquid polyurethane (PU). Subsequent curing of the PU and PAA complete the transfer process. Metal gates are defined on top of a high capacitance dielectric layer of $HfO_2$ (~40 nm). Vias and windows for probing are opened by wet etching (dip into concentrated HF aqueous solution) through patterned photoresist. Finally, another level of interconnect metallization formed local interconnections defined previously with the gate and source/drain metal layers. Electrical measurements are carried out in air using a semiconductor parameter analyzer (Agilent 4155C). AC input was provided by a function generator (GWinstek, GFG-8219A) and output was read by a standard oscilloscope (Tektronix, TDS 3012B). The stick percolation simulations involved finite size, first principles two-dimensional numerical models based on generalized random network theory. Device and circuit simulation used the commercial software package HSPICE.

REFERENCES

1. Reuss, R. H. et al. Macroelectronics: Perspectives on technology and applications. Proc. IEEE 93, 1239-1256 (2005).
2. Forrest, S. R. The path to ubiquitous and low-cost organic electronic appliances on plastic. Nature 428, 911-918 (2004).
3. Gelinck, G. H. et al. Flexible active-matrix displays and shift registers based on solution-processed organic transistors. Nat. Mater. 3, 106-110 (2004).
4. Rogers, J. A. et al. Paper-like electronic displays: Large-area rubber-stamped plastic sheets of electronics and microencapsulated electrophoretic inks. Proc. Natl. Acad. Sci. U.S.A. 98, 4835-4840 (2001).
5. Someya, T. et al. Conformable, flexible, large-area networks of pressure and thermal sensors with organic transistor active matrixes. Proc. Natl. Acad. Sci. U.S.A. 102, 12321-12325 (2005).
6. Sekitani, T. et al. A large-area wireless power-transmission sheet using printed organic transistors and plastic MEMS switches. Nat. Mater. 6, 413-417 (2007).
7. Crone, B. et al. Large-scale complementary integrated circuits based on organic transistors. Nature 403, 521-523 (2000).
8. Singh, T. B. & Sariciftci, N. S. Progress in plastic electronics devices. Ann. Rev. Mater. Res. 36, 199-230 (2006).
9. Briseno, A. L. et al. Patterning organic single-crystal transistor arrays. Nature 444, 913-917 (2006).
10. Blanchet, G. B., Loo, Y. L., Rogers, J. A., Gao, F. & Fincher, C. R. Large area, high resolution, dry printing of conducting polymers for organic electronics. Appl. Phys. Lett. 82, 463-465 (2003).
11. Sirringhaus, H. et al. High-resolution inkjet printing of all-polymer transistor circuits. Science 290, 2123-2126 (2000).
12. Avouris, P., Chen, Z. H. & Perebeinos, V. Carbon-based electronics. Nat. Nanotechnol. 2, 605-615 (2007).
13. Bradley, K., Gabriel, J. C. P. & Gruner, G. Flexible nanotube electronics. Nano Lett. 3, 1353-1355 (2003).
14. Zhou, Y. X. et al. p-channel, n-channel thin film transistors and p-n diodes based on single wall carbon nanotube networks. Nano Lett. 4, 2031-2035 (2004).
15. Snow, E. S., Campbell, P. M., Ancona, M. G. & Novak, J. P. High-mobility carbon-nanotube thin-film transistors on a polymeric substrate. Appl. Phys. Lett. 86, 033105 (2005).
16. Seidel, R. et al. High-current nanotube transistors. Nano Lett. 4, 831-834 (2004).
17. Kang, S. J. et al. High-performance electronics using dense, perfectly aligned arrays of single-walled carbon nanotubes. Nat. Nanotechnol. 2, 230-236 (2007).
18. Chimot, N. et al. Gigahertz frequency flexible carbon nanotube transistors. Appl. Phys. Lett. 91, 153111 (2007).
19. Beecher, P. et al. Ink-jet printing of carbon nanotube thin film transistors. J. Appl. Phys. 102, 043710 (2007).
20. Kocabas, C. et al. Experimental and theoretical studies of transport through large scale, partially aligned arrays of single-walled carbon nanotubes in thin film type transistors. Nano Lett. 7, 1195-1202 (2007).
21. Chason, M., Brazis, P. W., Zhang, H., Kalyanasundaram, K. & Gamota, D. R. Printed organic semiconducting devices. Proc. IEEE 93, 1348-1356 (2005).

22. Klauk, H., Zschieschang, U., Pflaum, J. & Halik, M. Ultralow-power organic complementary circuits. Nature 445, 745-748 (2007).

23. Yoon, M. H., Yan, H., Facchetti, A. & Marks, T. J. Low-voltage organic fieldeffect transistors and inverters enabled by ultrathin cross-linked polymers as gate dielectrics. J. Am. Chem. Soc. 127, 10388-10395 (2005).

24. Duan, X. F. et al. High-performance thin-film transistors using semiconductor nanowires and nanoribbons. Nature 425, 274-278 (2003).

25. Kim, D. H. et al. Complementary logic gates and ring oscillators on plastic substrates by use of printed ribbons of single-crystalline silicon. IEEE Trans. Electron Devices 29, 73-76 (2008).

26. Arnold, M. S., Green, A. A., Hulvat, J. F., Stupp, S. I. & Hersam, M. C. Sorting carbon nanotubes by electronic structure using density differentiation. Nat. Nanotechnol. 1, 60-65 (2006).

27. Chen, Z. H. et al. An integrated logic circuit assembled on a single carbon nanotube. Science 311, 1735-1735 (2006).

28. Shim, M., Ozel, T., Gaur, A. & Wang, C. J. Insights on charge transfer doping and intrinsic phonon line shape of carbon nanotubes by simple polymer adsorption. J. Am. Chem. Soc. 128, 7522-7530 (2006).

29. Javey, A., Guo, J., Wang, Q., Lundstrom, M. & Dai, H. J. Ballistic carbon nanotube field-effect transistors. Nature 424, 654-657 (2003).

30. Chen, J., Klinke, C., Afzali, A. & Avouris, P. Self-aligned carbon nanotube transistors with charge transfer doping. Appl. Phys. Lett. 86, 123108 (2005).

Methods

Synthesis of SWNT Network:

SWNT random networks were grown by chemical vapor deposition (CVD) on Si wafers with 100 nm thick layers of thermal oxide. The process began with cleaning the $SiO_2$/Si wafer with piranha solution (A 3:1 volumetric mixture of concentrated sulphuric acid to 30% hydrogen peroxide solution). This process not only removed organic contaminants but also hydroxylated the reoxidized $SiO_2$ surface, making it extremely hydrophilic to enable uniform deposition of catalyst.[31] This catalyst consisted of ferritin (Aldrich, diluted by deionized water at a volumetric ratio of 1:20 to control the density of catalyst) deposited onto the $SiO_2$/Si surface by adding methanol.[32] The wafer was then heated to 800° C. in a quartz tube to oxidize ferritin into iron oxide nanoparticles. After cooling down to room temperature, the quartz tube was flushed with a high flow of argon gas (1500 sccm) for cleaning and then heated up to 925° C. in hydrogen atmosphere (120 sccm), which reduced iron oxide to iron. After reaching 925° C., methane (1500 sccm) was released into the quartz tube as carbon source while maintaining the hydrogen flow. Growth was terminated after 20 min, and the chamber was then cooled in hydrogen and argon flow. The density of the SWNT networks formed in this fashion was controlled by the dilution ratio of the ferritin solution, while leaving the other aspects of the growth and processing unchanged.

Cutting Strips into the SWNT Networks with Phase Shift Lithography and Reactive Ion Etching:

Elastomeric phase masks with depths of 1.8 μm, widths of 5 μm and periodicity of 10 μm were fabricated from relief structures defined by lithography and anisotropic etching through a casting and curing procedure.[33] AZ5214 photoresist, diluted with AZ1500 thinner in a 1:1 volumetric ratio, was spin casted onto $SiO_2$/Si wafer with SWNT networks at 5,000 rpm and then baked at 95° C. for 1 min to afford a flat and solid 300 nm thick photoresist layer. After cleaning the surface of phase mask with scotch tape, we placed it into conformal contact with the photoresist layer, flood exposed the resist by shining the i-line (365 nm) output of a Hg ultraviolet (UV) lamp through the mask, and then removed the mask. The $SiO_2$/Si substrate was then baked at 112° C. for another minute, followed by a flood exposure of UV light. Developing in AZ MIF327 developer for 40 s created a regular array of submicron wide spacings in the photoresist layer, with 5 μm periodicity. 5 μm wide photoresist strips could also be generated by conventional photolithography with much wider spacings (~5 μm). Although large spacings lead to reduction in effective channel width and increase in parasitic capacitance, we utilized it instead of phase shift lithography in fabricating transistors used in decoder circuits as conventional photolithography is easier to perform. After that oxygen reactive ion etching (200 mTorr, 20 sccm, $O_2$ flow, 100 W Radio Frequency power) removed the exposed SWNTs. Finally, the photoresist layer was removed by soaking in acetone for one hour. Successfully utilizing optical soft lithography to pattern the only sub-10 μm features in our circuits suggests the potential to use low cost, low resolution printing-like processes to define all features in the circuits.[34]

Source/Drain (S/D) Patterning and Device Isolation:

A gold film (30 nm) was deposited by electron-beam evaporation (Temescal BJD 1800; base pressure of $3\times10^{-6}$ Torr) onto a $SiO_2$/Si substrate with predefined nanotube strips. We then used standard UV photolithography to pattern the S/D electrodes and interconnects using an etch-back scheme with a commercial wet etchant (TFA, Transcene Co.) to remove gold in exposed areas. We then used oxygen reactive ion etching (200 mTorr, 20 sccm, $O_2$ flow, 100 W Radio Frequency power) to remove SWNTs outside of channel regions that were protected by a patterned layer of photoresist (Shipley 1805).

This step can also be carried out on the plastic substrate after transfer, which avoids the dimensional instability associated with polymer shrinkage in curing process and the device failure due to incomplete transfer of S/D electrodes. However, it will lead to inferior device performances, due to synergetic effect of smaller contact area between S/D electrodes and partially embedded SWNTs as well as smaller effective channel width when we use photolithography to defines SWNT strips as described above on relatively rough (compared with surface roughness of Si wafers) polymer surface (FIG. 14). Therefore, this approach is only utilized in fabricating row-decoder circuits, which has the highest requirements on device yield.

Transfer Printing Process:

The transfer printing process involved spin casting (1,500 rpm, 60 s) polyamic acid (PAA, Aldrich) onto the $SiO_2$/Si wafer with SWNTs and S/D patterns, and then heating at 110° C. for 3 min to remove the solvent. On the target polyimide (PI) substrate (Kapton E, thickness ~50 μm, DuPont Co.), we spin cast (5,000 rpm, 60 s) a film of polyurethane (PU, NEA 121). Before this step, we thermally cycled the PI between 30° C. and 270° C. to improve its dimensional stability.[35] We laminated this PU coated substrate on top the PAN SiO2/Si wafer with PU facing toward the PAA film and applied pressure on back of the wafer to remove air bubbles. Heating them together to 135° C. for 30 min thermally cured the PU film, thereby binding the PI substrate to the PAA film. Peeling off the PI substrate lifted the film of PU/PAA with embedded SWNT networks and S/D electrodes off the $SiO_2$/Si wafer, with one side of S/D electrodes exposed. In the final step a vacuum oven (base pressure of 300 mTorr) with nitrogen flow (500 sccm) was used to thermally cure the PAA to PI through imidization reaction.[36]

Gate Dielectric Deposition:

The gate dielectric was deposited on top of the PAA after curing to PI. In the first step, 30 nm of $HfO_2$ was deposited by electron-beam evaporation (Temescal BJD 1800; base pressure of $2\times10^{-6}$ Torr) at a relatively low deposition rate (<0.5 Å/s) as measured by a quartz crystal thickness monitor. This layer served as a protective layer for SWNTs against highly reactive precursors used in a subsequent atomic layer deposition (ALD) process.[37] After evaporation, the sample was transferred immediately to the ALD chamber to preserve the hydrophilicity of freshly deposited $HfO_2$, which facilitates the growth of high quality pin-hole free ALD film. The ALD $HfO_2$ film (12 nm) was deposited with a commercial ALD reactor (Savannah 100, Cambridge Nanotech. Inc.). One ALD reaction cycle consists of one dose of water followed by 5 s exposure and 300 s purge and then one dose of $Hf(NMe_2)_4$ followed by another 5 s exposure and 270 s purge. During deposition, the nitrogen flow was fixed at 20 sccm and the chamber temperature was set at 120° C. The low deposition temperature prevents cracking of $HfO_2$ due to thermal expansion coefficient mismatch but requires very long purging time to remove excess precursors absorbed on the surface to prevent CVD type reactions in the chamber.[38]

Via Opening and Gate/Interconnect Pattering:

After depositing the dielectric, the gate pattern was defined by another photolithography step. A lift-off scheme was used to allow alignment of gate electrodes to S/D using previously patterned alignment markers. Metal for the gate electrodes (120 nm Al or 2 nm Cr/120 nm Au) was deposited by electron-beam evaporation (Temescal BJD 1800; base pressure of $3\times10^{-6}$ Torr). In this metallization step, as well as the next step for defining interlayer interconnects, two angled evaporations (incidence angle=60°) with substrates placed at opposite orientations and a blanket evaporation (incidence angle=90°) were performed to insure that the metal layers covered the underlying surface topography, thereby avoiding open points that would otherwise form in the interconnect lines. In all cases, the deposition rate must be within 4~7 Å/s. If the evaporation rate is lower than 4 Å/s, heat accumulated can lead to cracking of the PU layer; if the evaporation rate is higher than 7 Å/s, the strain accumulated in the metal film can lead to defect formation in the lift-off process.

Following deposition, the lift-off was accomplished by soaking in acetone for 10 min, followed by a short ultrasonic treatment (30 s) to assure that the lift-off process was complete. Since the SWNTs were covered by $HFO_2$, the ultrasonic treatment did not damage the nanotube network. (Prolonged acetone soaking can dissolve, at a low rate, the PI cured from PAA due, presumably, to incomplete imidization.) Contact pads for probing and vias for interlayer interconnects were exposed by photolithography using AZ 5214 photoresist. A hard bake (120° C., 2 min) of the photoresist was performed before hydrofluoric acid etching (4 s in concentrated HF solution) of $HfO_2$[39] to improve the adhesion between photoresist and $HfO_2$. Note here that the Au pads patterned in S/D layer under vias must be larger in size than via holes to protect PU from being etched by HF in this step through acidolysis reaction. The interlayer interconnect (5 nm Cr/100 nm Au) was patterned using a lift-off process and photolithography. The patterning of gate electrodes and interconnects were carried out separately because 1) the predefined gate layer can also serve as a protective layer for gate dielectric against possible defects existing in the photoresist mask layer to prevent creating pin-holes in channel region in wet etching step, and 2) aluminum tends to form a poor contact to the gold S/D electrodes, possibly due to intermetallic formation,[40] such that a different interconnect metal, such as Cr/Au, was necessary when using Al gates. Finally, the completed device/circuit was aged in air for 24 hours, followed by a thermal anneal at 120° C. for 30 min, to achieve stable operation.

Device and Circuit Characterizations:

DC measurements of SWNT transistors and circuits were carried out in air using a semiconductor parameter analyzer (Agilent 4155C), operated by Agilent Metrics I/CV Lite program and GBIP communication. Triaxial and coaxial shielding was incorporated into a Signatone probe station to achieve better signal/noise ratio. An Agilent 4282A precision LCR meter was used for capacitance and impedance measurements. AC input signals were generated by a function generator (GWinstek, GFG-8219A). The output signals were measured using a standard oscilloscope (Tektronix, TDS 3012B).

Stick-percolation Simulation: We constructed a sophisticated first-principle numerical stick-percolation model for the above random CNT network by generalizing the random-network theory.[20,41,42] The model randomly populates a 2D grid by sticks of fixed length ($L_S$) and random orientation (θ) and determines $I_{ON}$ through the network by solving the percolating electron transport through individual sticks. In contrast to classical percolation, the CNT network is a heterogeneous network: ⅓$^{rd}$ of the CNTs are metallic and remaining ⅔$^{rd}$ are semiconducting. Since, $L_C$ and $L_S$ are much larger than the phonon mean free path; linear-response transport obviates the need to solve the Poisson equation explicitly. The system is well described by drift-diffusion theory within individual stick segments of this random stick-network. The low bias drift-diffusion equation, $J=q\mu n\, d\phi/ds$, when combined with current continuity equation, $dJ/ds=0$, gives the non-dimensional potential $\phi_i$ along tube i as $$\frac{d^2\varphi}{ds^2} - C_{ij}(\varphi_i - \varphi_j) = 0 \tag{1}$$

Here, s is the length along the tube and $C_{ij}=G_0/G_1$ is the dimensionless charge-transfer coefficient between tubes i and j at their intersection point, and $G_0$(~0.1 $e^2/h$) and $G_1$(=$qn\mu/\Delta x$) are mutual- and self-conductance of the tubes, respectively. Here, n is carrier density, μ is mobility and Δx is grid spacing. The density (D) of the random stick network is measured in /μm$^2$ and the density of the SWNT network ~20/μm$^2$ according to SEM measurements.

SPICE Simulation:

The behavior of SWNT TFTs is described as a PMOS field-effect transistor (FET) parallelly connected with a voltage ($V_{GS}$ and $V_{DS}$) dependent exponential current source. The p-FET is modeled using standard square law model with channel length modulation and source-drain resistance effects in consideration. The exponential current source is utilized to mimic the ambipolar current which leads to exponential increase in $I_{off}$ with increasing $V_{DS}$. The exponential term is expressed in form of Taylor's series, $$I_{ambipolar} = K_n * (V_{GS} + V_{G0}) * \left(1 + V_x + \frac{V_x^2}{2} + \dots\right)$$

where $V_x$ is defined as $V_x=V_{threshold}+\alpha V_{GS}-\beta V_{DS}$, and first three terms are incorporated in the SPICE model. All fitting parameters are extracted from measured I-V characteristics (summarized in Table 1). The channel length scaling behavior of these SWNT random network transistors can only be captured by percolation modeling. The results of such models (e.g. off state resistances) can be used as inputs to the SPICE models to capture the full range of behaviors.

TABLE 1

Fitted SPICE Model Parameters

| Component | Parameter | Value |
|---|---|---|
| Voltage Controlled Current Source | $V_{threshold}$ | −4 V |
| | $\alpha$ | 0.45 |
| | $\beta$ | 3 |
| | $K_N$ | $10^{-9}$ |
| | $V_{G0}$ | 1 V |
| p-FET | $\lambda$ | 0.1 |
| | $V_T$ | −0.4 V |
| | $K_P$ | 20 $\mu A/V^2$ |
| | $R_S$ | 11 KΩ |
| | $R_D$ | 11 KΩ |

Figure 20:
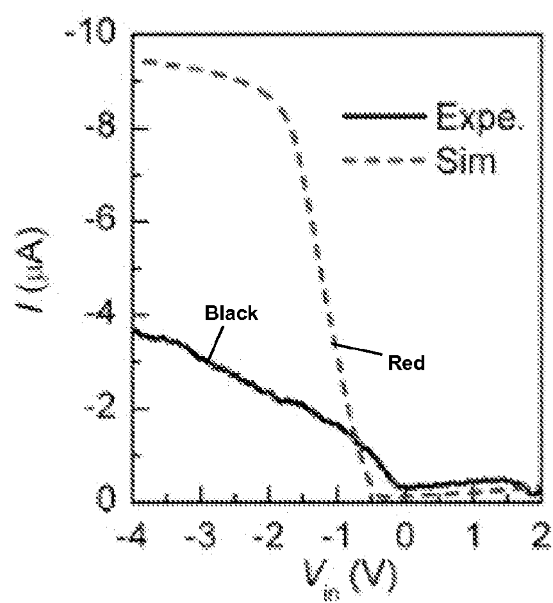
FIG. 20 provides a plot of measured (solid line) and simulated (dashed line) dependence of inverter current load (I) on input voltage ($V_{in}$).

The above model was then utilized in designing and simulating digital logic circuits.[43] In time response simulation, load capacitance is calculated automatically from measured overlap capacitance (330 $nF/cm^2$) and gate capacitance (80 $nF/cm^2$) as well as estimated contact resistance (11 KΩ) by HSPICE program. Although the measured voltage responses of fabricated circuits agree well with designing specifications, the current load responses show behavior only qualitatively similar to simulation results as shown in FIG. 20. This deviation may come from relatively large batch-to-batch variations in device performances, which influences the current load more significantly.

Supplementary Discussion

Scaling Analysis of SWNT TFTs

Channel length ($L_C$) scaling properties of SWNT Thin-film Transistors (TFTs) are explored prior to successful circuit design and integration. The device on current scales linearly with $L_C$, which can be easily understood since the channel width only changes the number of the stripes in the channel. FIG. 12*a* shows the transfer characteristics of an array of SWNT TFTs with different $L_C$s. The $L_C$ normalized on resistance under different gate voltages increase linearly with the decrease of $L_C$s (FIG. 12*a*, inset). The contact resistance, as determined from the y axis intercept, is much smaller compared to the channel resistance, which indicates that these transistors are not contact limited. FIG. 12*b* presents the effective mobility ($\mu_{eff}$) and device on/off ratio ($I_{on}/I_{off}$) as a function of $L_C$. $\mu_{eff}$ decreases only slightly at small $L_C$s, confirming that the Schottky barrier between SWNT and Au has limited effects on device performance. More importantly, $\mu_{eff}$ and threshold voltage ($V_T$) extracted from linear region and saturation region doesn't show significant difference (FIG. 12*b* & *c*). It is an advantage compared with devices built on organic transistors, whose mobility is dependent on gate voltage as a result of their variable range hopping transport mechanism.[44] Device on/off ratios show, on the other hand, very strong variation with $L_C$, increasing sharply and then gradually saturating for $L_C$ larger than 50 μm. This correlation derives from purely metallic pathways between Source/drain (S/D) electrodes that increase in number with decreasing $L_C$, for a given tube density and average tube length. These variations are quantitatively consistent with percolation modeling. The decrease of on/off ratio at high $V_{DS}$ bias is caused by band-to-band tunneling current and the off current can be reduced through doping scheme reported for single SWNT devices.[45] In conclusion, the scaling properties of SWNT TFTs allow us to predict properties of a given SWNT TFT based on measurements performed on another device with different geometries, which forms the basis for our rational circuit design efforts.

Gate Capacitance of SWNT TFTs

Figure 13:
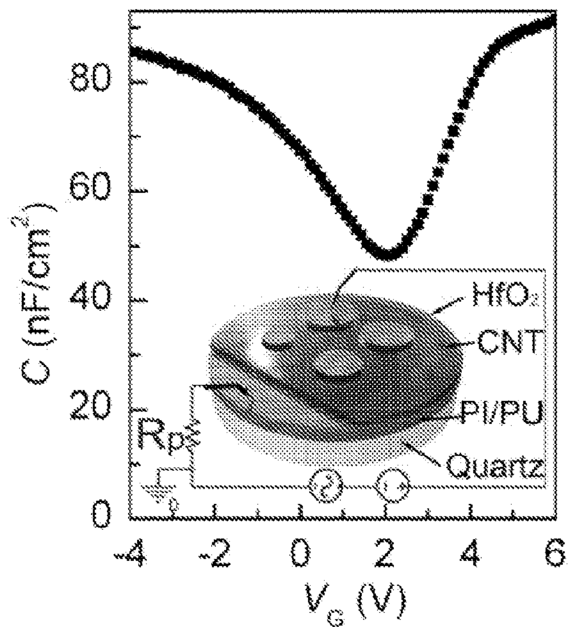
FIG. 13 shows capacitance-voltage characteristics of a dish-shaped metal-insulator-semiconductor capacitor formed by gold, $HfO_2$, and SWNT network. The inset shows a schematic of the capacitor array (CNT: Carbon nanotube, $R_P$: Parasitic resistance).

Gate capacitance is a crucial parameter for transistors, serving as the basis to extract effective field effect mobility and estimate the transient behavior of transistors/circuits. Here we demonstrate the first direct capacitance measurements of SWNT random networks. We used a structure similar to the layout of the present SWNT TFTs, where the capacitor forms between the top round-shaped electrodes and the nanotube network beneath it (FIG. 13, Inset). The measurements were performed at 100 kHz under serial connection model because the leakage current is small but the contact resistance, especially the contact resistance between SWNTs and Au electrodes is significant. Measured capacitance-voltage (C-V) characteristics closely resemble previous results based on individual tubes, with symmetric C-V curves in the depletion region and accumulation region reflecting the underlying band structure symmetry of SWNTs (FIG. 13).[46] The dip of capacitance at the device off state is wide and shallow, possibly due to the diameter distribution of nanotubes in the network. The measured gate capacitance, 85 $nF/cm^2$, is about one third of measured thin film capacitance of 42 nm thick $HfO_2$, which is in good agreement with previous modeling results.[47]

Distribution of Device On/off Ratios

Compared with other device parameters, the on/off ratios show much larger variation, as shown in FIG. 9*f* and FIG. 14. The origin of this distribution is likely due to electron injection current, from the slightly ambipolar nature of the device operation. Devices with high electron conduction current generally have low on/off ratios and, as a consequence, larger subthreshold slopes (FIG. 14*a*).

The Dependence of Off-state Current ($I_{off}$) on Drain-source Voltage ($V_{DS}$)

The p-channel SWNT top-gate transistors show slight ambipolar behavior. As a result, $I_{off}$ contains, in general, contributions from electron injection and transport through semiconducting pathways through the networks as well as ohmic transport of electrons through metallic pathways.[48] For devices with long channel lengths, whose on/off ratio is high (~>1000) for low $V_{DS}$, metallic tube paths do not exist or are very few. In this case, $I_{off}$ mainly comes from undesired electron injection. This behavior leads to superlinear increases in $I_{off}$ with linearly increasing $V_{DS}$ as shown in FIG. 15*a*. By contrast, for devices with small channel lengths, which usually have low on/off ratio even for low $V_{DS}$, metallic pathways become the dominant contributor to $I_{off}$. Here, $I_{off}$ increases linearly with $V_{DS}$, as shown in FIG. 15*b*.

Distribution of Effective Device Mobility and Subthreshold Swing

Figure 16:
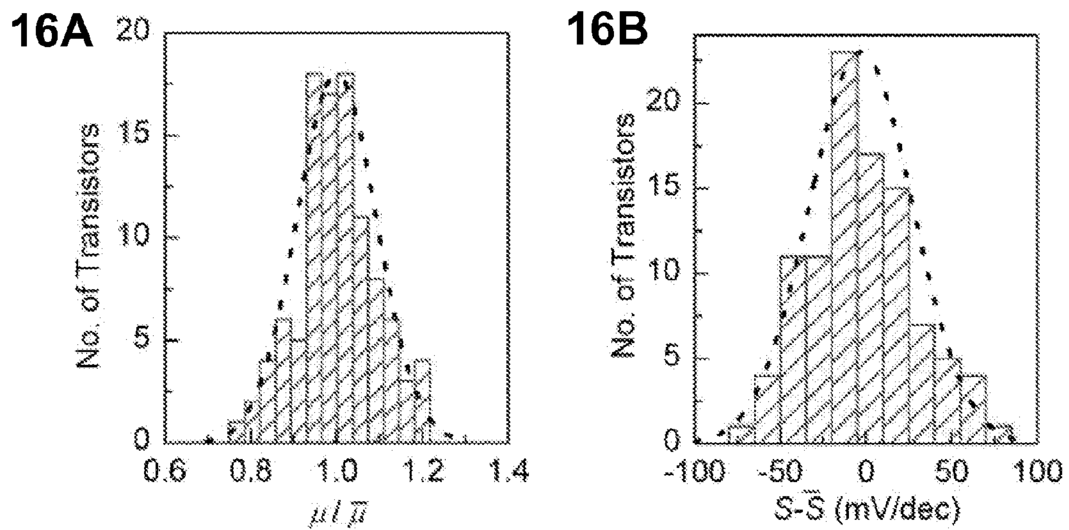
FIG. 16 provides histograms of normalized mobilities ($\mu/\overline{\mu}$) (16A) and subthreshold swing variations ($S-\overline{S}$) (16B) determined from measurements of over 100 SWNT transistors. (The bars over the quantities μ and S refer to average values and the dotted lines represent Gaussian fits to the data.)

The distribution of effective device mobility (μ) and subthreshold swing (S) were examined through measurements on more than 100 devices (channel length 100 μm, channel width 200 μm), as summarized in FIG. 16. Standard deviations of ~10% for μ and ~15% for S are observed, which are sufficient for most envisioned applications of flexible electronics.

Switching Speed Characteristics of the Four-bit Decoder Circuit

The operation speed of the decoder circuit was characterized by measuring one output signal with one alternating current input. Results show that the decoder can be successful switched in kHz regime, with a T≈50 μs rise time and a T≈100 μs fall time (FIG. 17). The experimental results agree reasonably well with time domain simulation results based on previously described SPICE model for SWNT TFTs.

Operational Stability Test of SWNT TFTs

Figure 18:
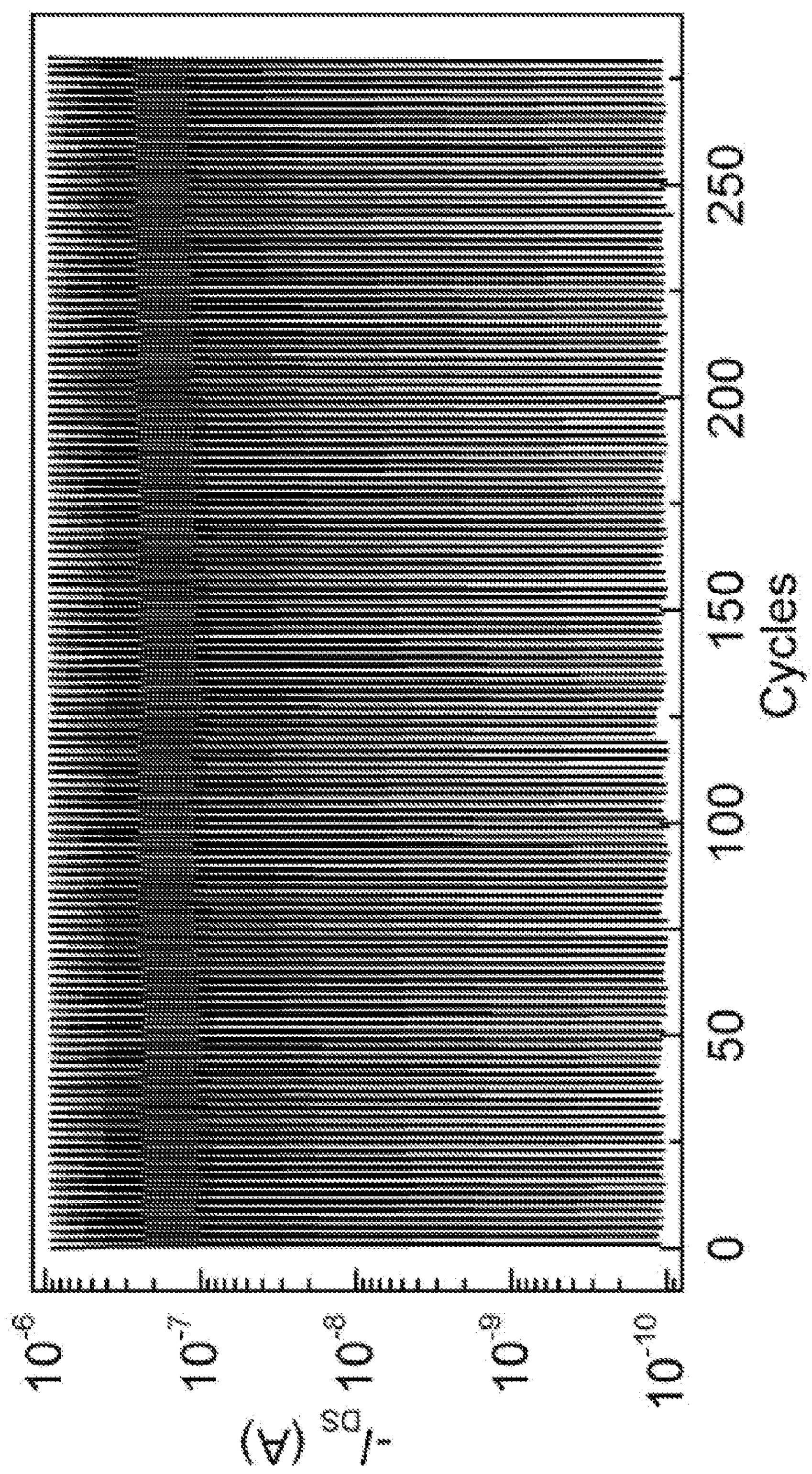
FIG. 18 provides a plot of drain-source current ($I_{DS}$) of a typical SWNT thin-film transistor modulated by a triangle waveform (−2 V to 0 V) applied to the gate with a constant drain-source bias (−0.2 V), showing the operational stability of SWNT devices in air.

Good stability is observed in the top-gate SWNT transistors as illustrated by data in FIG. 18. These measurements involved electrically cycling the devices in ambient conditions (relative humidity≈90% and T=20° C.~25° C.) between $V_{GS}$=−2 and 0 V at $V_{DS}$=−0.2 V. The data indicate negligible changes in Ion or on/off ratio for more than two hundred cycles.

Estimation of Some Properties of SWNT TFTs

Estimated total number of SWNTs involved in transport for a typical device:

$$N = \frac{W}{L_S} \cdot \frac{L_C}{L_S} \cdot D = \frac{200}{7} \times \frac{100}{7} \times 40 = 1.6 \times 10^4 \text{ tubes}$$

where W is channel width, $L_C$ is channel length, $L_S$ is average tube length and D is area nanotube density normalized by $L_S$ respectively.

Estimated total surface coverage by SWNTs in channel region:

$$\rho = \frac{N \cdot d_{NT} \cdot L_S}{W \cdot L_C} = \frac{1.6 \times 10^4 \text{ tubes} \times 1.5 \text{ nm} \times 5 \text{ μm}}{200 \text{ μm} \times 100 \text{ μm}} = 0.6\%$$

where N is number of nanotubes in channel region, and $d_{NT}$ is nanotube diameter.

Estimated cut-off frequency of a device:

$$f_T = \frac{g_m}{2\pi(C_i + C_{parasitic})} = \frac{0.12 \text{ μS/μm} \times 200 \text{ μm}}{2\pi(85 \text{ nF/cm}^2 \times 200 \text{ μm} \times 50 \text{ μm} + 330 \text{ nF/cm}^2 \times 200 \text{ μm} \times 12 \text{ μm})} = 230 \text{ KHz}$$

where $g_m$ is transconductance, $C_i$ is gate capacitance, and $C_{parasitic}$ is source/drain-gate overlap capacitance respectively.

REFERENCES

31. Plummer, J. D., Deal, M. D. & Griffin, P. B. Silicon VLSI Technology: Fundamentals, Practice and Modeling (Prentice Hall, Upper Saddle River, N.J., 2002).

32. Li, Y. M. et al. Growth of single-walled carbon nanotubes from discrete catalytic nanoparticles of various sizes. J. Phys. Chem. B 105, 11424-11431 (2001).

33. Maria, J., Malyarchuk, V., White, J. & Rogers, J. A. Experimental and computational studies of phase shift lithography with binary elastomeric masks. J. Vac. Sci. Technol. B 24, 828-835 (2006).

34. Menard, E. et al. Micro- and nanopatterning techniques for organic electronic and optoelectronic systems. Chem. Rev. 107, 1117-1160 (2007).

35. Zhou, L. S., Jung, S. Y., Brandon, E. & Jackson, T. N. Flexible substrate microcrystalline silicon and gated amorphous silicon strain sensors. IEEE Tran. Electron Device 53, 380-385 (2006).

36. Brekner, M. J. & Feger, C. Curing Studies of a Polyimide Precursor .2. Polyamic Acid. J. Polym. Sci. Pol. Chem. 25, 2479-2491 (1987).

37. Javey, A. et al. High-kappa dielectrics for advanced carbon-nanotube transistors and logic gates. Nat. Mater. 1, 241-246 (2002).

38. Hausmann, D. M., Kim, E., Becker, J. & Gordon, R. G. Atomic layer deposition of hafnium and zirconium oxides using metal amide precursors. Chem. Mat. 14, 4350-4358 (2002).

39. Fujii, S., Miyata, N., Migita, S., Horikawa, T. & Toriumi, A. Nanometer-scale crystallization of thin HfO2 films studied by HF-chemical etching. Appl. Phys. Lett. 86, 212907 (2005).

40. Philofsk. E. Intermetallic Formation in Gold-Aluminum Systems. Solid-State Electron. 13, 1391-& (1970).

41. Kumar, S., Murthy, J. Y. & Alam, M. A. Percolating Conduction in Finite Nanotube Networks. Phys. Rev. Lett. 95, 066802 (2005).

42. Pimparkar, N. et al. Current-voltage characteristics of long-channel nanobundle thin-film transistors: A "bottom-up" perspective. IEEE Electron Device Lett. 28, 157-160 (2007).

43. Rabaey, J. M. Digital Integrated Circuits: A Design Perspective (Prentice Hall, Upper Saddle River, 2002).

44. Vissenberg, M. & Matters, M. Theory of the field-effect mobility in amorphous organic transistors. Phys. Rev. B 57, 12964-12967 (1998).

45. Chen, J., Klinke, C., Afzali, A. & Avouris, P. Self-aligned carbon nanotube transistors with charge transfer doping. Appl. Phys. Lett. 86, 123108 (2005).

46. Ilani, S., Donev, L. A. K., Kindermann, M. & McEuen, P. L. Measurement of the quantum capacitance of interacting electrons in carbon nanotubes. Nat. Phys. 2, 687-691 (2006).

47. Cao, Q. et al. Gate capacitance coupling of singled-walled carbon nanotube thin-film transistors. Appl. Phys. Lett. 90, 023516 (2007).

48. Radosavljevic, M., Heinze, S., Tersoff, J. & Avouris, P. Drain voltage scaling in carbon nanotube transistors. Appl. Phys. Lett. 83, 2435-2437 (2003).

Example 2

Theory and practice of "Striping" for Improved ON/OFF Ratio in Carbon Nanonet Thin Film Transistors Abstract A new technique to reduce the influence of metallic carbon nanotubes (CNTs)—relevant for large-scale integrated circuits based on CNT-nanonet transistors—is described and verified. Historically, electrical and chemical filtering of the metallic CNTs have been used to improve the ON/OFF ratio of CNT-nanonet transistors; however, the corresponding degradation in ON-current has made these techniques somewhat unsatisfactory. Here, we diverge significantly from the classical approaches in favor of a new approach based on relocation of asymmetric percolation threshold of CNT-nanonet transistors by a technique called "striping"; this allows fabrication of transistors with ON/OFF ratio >1000 and ON-current degradation no more than a factor of 2. We offer first principle numerical models, experimental confirmation, and renormalization arguments to provide a broad theoretical and experimental foundation of the disclosed methods and device configurations.

Introduction

Figure 21:
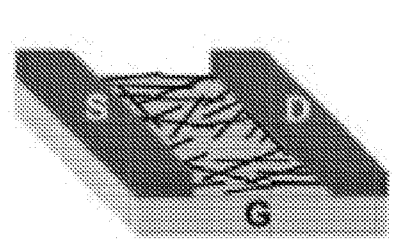
FIG. 21 (a) Schematic illustration showing the CNT nanonet thin film transistor. (b) SEM images of the network before and after striping. The stripes are etched using the oxygen plasma process. The scale bar in both SEM images is 5 μm. (c) Nanonet with density ($D_{CNT}$) higher than the percolation threshold ($D_P$), but m-CNT density ($D_M$) less than $D_P$. The right panel is a plot of conductance (σ) vs density ($D_{CNT}$) illustrating various densities. The conductance is negligible if the density is below percolation density. (d) Nanonet with $D_{CNT}>D_M>D_P$. (e) Striped nanonet obtained from that in (d). As the striping breaks conducting paths, the entire solid curve in the right panel shifts to the dotted curve.
Figure 21:
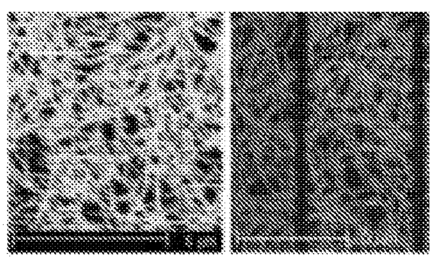
Figure 21:
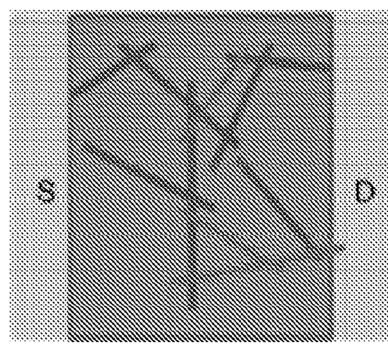
Figure 21:
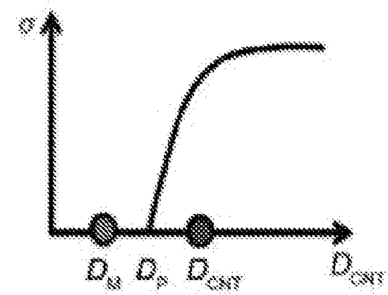
Figure 21:
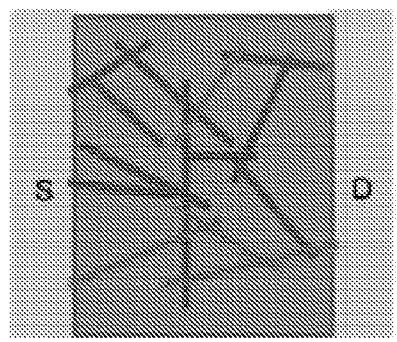
Figure 21:
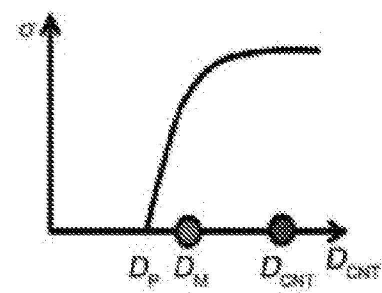
Figure 21:
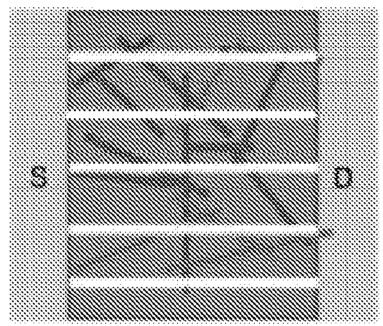
Figure 21:
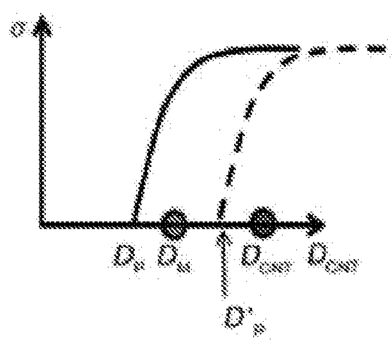

Since the year 2000, there have been many reports of a new class of devices called nanonet network thin-film transistors (NN-TFTs), whose channel material is composed of nanocomposites of carbon nanotubes (CNTs) or Si/ZnO nanowires (NWs) (FIGS. 21(*a*) and 21(*b*)) [1-11]. It has often been suggested that this technology might be a higher performance alternative to now-dominant amorphous silicon (a-Si) and polysilicon (poly-Si) technologies for applications in flexible electronics, transparent displays, etc. While the progress has been rapid—especially for CNT NNTFTs, evolving from single resistors to RF transistors within a span of a few years—there has been a persistent perception that large scale integration of CNT NN-TFT technology will be challenging (if not impossible) due to "contamination from metallic tubes" [12, 13].

It is well known that in a typical ensemble of CNTs, approximately two-thirds of the tubes are semiconducting and one-third metallic [14]. Since the conductivity of the metallic tubes cannot be controlled by gate voltage, the ON/OFF ratio of short channel transistors—where a proportionate fraction of both metallic and semiconducting tubes bridge the source (S) and drain (D) directly—cannot exceed ~3. This ratio is unacceptably small for large scale integration of transistors that demand an ON/OFF ratio of at least ~$10^3$-$10^4$. Such a high ON/OFF ratio is possible for longer channel CNT NN-TFTs where individual tubes do not thread the S/D directly, so that carriers must percolate from source to drain by hopping through a percolating path of a network of sticks. As long as the percolation threshold ($D_P$, see FIG. 21(*c*)) is smaller than the density of CNTs ($D_{CNT}$) but larger than that of the metallic tubes ($D_M$), all percolation paths from S/D must involve the at least one semiconducting segment. Gate modulation of this "weakest-link" ensures high a ON/OFF ratio.

There are however three specific challenges to this approach of ensuring a high ON/OFF ratio for all transistors in an integrated circuit (IC): First, the requirement that $D_M<D_P<D_{CNT}$ dictates use of relatively low-density nets with correspondingly reduced ON-currents. Second, since an IC typically includes transistors of various channel lengths ($L_C$), widths ($W_C$), and stick length ($L_{stick}$) and since the finite size percolation threshold depends on $L_C$, $W_C$, and $L_{stick}$ (i.e., $D_P=f(W_C,L_C,L_{stick})$) [15], ensuring $D_M<D_P<D_S$ requires $L_C$- and $W_C$-specific tailoring of $L_{stick}$ for every group of transistors. Otherwise, the shift in $D_P$ could violate $D_M<D_P<D_S$ and degrade the ON/OFF ratio to unacceptably low values. Even if a combination of such stick lengths could be produced, solution processing precludes delivery of tubes of specific lengths to specific transistors. Third and finally, $L_{stick}$ of CNTs produced by classical techniques is not monodisperse and the inherent statistical distribution of $L_{stick}$ in as-processed CNTs translates to a statistical distribution of $D_P$ in various transistors across the IC. Once again, the distribution of $D_P$ enhances the probability of accidental shorts in one of the many transistors in the IC [13], which would render the entire IC non-functional.

To solve this "metallic-contamination" issue and to address the three limitations of NN-TFTs discussed above, researchers have developed several "purification" techniques to ensure $D_S/D_M>>2$ [16]. Briefly, these techniques include removal of metallic CNTs (m-CNTs) by chemical [17] or mechanical means prior to device fabrication [18] or in situ resistive [12, 19] and inductive filtering of the m-CNTs after fabrication of the transistors [20]. There is a debate whether chemical filtering modifies the properties of remaining semiconducting CNTs (s-CNTs), because device properties of such purified films have not been reported in Ref. [21]. On the other hand, both resistive and inductive filtering has been shown to degrade ON-current significantly (because the protocol burns at least some s-CNTs along with m-CNTs) [20]. Moreover, it is not clear if the technique is scalable because while it is possible to burn m-CNTs in individual transistors by turning off the s-CNTs by gate bias and by adjusting the drain voltage, it is not clear how to translate this protocol to an IC configuration where the electrodes are interconnected and there is only a limited access to individual transistors.

In this Example, we describe the theory and demonstration of a new in situ technique called "striping" that simultaneously addresses the three concerns of "metallic contamination" discussed above. This method has also been recently used to demonstrate the first practical medium scale circuit using NN-TFTs [1]. Striping is based on the idea that instead of reducing $D_M$ to address the "metallic contamination" problem, one might alternatively tailor $D_P$ for individual transistors to solve the problem of ON/OFF ratio. In simple terms, since $D_P$~$k/L^2_{stick}$ [22] (where k is a constant), $D_P$ can be modified by tailoring $L_{stick}$. This modification of $D_P$ cannot be done prior to fabrication of the devices, because each $L_C$ requires a different $L_{stick}$, as discussed above. This modification is also difficult to achieve after device fabrication, because one cannot possibly find and cut to size all the randomly oriented tubes after fabrication. Striping resolves this dilemma by recognizing that percolation theory requires that $L_{stick}$ in the expression for $D_P$ refers to effective tube length and so long as the "average" tube-length $<L_{stick,eff}>$ is reduced by any means, the in situ transistor-specific modification of percolation threshold can be easily achieved.

Briefly, the technique of striping involves the procedure shown in FIG. 21(*a*). As used in FIG. 21 source electrode is designated as "S", drain electrode is designated as "D" and gate electrode is designated as "G". Given a high-density CNT network of a given $L_C$, $L_{stick}$, and $D_S/D_M$, striping involves defining specific channel width ($W_{stripe}$) in strips. Striping reduces $L_{stick}$ of a fraction of tubes near the stripe, which in turn translates into an overall reduction in effective $<L_{stick,eff}>$ in the channel. This procedure—as we have mentioned before—allows transistor-specific modulation in $D_P$ of the transistors. Intuitively speaking, in a transistor with a density of tubes above the percolation threshold (see FIG. 21(*d*)), there are many parallel paths carrying current from source to drain. In the striping method, the goal is to break these paths (FIG. 21(*e*)) by using finite stripes for individual transistors. Note that striping not only solves the $L_C$-specific percolation problem, but also reduces the intrinsic process-induced fluctuation of $D_P$ due to the distribution of $L_{stick}$. The reduced spread of $D_P$ reduces the chances of accidental shorting of S/D in large scale ICs.

It is obvious from the above discussion that the critical element of the striping is the definition of stripe width $W_{stripe}$ as a specific function of $L_C$, $L_{stick}$, and $D_{CNT}$. Below we use the stick percolation model to develop a prescription for $W_{stripe}$ and then validate our predictions by systematic experiments.

1. Theoretical Models and Summary of the Fabrication Process

We constructed a sophisticated first principles numerical stick percolation model for NN-TFTs by generalizing the random-network theory which has been described in several earlier publications [8, 22, 23]. Briefly, the model randomly populates a two-dimensional (2-D) grid by sticks of fixed length ($L_{stick}$) and random orientation (a), and determines the ON-current $I_{ON}$ through the network by solving the percolating electron transport through individual sticks. In contrast to classical percolation of homogenous sticks, the NN-TFT is a heterogeneous network: as noted above, one-third of the CNTs are metallic and remaining two-thirds are semiconducting. Since $L_C$ and $L_{stick}$ are much larger than the phonon mean free path, linear-response transport within individual stick segments of this random stick-network system is well described by drift-diffusion theory [8]. Also, small source drain voltage ($V_{SD}$) and gate valtage ($V_G$) obviate the need to solve the Poisson equation explicitly.

The key difference between the previously published models and the model used in this Example is this: Typically the width of the simulation domain is much smaller than the actual width of the transistors. Previously, this necessitated the use of periodic boundary conditions (PBC) for all sticks that crossed the edge of the transistors. Finite width $W_{stripe}$ related effects are fundamental to the operation of the transistors produced through striping and as such these transistors can no longer be treated by PBC. Instead, we use reflecting boundary conditions (RBC) for the potential and charge for all sticks that are "cut" by stripe lines to simulate the performance of striped NN-TFTs.

In order to validate the theory of striping, we fabricated arrays of SWNT TFTs with various combinations of $L_C$, $W_{stripe}$, and tube density ($D_{CNT}$). Uniform SWNT thin films were first synthesized by the chemical vapor deposition method on $SiO_2$ (100 nm) Si wafers. The tube density was controlled by adjusting the dilution ratio of the catalyst solution. Source/drain electrodes were patterned by the liftoff method with standard photolithography and electron-beam evaporation. Each device was isolated through oxygen reactive ion etching (RIE) while CNTs in the channel region were protected by a patterned layer of photoresist. Either phase-shift lithography or photolithography generated photoresist stripes, with variable $W_{stripe}$, aligned to the electron transport direction of each TFT. Subsequent oxygen RIE removed CNTs in the exposed area and transformed the stripe pattern to an underlying nanonet network as shown in FIG. 21(*b*). Removing the photoresist layer by acetone soaking completed the device fabrication process. The measurements of device ON-current and ON/OFF ratio were carried out in air, using a semiconductor parameter analyzer (Agilent, 4155C). Details of the methods of fabrication and characterization are provided throughout the present description [24].

2. Results and Discussion

Figure 22:
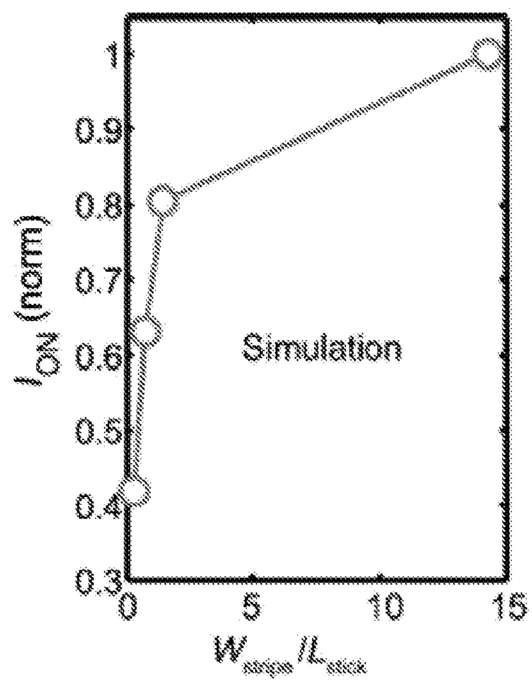
FIG. 22 Variation in (a) simulated and (b) experimental ON-current ($I_{ON}$) with effective stripe width ($W_{stripe}/L_{stick}$) for tube density $D_{CNT}=40/\mu m^2$ and effective channel length $L_C/W_{stripe}=15$. The ON-current decreases as the stripe width is reduced as more and more intersecting parallel paths are broken. The simulations match the experiments quite well. Variation in (c) experimental and (d) simulated ON/OFF ratio with effective channel length $L_C/W_{stripe}$ for various values of effective stripe width $W_{stripe}/L_{stick}$ for tube density $D_{CNT}=40/\mu m^2$.
Figure 22:
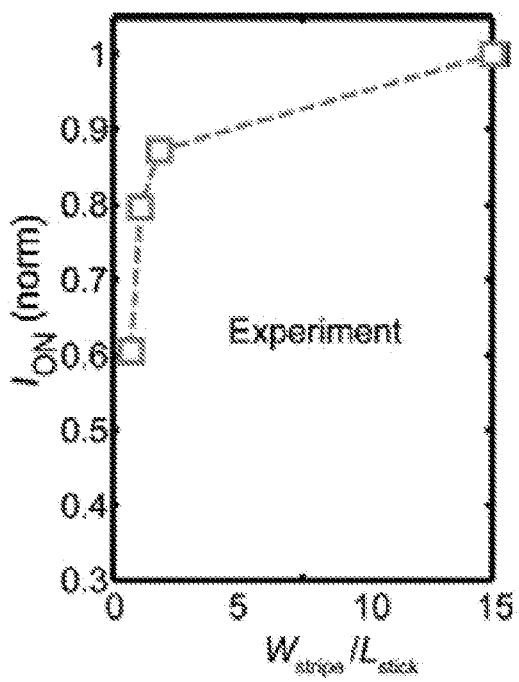
Figure 22:
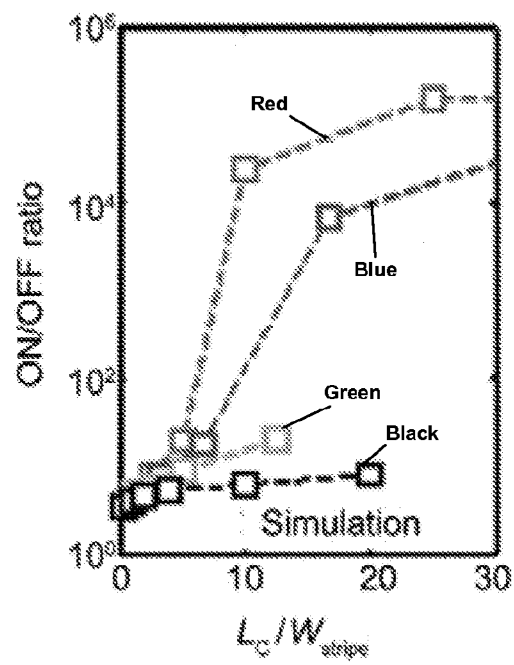
Figure 22:
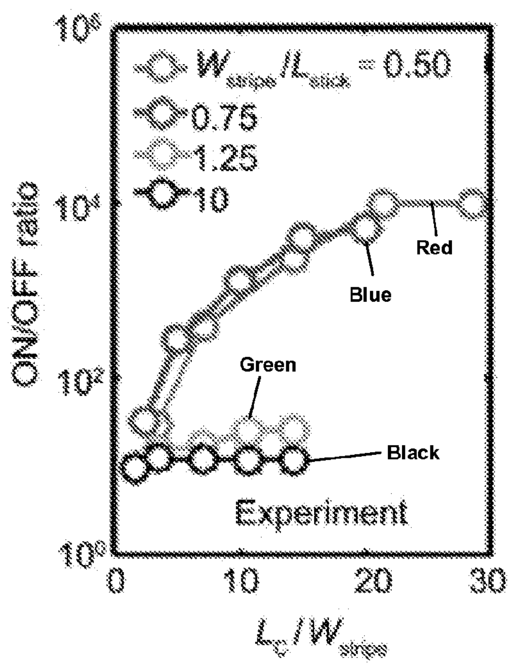

FIG. 22 shows the simulation results for ON-current ($I_{ON}$) and ON/OFF ratio of striped transistors for various widths, channel lengths, and stick lengths, plotted against the scaling variables $W_{stripe}/L_{stick}$ and $L_C/W_{stripe}$, respectively. The nanonets have several intermingled parallel paths and the stripes break some of them depending on the stripe width decreasing both ON- and OFF-currents. FIG. 22(*a*) shows that for a given channel length, the decrease in ON-current is relatively minor—approximately a factor of two as the $W_{stripe}/L_{stick}$ is reduced from 15 to 0.3. The relatively benign effect on the ON-current of striping should be compared with about an order of magnitude reduction in the ON-current due to electrical filtering methods [12, 19]. Experimental results for transistors with the same dimensions are plotted in FIG. 22(*b*) and these measurements validate the scaling predictions from the percolation theory remarkably well.

Obviously, high ON-current is of little value if the ON/OFF ratio is not improved simultaneously. FIG. 22(*c*) plots the ON/OFF ratio as a function of the scaling variable $L_C/W_{stripe}$, the channel length normalized by the width ($W_{stripe}$), which is the effective stick length after the striping. The different curves are for different $W_{stripe}/L_{stick}$. At large widths with $W_{stripe}/L_{stick}>\sim 1$, the ON/OFF ratio is small, because in a wide device (compared to the stick length), there is always a finite probability that a metallic subnetwork would be able to bridge the S/D directly. Only a negligible fraction of the tubes is affected by striping and the length of the sticks after striping $\langle L_{stick,eff}\rangle$ is hardly suppressed by this process. As such $D_P$ does not change appreciably and the ON/OFF ratio remains pegged at small values (~10), as seen in the black and green curves in FIG. 22(*c*). On the other hand, for $W_{stripe}/L_{stick}<1$, the many cross-bridging percolation paths are interrupted, and the probability of an all-metallic subnetwork threading the S/D is reduced. Thus, the striping process pushes the percolation threshold into the $D_M$-$D_{CNT}$ interval, i.e., $D_M<D_P<D_{CNT}$, with a corresponding dramatic increase in the ON/OFF ratio (FIG. 22(*c*), red and blue curves). However, if the channel length remains small (i.e., $L_C/W_{stripe}<5$) only a few sticks are needed to bridge S/D. A metallic subnetwork can still bridge the S/D with finite probability when the ON/OFF ratio is small ($<10^2$) as shown in FIG. 22(*c*). FIG. 22(*d*) shows the corresponding experimental results and they match the simulation results closely.

In this Example, we set out to explore the fundamentals of the technique so that the trade-offs and scaling issues of the methodology become well-documented. The average tube length can be adjusted via controlling the CVD (chemical vapor deposition) synthesis parameters, e.g., catalyst species and growth time duration. In addition, since $W_{stripe}$ can be reduced to tens of nanometers, which is solely defined through lithography, the requirement of $L_C/W_{stripe}>10$ can generally be satisfied without sacrificing $L_C$ through adjusting $W_{stripe}$ (even if $L_{stick}$ cannot be adjusted effectively).

To explore the predictions discussed above, a large number of devices with various $L_C$, $W_{stripe}$, and $D_{CNT}$ were fabricated and characterized. Despite all the idealization inherent in the model and its inability to mimic the details of the physical process, once plotted against the scaled variables identified by theory ($W_{stripe}/L_{stick}$), the experimental results for the ON/OFF ratio of the corresponding transistors (FIG. 22(*b*)) support the theoretical trends almost exactly, showing very similar trends in the ON/OFF ratio to those anticipated by the theory.

3. Optimization and Generalization

The wide ranging simulation and measurement data discussed above suggest that the condition for excellent ON/OFF ratio and good ON-current is possible with striping provided that $W_{stripe}/L_{stick}\sim 1$ and $L_C/W_{stripe}>10$. Specifically, for example, for a technology with 5 μm design rules, i.e., $L_C\geq 5$ μm, stripe separation should be ~0.5 μm, and the CNT length should be chosen as ~0.5 μm to ensure high yield ICs.

Figure 23:
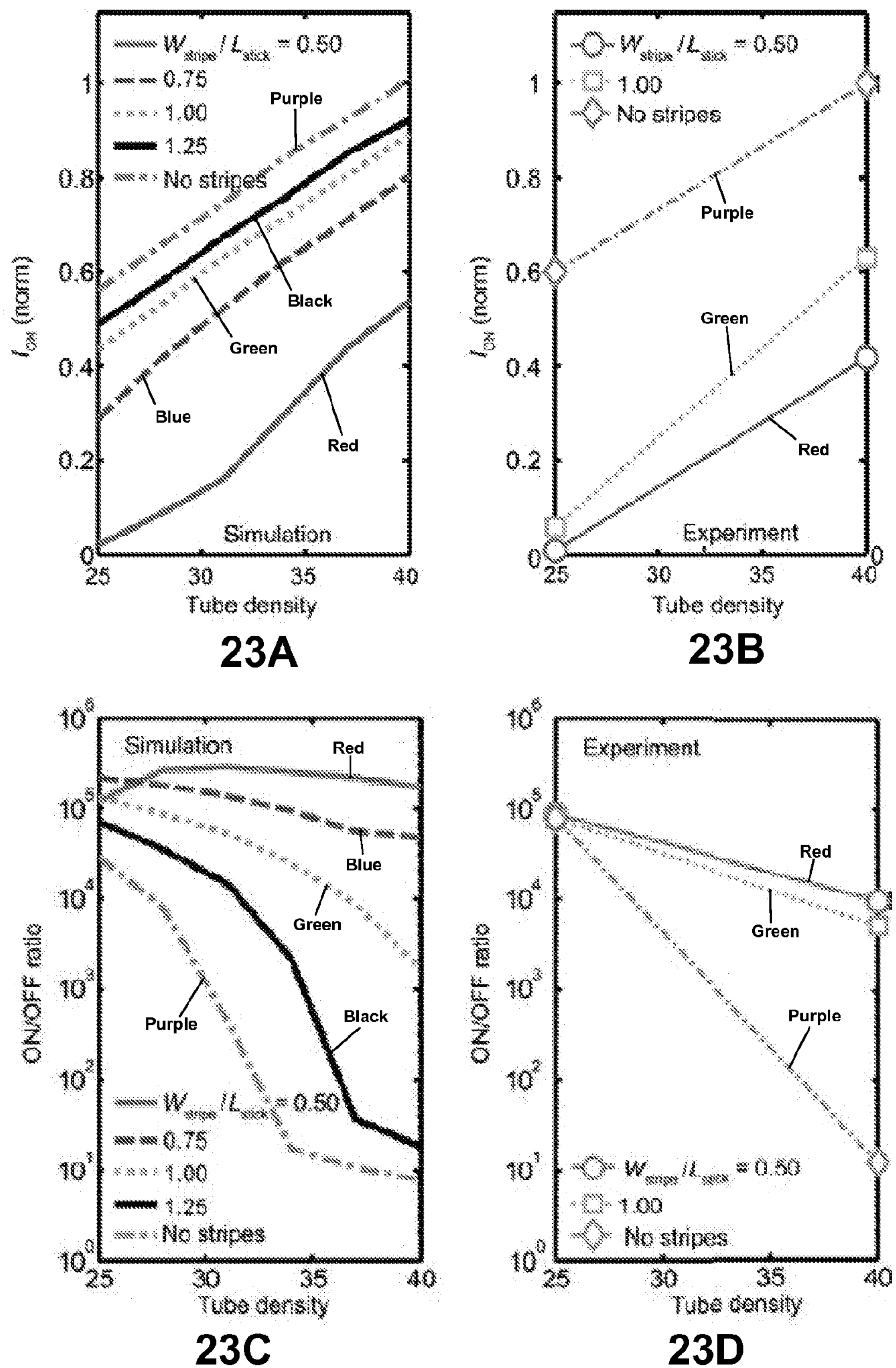
FIG. 23 Plots of (a), (c) simulated and (b), (d) experimental ON-current ($I_{ON}$) and ON/OFF ratio vs tube density $D_{CNT}$ as a function of normalized stripe widths $W_{stripe}/L_{stick}$. The normalized channel length $L_C/L_{stick}$ is held fixed at 25 for the simulations. The tube density plays an important role in determining the device performance. Note that the simulated curves for ON-current and ON/OFF ratio are statistical averages of 200 transistors. While the sample size is adequate for almost all simulations, the slight non-monotonicity of the ON/OFF ratio (b) at $W_{stripe}/L_{stick}=0.5$ and at lower densities (25-30) is most likely an artifact of finite sample size.
Figure 24:
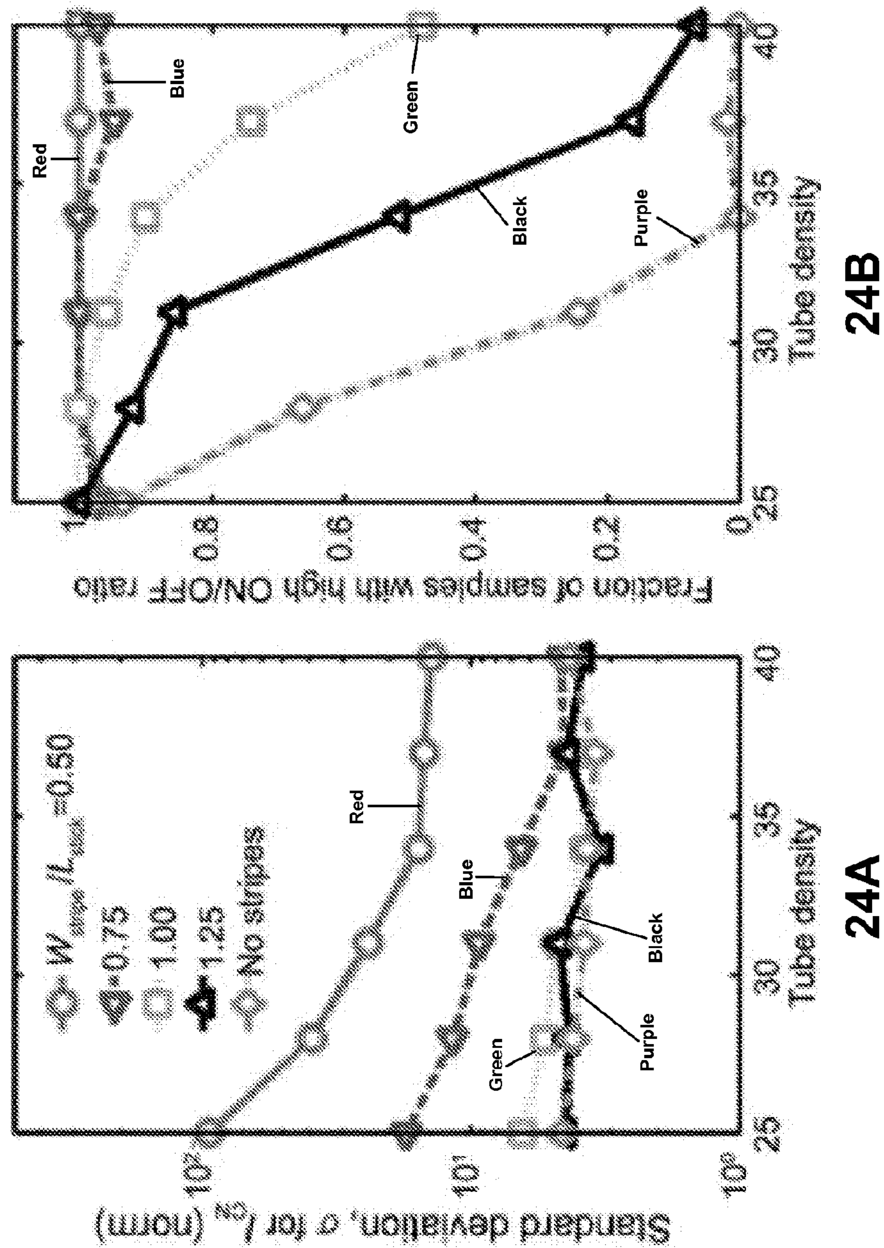
FIG. 24 (a) Plot of normalized standard deviation of ON-current ($I_{ON}$) vs tube density for various $W_{stripe}/L_{stick}$. Here, $L_C=25$ μm. The normalized standard deviation is high for lower density and smaller $W_{stripe}/L_{stick}$. (b) Fraction of samples with high ON/OFF ratio as a function of tube density for various $W_{stripe}/L_{stick}$.

To complete the discussion on optimization of the striping method, let us briefly discuss the fluctuation in the tube density $D_{CNT}$, which plays an important role in determining the device performance (FIG. 23) and device-to-device fluctuations (FIG. 24). A higher density network with lower $L_C$ is desired for higher ON-current, although an increased probability of all metallic paths decreases the ON/OFF ratio of the device. FIG. 23 shows the simulation and experimental results for ON-current and ON/OFF ratio as a function of tube density for different stripe widths. Note that the ON-current has linear dependence on density for the higher density networks shown in FIG. 23. Note that the average tube length is difficult to control for a random CNT network and we have normalized the results with respect to the average tube length [22]. FIGS. 23(*a*) and 23(*b*) show that the ON-current has a linear dependence on density. This is expected for a network with densities much higher than the percolation threshold. The increased density causes a larger number of percolating paths. These simulations can be used to optimize the device parameters such as density ($D_{CNT}$), channel length ($L_C$), and stripe width ($W_{stripe}$), given the required constraints on the device performance. The ON/OFF ratio decreases with higher tube density and is found to be appreciably high ($>10^3$) for all densities if $W_{stripe}/L_{stick}<1$ and if the channel length is at least 10 times the width of the transistor. The ON/OFF ratios of these devices depend mainly on the fraction of useful ($>10^3$) devices, e.g., a single metallic path in a total of 100 paths can significantly decrease the ON/OFF ratio of the device to ~100. In FIGS. 23(*c*) and 23(*d*) we see that the ON/OFF ratio decreases monotonically with the tube density. Higher densities increase the probability of an all metallic path, decreasing the ON/OFF ratio. Also, lower striping widths ($W_{stripe}/L_{stick}$) have a larger chance of cutting an all metallic path, hence the ON/OFF ratio is higher for lower $W_{stripe}/L_{stick}$.

Due to statistical nature of nanonet-TFTs (and by analogy to the random dopant fluctuation issue in classical complementary metal oxide semiconductor (CMOS) devices), we expect some variation in ON-current from one transistor to next. Apart from issues related to average ON-current and ON/OFF ratio discussed in relation to FIG. 23, the fluctuation in the ON-current and ON/OFF ratio must also be within acceptable limits for practical large scale IC design. FIG. 24(*a*) shows the variation in normalized standard deviation (NSD) for the ON-current (normalized with respect to the average ON-current) with tube density for various values of $W_{stripe}/L_{stick}$. The variation in ON-current is due to the variation in the number of connecting paths from S/D. Devices with lower numbers of connecting paths are affected far more by these variations than devices with higher numbers of connecting paths. In the devices with higher numbers of connecting paths, the variation reduces due to an averaging effect. The standard deviation in FIG. 24(*a*), shows two trends consistent with this argument. Firstly, the standard deviation increases for lower tube densities. Secondly, striping with smaller $W_{stripe}/L_{stick}$ leads to fewer connected paths (FIG. 23(*a*)) which causes higher standard deviations. For unstriped devices of large width, NSD is small (~0.05) which means only about 5%-10% variation in ON-current between different transistors. FIG. 24(*a*) shows that NSD values do change with striping; however, as long the design rule (i.e., $W_{stripe}/L_{stick}$~1) is followed; specifically, provided $W_{stripe}/L_{stick}$=1-1.25, NSD variation remains essentially unchanged with respect to the unstriped transistors (5%-10%) even in the unlikely scenario of 50% fluctuation in the original target density of 25 sticks/$\mu m^2$.

The importance of following the design rule of $W_{stripe}/L_{stick}$ ~1 is further illustrated in FIG. 24(*b*) which shows the fraction ($f_{ON/OFF}$) of devices with high ($>10^3$) ON/OFF ratios for various densities. It is clear that striping reduces the sensitivity of the ON/OFF ratio to fluctuations in tube density. Indeed, while for $W_{stripe}/L_{stick}>1$, ON/OFF decreases monotonically with density, when $W_{stripe}/L_{stick}<1$, $f_{ON/OFF}$ is close to 1, i.e., approximately 100% of the transistors have high ON/OFF ratios, even with 20%-50% variation in the target tube density of 25 sticks/$\mu m^2$.

The numerical simulation and experimental confirmation of the scaling relationship above provide simple, intuitive guidelines for transistor scaling. A simple renormalization argument of the above scaling relationship may aid in understanding the physical basis of asymmetric percolation that underlies the robustness and generality of the striping technique. Understanding the renormalization argument may also allow development of other techniques that achieve the same result, without following the specific prescription proposed in this Example.

Figure 25:
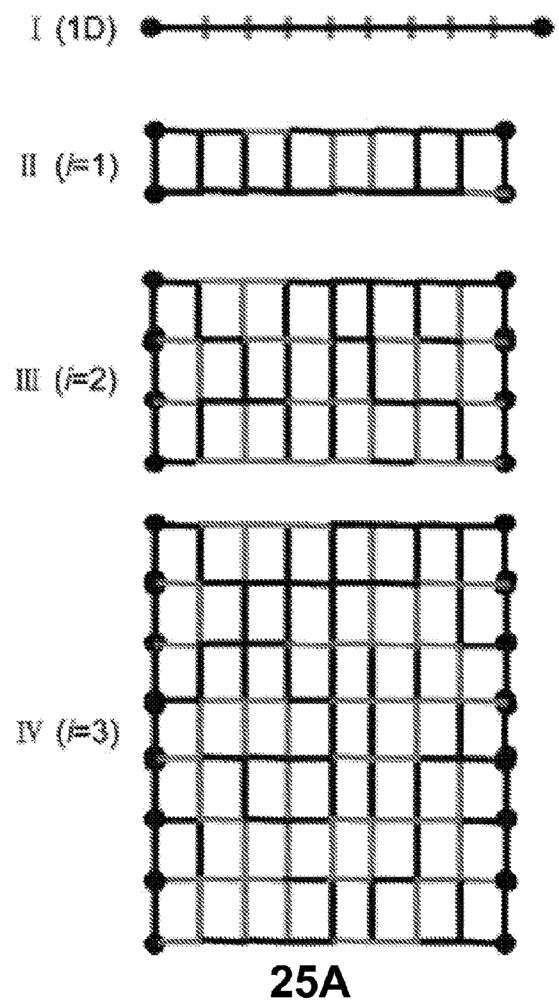
FIG. 25 (a) Schematic showing transition of channels from 1-D to 2-D with width i. Random sections of the grid are occupied (black) with a probability of 0.5 (bond percolation threshold for an infinite 2-D network). The percolation threshold in finite width samples is defined by the condition that one certain occupation probability of the grid ensures current flow from S/D.
Figure 25:
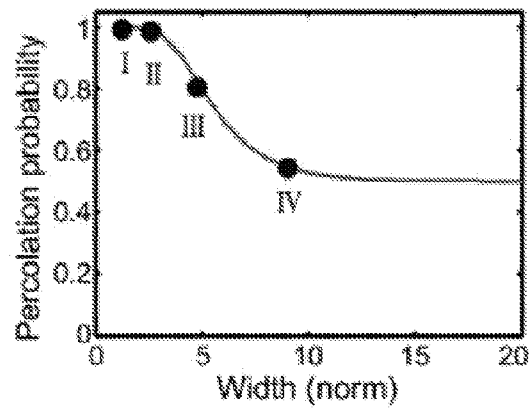
Figure 25:
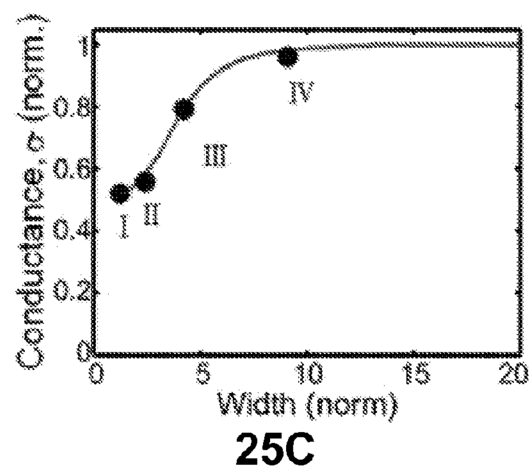

The reason striping allows an easy manipulation of the percolation threshold is because a finite stripe allows tailoring of the percolation threshold in between that of a 1-D chain of resistors ($D_P$=1) and a 2-D resistor network ($D_P$=0.5). The precise value of $D_P$ for a finite width resistor on a square lattice is obtained from the recurring renormalization condition that (see FIG. 25) [15] $D_{P,i}={}_{p,i+1}{}^{5}-5D_{p,i+1}{}^{4}+2D_{p,i+1}{}^{3}+2D_{p,i+1}{}^{2}$ where $D_{P,i}$ is the percolation threshold of the resistor of width $2^i$ and length N. Assuming $D_{P,1}\rightarrow 1$ for a quasi-1-D conductor, the solution of the recurrence relationship ($D_{P,1}\rightarrow D_{P,2}\rightarrow D_{P,3}\rightarrow D_{P,4}\ldots\rightarrow D_{P,a}$, etc.) as plotted in FIG. 25(*b*) shows a dramatic transition in percolation threshold from 1 to 0.5 as width of the resistor (i.e., stripe width) passes through a critical value. Moreover, for a lattice whose elements are filled with probability, $D_{P,i}$ the condition of conductivity, scaling requires that [15]

$$\frac{\sigma_{i+1}}{2\sigma_i}=\frac{1}{D_{P,i}}\Big[D_{p,i+1}^5+\frac{23}{3}D_{p,i+1}^4(1-D_{p,i+1})+18D_{p,i+1}^3(1-D_{p,i+1})^2+4D_{p,i+1}^2(1-D_{p,i+1})^3\Big]$$

Here $\sigma_i$ is the conductance of the network with width $2^i$ and percolation threshold $D_{P,i}$. The presence of the "2" in the denominator of the left-hand side represents the factor of two renormalizations of the network at successive levels. For very wide transistors, a factor of two scaling of transistor width scales the current by $2\mu/v$~2×1.93=3.86, as expected from the 2-D conductivity exponent [25]. However, as the width of the transistor is reduced, many of the percolation paths are broken and the 2-D conductivity exponent reduces from 1.93 to 1; in other words, current scales linearly with conductor width. This procedure explains how the factor of two reductions in the ON-current due to striping (FIGS. 22(*a*), 23(*a*), and 25(*c*)) is a consequence of the finite-size percolation threshold and is not specific to the particular network or simulation model being discussed.

4. Conclusions

In summary, we have provided a theory of a highly effective alternative method called striping to increase the ON/OFF ratio of a CNT NN-TFT without significantly reducing the per-width ON-current. Compared to traditional techniques of increasing ON/OFF ratio like electrical or chemical filtering, the in situ method appears scalable and versatile, and appropriate for large scale integrated circuits. Both theory and experiments suggest that if the stripe width is so defined that $W_{stripe}/L_{stick}<1$ and $L_C/W_{stripe}>10$, high ON/OFF ratio and high ON-current are easily ensured. Note that reduction in $W_{stripe}/L_{stick}$ significantly below unity may not be acceptable from the point of view of parameter fluctuation (FIG. 24) and may otherwise have to be managed by various fluctuation-resilient circuit techniques. Apart from the numerical simulation and experimental results, our renormalization argument suggests that this technique is really a general approach, fundamentally rooted in the asymmetric percolation threshold of heterogeneous networks.

REFERENCES

[1] Cao, Q.; Kim, H. S.; Pimparkar, N.; Kulkarni, J. P.; Wang, C.; Shim, M.; Roy, K.; Alam, M. A.; Rogers, J. A. Medium-scale carbon nanotube thin-film integrated circuits on flexible plastic substrates. *Nature* 2008, 454, 495-500.

[2] Duan, X. F.; Niu, C. M.; Sahi, V.; Chen, J.; Parce, J. W.; Empedocles, S.; Goldman, J. L. High-performance thin-film transistors using semiconductor nanowires and nanoribbons. *Nature* 2003, 425, 274-278.

[3] Novak, J. P.; Lay, M. D.; Perkins, F. K.; Snow, E. S. Macroelectronic applications of carbon nanotube networks. *Solid State Electron.* 2004, 48, 1753-1756.

[4] Novak, J. P.; Snow, E. S.; Houser, E. J.; Park, D.; Stepnowski, J. L.; McGill, R. A. Nerve agent detection using networks of single-walled carbon nanotubes. *Appl. Phys. Lett.* 2003, 83, 4026-4028.

[5] Snow, E. S.; Novak, J. P.; Campbell, P. M.; Park, D. Random networks of carbon nanotubes as an electronic material. *Appl. Phys. Lett.* 2003, 82, 2145-2147.

[6] Szleifer, I.; Yerushalmi-Rozen, R. Polymers and carbon nanotubes—Dimensionality, interactions and nanotechnology. *Polymer* 2005, 46, 7803-7808.

[7] Zhou, Y. X.; Gaur, A.; Hur, S. H.; Kocabas, C.; Meitl, M. A.; Shim, M.; Rogers, J. A. p-channel, n-channel thin film transistors and p-n diodes based on single wall carbon nanotube networks. *Nano Lett.* 2004, 4, 2031-2035.

[8] Kumar, S.; Murthy, J. Y.; Alam, M. A. Percolating conduction in finite nanotube networks. *Phys. Rev. Lett.* 2005, 95/6, 066802.

[9] Pimparkar, N.; Guo, J.; Alam, M. A. Performance assessment of sub-percolating nanobundle network transistors by an analytical model. *IEDM Tech. Digest* 2005, 21, 541-544.

[10] Kang, S. J.; Kocabas, C.; Ozel, T.; Shim, M.; Pimparkar, N.; Alam, M. A.; Rogers, J. A. High-performance electronics using dense, perfectly aligned arrays of single-walled carbon nanotubes. *Nat. Nanotechnol.* 2007, 2, 230-236.

[11] Cao, Q.; Hur, S. H.; Zhu, Z. T.; Sun, Y.; Wang, C. J.; Meitl, M. A.; Shim, M.; Rogers, J. A. Highly bendable, transparent thin-film transistors that use carbon-nanotube-based conductors and semiconductors with elastomeric dielectrics. *Adv. Mater.* 2006, 18, 304.

[12] Collins, P. C.; Arnold, M. S.; Avouris, P. Engineering carbon nanotubes and nanotube circuits using electrical breakdown. *Science* 2001, 292, 706-709.

[13] Kumar, S.; Blanchet, G. B.; Hybertsen, M. S.; Murthy, J. Y.; Alam, M. A. Performance of carbon nanotube-dispersed thin-film transistors. *Appl. Phys. Lett.* 2006, 89, 143501.

[14] Datta S. *Quantum Transport: Atom to Transistor,* 2nd ed.; Cambridge University Press: Cambridge, 2005.

[15] Stauffer, D.; Aharony, A. *Introduction to Percolation Theory*; Taylor and Francis: London, 1992.

[16] Haddon, R. C.; Sippel, J.; Rinzler, A. G.; Papadimitrakopoulos, F. Purification and separation of carbon nanotubes. *MRS Bull.* 2004, 29, 252-259.

[17] Wang, C.; Cao, Q.; Ozel, T.; Gaur, A.; Rogers, J. A.; Shim, M. Electronically selective chemical functionalization of carbon nanotubes: Correlation between Raman spectral and electrical responses. *J. Am. Chem. Soc.* 2005, 127, 11460-11468.

[18] Arnold, M. S.; Stupp, S. I.; Hersam, M. Enrichment of single-walled carbon nanotubes by diameter in density gradients. *Nano Lett.* 2005, 5, 713-718.

[19] Seidel, R.; Graham, A. P.; Unger, E.; Duesberg, G. S.; Liebau, M.; Steinhoegl, W.;

Kreupl, F.; Hoenlein, W. High-current nanotube transistors. *Nano Lett.* 2004, 4, 831-834.

[20] Pimparkar, N.; Guo, J.; Alam, M. A. Performance assessment of subpercolating nanobundle network thin-film transistors by an analytical model. *IEEE T. Electron Dev.* 2007, 54, 637-644.

[21] Li, Y. M.; Mann, D.; Rolandi, M.; Kim, W.; Ural, A.; Hung, S.; Javey, A.; Cao, J.; Wang, D. W.; Yenilmez, E.; Wang, Q.; Gibbons, J. F.; Nishi, Y.; Dai, H. J. Preferential growth of semiconducting single-walled carbon nanotubes by a plasma enhanced CVD method. *Nano Lett.* 2004, 4, 317-321.

[22] Pimparkar, N.; Kumar, S.; Cao, Q.; Rogers, J. A.; Murthy, J. Y.; Alam, M. A. Current-voltage characteristics of long-channel nanobundle thin-film transistors: A "bottom-up" perspective. *IEEE Electron Dev. L.* 2007, 28, 157-160.

[23] Pimparkar N.; Kocabas C.; Kang S. J.; Rogers J. A.; Alam M. A. *Electron Dev. Lett.* 2007, 28, 593-595.

[24] Kocabas, C.; Pimparkar, N.; Yesilyurt, O.; Alam, M. A.; Rogers, J. A. Experimental and theoretical studies of transport through large scale, partially aligned arrays of single-walled carbon nanotubes in thin film type transistors. *Nano Lett.* 2007, 7, 1195-1202.

[25] Seager, C. H.; Pike, G. E. Percolation and conductivity: A computer study. *Phys. Rev.* B 1974, 10, 1421.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The following references relate generally to methods of synthesizing and purifying carbon nanotubes: (1) A. M. Cassell, J. A. Raymakers, J. Kong, H. J. Dai, J. Phys. Chem. B 103(31), (1999), pp. 6484-6492; (2) M. Su, B. Zheng, J. Liu, Chem. Phys. Lett. 322(5), (2000), pp. 321-326; (3) B. Kitiyanan, W. E. Alvarez, J. H. Harwell, D. E. Resasco, Chem. Phys. Lett. 317(3-5), (2000), pp. 497-503; (4) J. H. Hafner, M. J. Bronikowski, B. R. Azamian, P. Nicolaev, A. G. Rinzler, D. T. Colbert, K. A. Smith, R. E. Smalley, Chem. Phys. Lett. 296(1-2), (1998) pp. 195-202 (5) H. M. Cheng, F. Li, G. Su, H. P. Pan, L. L. He, X. Sun, M. S. Dresselhaus, Appl. Phys. Lett. 72(25), (1998), pp. 3282-3284; (6) B. Zheng, Y. Li, J. Liu, Applied Physics A 74, 345-348 (2002); (7) C. Journet, W. K. Maser, P. Bernier, A. Loiseau, M. Lamy de la Chapelle, S. Lefrant, R. Lee, J. E. Fischer, Nature 388, 756-758 (1997); (8) A. Thess, R. Lee, P. Nikolaev, H. Dai, P. Petit, J. Robert, C. Xu, Y. H. Lee, S. G. Kim, A. G. Rinzler, D. T. Colbert, G. E. Scuseria, D. Tomanek, J. E. Fischer, R. E. Smalley, Science 273, (1996) 483-487; (9) M. Holzinger, A. Hirsch, P. Bernier, G. S. Duesberg, M. Burghard, Applied Physics A 70, (2000) 599-602; (10) G. S. Duesberg, J. Muster, V. Krstic, M. Burghard, S. Roth, Appl. Phys. A 67, (1998), 117-119; (11) J. Liu, A. G. Rinzler, H. Dai, J. H. Hafner, R. K. Bradley, P. J. Boul, A. Lu, T. Iverson, K. Shelimov, C. B. Huffman, F. Rodriuez-Macias, Y. S. Shon, T. R. Lee, D. T. Colbert, R. E. Smalley, Science 280, (1998) 1253-1256; (12) A. G. Rinzler, J. Liu, H. Dai, P. Nikolaev, C. B. Huffman, F. J. Rodriguez-Macias, P. J. Boul, A. H. Lu, D. Heymann, D. T. Colbert, R. S. Lee, J. E. Fischer, A. M. Rao, P. C. Eklund, R. E. Smalley, Appl. Phys. A 67, (1998) 29-37; (13) Y. Feng, G. Zhou, G. Wang, M. Qu, Z. Yu, Chem, Phys, Lett, 375, (2003) 645-648; (14) T. Takenobu, M. Shiraishi, A. Yamada, M. Ata, H. Kataura, Y. Iwasa, Synthetic Metals 135-136, (2003) 787-788; (15)1. W. Chiang, B. E. Brinson, A. Y. Huang, P. A. Willis, M. J. Bronikowski, J. L. Margrave, R. E. Smalley, R. H. Hauge, J. Phys. Chem. B 105, (2001) 8297-8301.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Many of the molecules disclosed herein contain one or more ionizable groups [groups from which a proton can be removed (e.g., —COON) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Every formulation or combination of components described or exemplified herein can be used to practice the invention, unless otherwise stated.

Whenever a range is given in the specification, for example, a range of integers, a temperature range, a time range, a composition range, or concentration range, all intermediate ranges and subranges, as well as all individual values included in the ranges given are intended to be included in the disclosure. As used herein, ranges specifically include the values provided as endpoint values of the range. As used herein, ranges specifically include all the integer values of the range. For example, a range of 1 to 100 specifically includes the end point values of 1 and 100. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. An electronic device comprising:

a first electrode;

a second electrode; and a patterned layer comprising randomly oriented or partially aligned carbon nanotubes provided in one or more interconnected carbon nanotube networks positioned between and in electrical contact with said first electrode and said second electrode, wherein said partially aligned carbon nanotubes are aligned relative to each other with deviations from absolute parallelism that are greater than 20 degrees; said one or more interconnected carbon nanotube networks characterized by a plurality of nanotube intersections; said patterned layer having a thickness less than or equal to 10 nanometers and having one or more void regions without carbon nanotubes; wherein said void regions comprise one or more cavities in said patterned layer extending entirely from said first electrode to said second electrode, thereby defining a plurality of strips of said interconnected carbon nanotube networks, wherein said one or more void regions provided between said first and second electrodes reduces by at least 50% the number of purely metallic conductive pathways from said first electrode and second electrode in said one or more interconnected carbon nanotube networks relative to a corresponding layer of randomly oriented or partially aligned carbon nanotubes provided in another one or more interconnected carbon nanotube networks and not having said void regions.

2. The electronic device of claim 1 wherein said one or more cavities extend through the entire thickness of said patterned layer.

3. The electronic device of claim 1 wherein said void regions are provided in said patterned layer in a periodic spatial distribution.

4. The electronic device of claim 1 wherein said void regions are provided in said patterned layer in an aperiodic spatial distribution.

5. The electronic device of claim 1 wherein said void regions comprise a pattern etched into said carbon nanotube networks of said patterned layer.

6. The electronic device of claim 1 wherein said void regions are filled with one or more insulating or semiconducting materials capable of disrupting metallic conductive pathways in said one or more interconnected carbon nanotube networks from said first and second electrodes.

7. The electronic device of claim 1 wherein said void regions comprise a plurality of said cavities in said patterned layer.

8. The electronic device of claim 7 wherein said cavities in said patterned layer have lateral dimensions selected from the range of 50 nanometers to 1000 microns.

9. The electronic device of claim 7 wherein said cavities in said patterned layer have a lateral cross sectional shape selected from the group consisting of rectangle, square, circle, and oval.

10. The electronic device of claim 7 wherein cavities in said patterned layer separate said strips such they do not physically contact each other.

11. The electronic device of claim 7 wherein each of said strips has an average width and extends an average length at least 10 times greater than said average width.

12. The electronic device of claim 11 wherein each of said strips extends an average length at least 100 times greater than said average width.

13. The electronic device of claim 11 wherein each of said strips extends an average length at least 1000 times greater than said average width.

14. The electronic device of claim 7 wherein said cavities in said patterned layer define 2 to 1000 of said strips in said patterned layer.

15. The electronic device of claim 14 wherein at least a portion of said strips extend between first and second electrodes and are provided in a parallel orientation.

16. The electronic device of claim 14 wherein at least a portion of said strips of interconnected carbon nanotube networks extend between first and second electrodes and are provided in a serpentine orientation.

17. The electronic device of claim 14 wherein adjacent strips are separated from each other by one or more of said cavities having lateral dimensions large enough to prevent electron transport directly between adjacent strips.

18. The electronic device of claim 7 wherein adjacent strips are separated from each other by an average distance selected over the range of 50 nanometers to 1000 microns.

19. The electronic device of claim 7 wherein at least a portion of said strips has an aspect ratio selected over the range of 10 to 1000.

20. The electronic device of claim 19 wherein at least a portion of said strips has an aspect ratio selected over the range of 50 to 500.

21. The electronic device of claim 7 wherein each of said strips has an average width selected over the range of 50 nanometers to 1000 microns and a length selected over the range of 500 nanometers to 10000 microns.

22. The electronic device of claim 21 wherein each of said strips has an average width of 5 microns and a length of 100 microns.

23. The electronic device of claim 7 wherein each of said strips have a lateral cross sectional shape selected from the group consisting of rectangular, circular, oval, and trapezoidal.

24. The electronic device of claim 7 wherein said strips of said patterned layer provide a semiconductor channel between said first and second electrodes, wherein said semiconductor channel has a length selected over the range of 50 nanometers and 1000 microns.

25. The electronic device of claim 1 wherein said patterned layer is a monolayer or sub-monolayer film of said carbon nanotubes.

26. The electronic device of claim 1 wherein said carbon nanotubes of said patterned layer have an average length selected over the range of 20 nanometers to 100 microns.

27. The electronic device of claim 1 wherein said carbon nanotubes of said patterned layer have a surface concentration selected over the range of 0.2 carbon nanotubes micron$^{-2}$ to 100 carbon nanotubes micron$^{-2}$.

28. The electronic device of claim 1 wherein said carbon nanotubes of said patterned layer comprise single walled carbon nanotubes.

29. The electronic device of claim 1 wherein said carbon nanotubes of said patterned layer comprise a mixture of semiconducting nanotubes and metallic nanotubes, wherein there are at least 1.5 times more semiconducting nanotubes than metallic nanotubes.

30. The electronic device of claim 29 wherein there are 1.5 to 4 times more semiconducting nanotubes than metallic nanotubes.

31. The electronic device of claim 1 further comprising a substrate provided to support said first electrode, second electrode and said patterned layer, said substrate selected from the groups consisting of a flexible substrate, a rigid substrate, a semiconductor substrate, polymer substrate, a ceramic substrate and a contoured substrate.

32. The electronic device of claim 1 comprising a transistor, wherein said first electrode is a source electrode, said second electrode is a drain electrode and said patterned layer is a semiconductor channel of said transistor.

33. The electronic device of claim 1 wherein said one or more void regions reduces by at least 70% the number of purely metallic conductive pathways in said one or more interconnected carbon nanotube networks relative to said corresponding layer of randomly oriented or partially aligned carbon nanotubes provided in said one or more interconnected carbon nanotube networks and not having said void regions.

34. The electronic device of claim 1 wherein said void regions have a depth in said patterned layer selected over the range of 2 nanometers to 10 nanometers.

35. The electronic device of claim 1 wherein said patterned layer comprises randomly oriented carbon nanotubes.

36. The electronic device of claim 35 wherein said carbon nanotubes of said patterned layer comprise single walled carbon nanotubes.

37. The electronic device of claim 35 wherein said electronic device has an on/off ratio greater than or equal to 1000.

38. The electronic device of claim 35 wherein said electronic device has a field effect mobility greater than or equal to 0.1 $cm^2 V^{-1} s^{-1}$.

39. A method for making an electronic device comprising the steps of:

providing a first electrode;

providing a second electrode; and providing a patterned layer of comprising randomly oriented or partially aligned carbon nanotubes provided in one or more interconnected carbon nanotube networks positioned between and in electrical contact with said first electrode and said second electrode, wherein said partially aligned carbon nanotubes are aligned relative to each other with deviations from absolute parallelism that are greater than 20 degrees; said one or more interconnected carbon nanotube networks characterized by a plurality of nanotube intersections; said patterned layer having a thickness less than or equal to 10 nanometers and having one or more void regions in said patterned layer without carbon nanotubes; wherein said void regions comprise one or more cavities in said patterned layer extending entirely from said first electrode to said second electrode, thereby defining a plurality of strips of said interconnected carbon nanotube networks, wherein said one or more void regions provided between said first and second electrodes reduces by at least 50% the number of purely metallic conductive pathways from said first and second electrodes in said one or more interconnected carbon nanotube networks relative to a corresponding layer of randomly oriented or partially aligned carbon nanotubes provided in another one or more interconnected carbon nanotube networks and not having said void regions.

40. The method of claim 39 wherein cavities in said patterned layer separate said strips such they do not physically contact each other.

41. The method of claim 39 wherein each of said strips has an average width and extends an average length at least 10 times greater than said average width.

42. The method of claim 39 wherein said step of providing a patterned layer of randomly oriented or partially aligned carbon nanotubes provided in one or more interconnected carbon nanotube networks positioned between and in electrical contact with said first electrode and said second electrode comprises the steps of:

providing a precursor layer of said randomly oriented or partially aligned carbon nanotubes in electrical contact with said first and second electrodes;

patterning said precursor layer so as to generate said patterned layer.

43. The method of claim 42 wherein said step of providing said precursor layer in electrical contact with said first and second electrodes is selected from the group consisting of:

growing said carbon nanotubes on a device substrate, thereby generating said precursor layer;

dispersing said carbon nanotubes in a solvent, thereby generating a carbon nanotube solution comprising a suspension of said carbon nanotubes, and depositing said carbon nanotube solution on to a device substrate, thereby generating said precursor layer; and contact printing said carbon nanotubes on to a device substrate, thereby generating said precursor layer.

44. The method of claim 42 wherein said step of patterning said precursor layer is carried out using one or more photolithography techniques.

45. The method of claim 42 wherein said step of patterning said precursor layer comprises the steps:

providing a layer of resist on said precursor layer;

patterning said resist layer by selectively removing regions of said resist layer, thereby generating exposed regions of said precursor layer; and removing carbon nanotubes from said exposed regions of said precursor layer, thereby generating said patterned layer comprising said one or more strips extending between said first and second electrodes.

46. The method claim 45 wherein said step of patterning said resist layer is carried out via photolithography, soft lithography, phase shift lithography, electron beam writing lithography or deep ultraviolet lithography.

47. The method claim 45 wherein said step of removing carbon nanotubes from said exposed regions of said precursor layer comprises etching said exposed regions of said precursor layer.

48. The method of claim 39 wherein said step of providing a patterned layer of randomly oriented or partially aligned carbon nanotubes in electrical contact with said first electrode and said second electrode comprises ink jet printing said carbon nanotubes, thermal transfer printing said carbon nanotubes, contact printing said carbon nanotubes, dry transfer printing or screen printing said carbon nanotubes.

49. A transistor comprising:

a source electrode;

a drain electrode;

a gate electrode;

a patterned layer comprising randomly oriented or partially aligned carbon nanotubes provided in one or more interconnected carbon nanotube networks positioned between and in electrical contact with said source electrode and said drain electrode, wherein said partially aligned carbon nanotubes are aligned relative to each other with deviations from absolute parallelism that are greater than 20 degrees; said one or more interconnected carbon nanotube networks characterized by a plurality of nanotube intersections; said patterned layer having a thickness less than or equal to 10 nanometers and having one or more void regions in said patterned layer without carbon nanotubes; wherein said void regions comprise one or more cavities in said patterned layer extending entirely from said source electrode to said drain electrode, thereby defining a plurality of strips of said interconnected carbon nanotube networks, wherein said one or more void regions provided between said source and drain electrodes reduces by at least 50% the number of purely metallic conductive pathways between said source electrode and said drain electrode in said one or more interconnected carbon nanotube networks relative to a corresponding layer of randomly oriented or partially aligned carbon nanotubes provided in another one or more interconnected carbon nanotube networks and not having said void regions; and a dielectric layer positioned between said patterned layer and said gate electrode.

50. The electronic device of claim 49 comprising a thin film transistor.

51. The transistor of claim 49 wherein said transistor has an on/off ratio greater than or equal to 100.

52. The thin film transistor of claim 51 wherein said transistor has an on/off ratio greater than or equal to 1000.

53. The transistor of claim 49 wherein said transistor has a field effect mobility greater than or equal to 0.1 $cm^2 V^{-1} s^{-1}$.

54. The thin film transistor of claim 53 wherein said transistor has a field effect mobility equal to or greater than 10 cm2 V-1 s-1.

55. A method for reducing the number of purely metallic conductive pathways in one or more interconnected carbon nanotube networks provided between a first electrode and second electrode, said method comprising the steps of:

providing a patterned layer comprising randomly oriented or partially aligned carbon nanotubes provided in one or more interconnected carbon nanotube networks positioned between and in electrical contact with said first electrode and said second electrode, wherein said partially aligned carbon nanotubes are aligned relative to each other with deviations from absolute parallelism that are greater than 20 degrees; said one or more interconnected carbon nanotube networks characterized by a plurality of nanotube intersections; said patterned layer having a thickness less than or equal to 10 nanometers and having one or more void regions in said patterned layer without carbon nanotubes; wherein said void regions comprise one or more cavities in said patterned layer extending entirely from said first electrode to said second electrode, thereby defining a plurality of strips of said interconnected carbon nanotube networks, wherein said one or more void regions provided between said first and second electrodes reduces by at least 50% the number of purely metallic conductive pathways between said first electrode and said second electrode in said one or more interconnected carbon nanotube networks relative to a corresponding layer of randomly oriented or partially aligned carbon nanotubes provided in another one or more interconnected carbon nanotube networks and not having said void regions.

* * * * *